(12) United States Patent
Lee et al.

(10) Patent No.: US 10,749,089 B2
(45) Date of Patent: Aug. 18, 2020

(54) LIGHT EMITTING DEVICE PACKAGE INCLUDING A RECESS PROVIDED UNDER A LIGHT EMITTING DEVICE AND HAVING A CLOSED LOOP SHAPE

(71) Applicant: LG INNOTEK CO., LTD., Seoul (KR)

(72) Inventors: Tae Sung Lee, Seoul (KR); Won Jung Kim, Seoul (KR); June O Song, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1 day.

(21) Appl. No.: 16/052,247

(22) Filed: Aug. 1, 2018

(65) Prior Publication Data
US 2019/0044039 A1 Feb. 7, 2019

(30) Foreign Application Priority Data

Aug. 2, 2017 (KR) .................. 10-2017-0097970
Aug. 24, 2017 (KR) .................. 10-2017-0107566

(51) Int. Cl.
| | |
|---|---|
| *H01L 33/62* | (2010.01) |
| *H01L 33/50* | (2010.01) |
| *H01L 33/48* | (2010.01) |
| *H01L 33/64* | (2010.01) |
| *H01L 33/60* | (2010.01) |
| *H01L 33/32* | (2010.01) |
| *H01L 33/36* | (2010.01) |

(52) U.S. Cl.
CPC .............. *H01L 33/62* (2013.01); *H01L 33/32* (2013.01); *H01L 33/486* (2013.01); *H01L 33/50* (2013.01); *H01L 33/60* (2013.01); *H01L 33/64* (2013.01); *H01L 33/36* (2013.01)

(58) Field of Classification Search
CPC ....... H01L 33/62; H01L 33/32; H01L 33/486; H01L 33/50; H01L 33/60; H01L 33/64; H01L 33/36
USPC ............................................. 257/99; 438/22
See application file for complete search history.

(56) References Cited

U.S. PATENT DOCUMENTS

| | | |
|---|---|---|
| 2005/0253159 A1 | 11/2005 | Creswick et al. |
| 2007/0161211 A1* | 7/2007 | Sunohara .............. B81B 7/0067 438/455 |
| 2007/0267650 A1 | 11/2007 | Hsieh |
| 2011/0140143 A1 | 6/2011 | Kim et al. |
| 2012/0025242 A1 | 2/2012 | Zeng et al. |

(Continued)

FOREIGN PATENT DOCUMENTS

KR 10-2014-0092038 A 7/2014

*Primary Examiner* — Didarul A Mazumder
(74) *Attorney, Agent, or Firm* — Birch, Stewart, Kolasch & Birch, LLP

(57) ABSTRACT

A light emitting device package according to an embodiment includes: a package body; a light emitting device disposed on the package body; and an adhesive disposed between the package body and the light emitting device. The package body includes first and second openings passing through the package body on an upper surface of the package body and a recess provided to concave in a direction of a lower surface of the package body from the upper surface of the package body. The light emitting device includes a first bonding part disposed on the first opening and a second bonding part disposed on the second opening. The adhesive is provided at the recess.

14 Claims, 41 Drawing Sheets

(56) References Cited

U.S. PATENT DOCUMENTS

| | | |
|---|---|---|
| 2014/0332839 A1 | 11/2014 | Choi et al. |
| 2015/0221783 A1* | 8/2015 | Tsukagoshi ......... H01L 23/3157 257/432 |
| 2016/0204314 A1* | 7/2016 | Hwang .................. H01L 33/46 257/98 |
| 2016/0240758 A1 | 8/2016 | Huang et al. |

* cited by examiner

LIGHT EMITTING DEVICE PACKAGE INCLUDING A RECESS PROVIDED UNDER A LIGHT EMITTING DEVICE AND HAVING A CLOSED LOOP SHAPE

CROSS-REFERENCE TO RELATED APPLICATIONS

This application claims priority under 35 U.S.C. § 119 to Korean Patent Application No. 10-2017-0097970 filed in Korea on Aug. 2, 2017 and Korean Patent Application No. 10-2017-0107566 filed in Korea on Aug. 24, 2017 which are hereby incorporated in their entirety by reference as if fully set forth herein.

TECHNICAL FIELD

The embodiment relates to a semiconductor device package, a method of manufacturing the semiconductor device package, and a light source apparatus.

BACKGROUND

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding.

In addition, as for a semiconductor device package, studies on a method of improving the light extraction efficiency of a semiconductor device and improving the light intensity in a package stage has been proceeding. In addition, as for the semiconductor device package, studies on a method of improving bonding strength between a package electrode and a semiconductor device has been proceeding.

In addition, as for the semiconductor device package, studies on a method of reducing the manufacturing cost and improving the manufacturing yield by improving the process efficiency and changing the structure has been proceeding.

SUMMARY

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

A light emitting device package according to an embodiment comprises: a package body; a light emitting device disposed on the package body; and an adhesive disposed between the package body and the light emitting device, wherein the package body comprises first and second openings passing through the package body on an upper surface of the package body and a recess provided to concave in a direction of a lower surface of the package body from the upper surface of the package body, wherein the light emitting device comprises a first bonding part disposed on the first opening and a second bonding part disposed on the second opening, and wherein the adhesive is provided at the recess.

According to the embodiment, the recess may be provided at a periphery of the first and second openings in a closed loop shape.

According to the embodiment, a size of the light emitting device may be provided to be greater than an internal area of the closed loop provided by the recess when viewed from an upper direction of the light emitting device.

According to the embodiment, the closed loop provided by the recess may be disposed in an outline connecting four side surfaces of the light emitting device when viewed from the upper direction of the light emitting device.

According to the embodiment, an outline connecting four side surfaces of the light emitting device may be provided to be overlapped on the recess when viewed from the upper direction of the light emitting device.

According to the embodiment, the package body may comprise a first frame, a second frame, and a body disposed between the first frame and the second frame, wherein the first opening may be provided at the first frame, wherein the second opening may be provided at the second frame, and wherein the recess may be provided to be in connection with an upper surface of the first frame, an upper surface of the body, and an upper surface of the second frame.

The light emitting device package according to the embodiment may further comprise an upper recess provided to concave in a direction of the lower surface of the package body from the upper surface of the package body, wherein the upper recess may be provided between the first opening and the second opening.

According to the embodiment, the adhesive may be disposed at a periphery of the first bonding part and the second bonding part.

The light emitting device package according to the embodiment may comprise a first conductive layer disposed at the first opening and electrically connected to the first bonding part, and a second conductive layer disposed at the second opening and electrically connected to the second bonding part.

The light emitting device package according to the embodiment may comprise a first conductor disposed between the first bonding part and the first conductive layer, and a second conductor disposed between the second bonding part and the second conductive layer.

According to the embodiment, the adhesive may be provided to be in direct contact with the upper surface of the package body and a lower surface of the light emitting device, and may surround and seal a periphery of the first and second bonding parts.

According to the embodiment, the first and second bonding parts may comprise at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, and Ni/IrOx/Au/ITO, or an alloy thereof.

According to the embodiment, the first and second conductive layers may comprise at least one material selected from the group consisting of Ag, Au, Pt, Sn, Cu, and SAC (Sn—Ag—Cu), or an alloy thereof.

According to the embodiment, the first conductor may be disposed in the first opening, and the second conductor may be disposed in the second opening.

According to the embodiment, the first conductor may be disposed to be overlapped with the first bonding part in a vertical direction, and the second conductor may be disposed to be overlapped with the second bonding part in the vertical direction.

A light emitting device package according to an embodiment comprises: a package body comprising a first frame comprising a first opening, a second frame comprising a second opening, and a body disposed between the first frame and the second frame; a light emitting device disposed on the package body and comprising a first bonding part and a second bonding part; and an adhesive disposed between an upper surface of the package body and a lower surface of the light emitting device, wherein the package body comprises a recess provided to concave in a direction of a lower surface of the package body from the upper surface of the package body, and wherein the recess is disposed at a periphery of the first and second openings in a closed loop shape.

According to the embodiment, the recess may be provided to be in connection with an upper surface of the first frame, an upper surface of the body, and an upper surface of the second frame.

The light emitting device package according to the embodiment may comprise a first conductive layer disposed at the first opening and electrically connected to the first bonding part, and a second conductive layer disposed at the second opening and electrically connected to the second bonding part.

The light emitting device package according to the embodiment may comprise a first conductor disposed in the first opening and disposed between the first bonding part and the first conductive layer, and a second conductor disposed in the second opening and disposed between the second bonding part and the second conductive layer.

According to the embodiment, the first conductive layer may be disposed in direct contact with a lower surface of the first bonding part and a side surface of the first conductor, and the second conductive layer may be disposed in direct contact with a lower surface of the second bonding part and a side surface of the second conductor.

A light emitting device package according to an embodiment comprises: a body; first and second frames spaced apart from each other at the body; a light emitting device comprising a light emitting structure, a first bonding part disposed under the light emitting structure; and a second bonding part disposed to be spaced apart from the first bonding part under the light emitting structure; a molding member surrounding the light emitting device; and a heat dissipation member disposed between the first and second frames, wherein a lower surface of the body and lower surfaces of the first and second frames form the same plane, the first bonding part comprises a first side surface close to the second bonding part and a second side surface facing the first side surface, the second bonding part comprises a third side surface close to the first bonding part and a fourth side surface facing the third side surface, wherein the first side surface and the third side surface are in contact with the heat dissipation member, and the second side surface and the fourth side surface are in contact with the molding member, an upper surface of the heat dissipation member is in contact with the light emitting device and extended in a first direction, wherein the first direction is a direction from an upper surface of the light emitting device toward the lower surface of the body, and a first distance from the upper surface of the light emitting device to the lower surface of the first frame is provided to be equal to or greater than a second distance from the upper surface of the light emitting device to a lower surface of the heat dissipation member.

According to the embodiment, the body may comprise an opening passing through the lower surface of the body at an upper surface of the body in the first direction, and the heat dissipation member may be provided at the opening.

The light emitting device package according to the embodiment may further comprise a first conductive layer disposed between the first bonding part and the first frame; and a second conductive layer disposed between the second bonding part and the second frame.

According to the embodiment, the molding member may comprise a reflective resin portion disposed under the light emitting device and a molding part disposed at a periphery of the light emitting device.

According to the embodiment, an area of a lower surface of the first bonding part or an area of a lower surface of the second bonding part may be smaller than that of an upper region of the opening.

According to the embodiment, the heat dissipation member may comprise an epoxy-based or silicone-based resin, and may comprise at least one material selected from the group consisting of $Al_2O_3$ and AlN.

According to the embodiment, the heat dissipation member may be provided as an insulating adhesive, and the first and second conductive layers may be provided as a conductive adhesive.

The light emitting device package according to the embodiment may further comprise a first conductor disposed between the first bonding part and the first conductive layer, and a second conductor disposed between the second bonding part and the second conductive layer.

A method of fabricating a light emitting device package according to an embodiment comprises: providing a first frame, a second frame, and a package body comprising a body disposed between the first frame and the second frame and comprising an opening passing through upper and lower surfaces thereof; providing a light emitting device comprising a first bonding part and a second bonding part disposed on a lower surface thereof on the package body, wherein the first bonding part is disposed on the first frame and the second bonding part is disposed on the second frame; and disposing a heat dissipation member provided through the opening in direct contact with the lower surface of the light emitting device.

According to the embodiment, the method may further comprise providing a molding member at a periphery of the light emitting device.

According to the embodiment, the providing of the molding member may comprise providing a reflective resin portion under the light emitting device, and providing a molding part at the periphery of the light emitting device.

According to the embodiment, in the providing of the heat dissipation member, the heat dissipation member may be disposed to be in direct contact with the first bonding part and the second bonding part.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like or heat-treating the semiconductor device package.

DETAILED DESCRIPTION OF THE EMBODIMENTS

Figure 1:
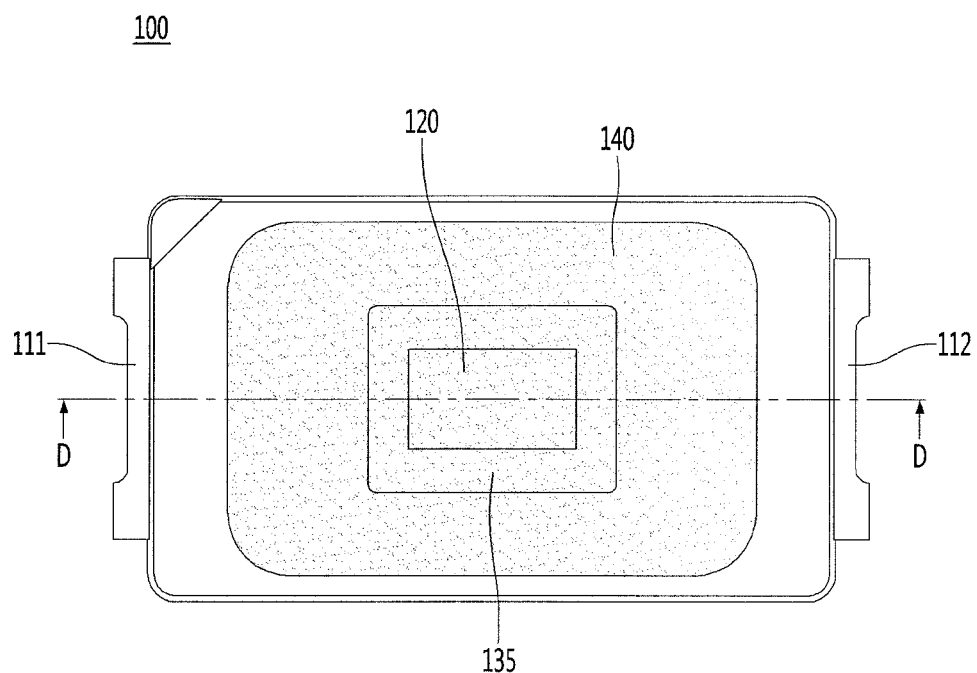
FIG. 1 is a plan view of a light emitting device package according to an embodiment of the present invention.

Hereinafter, embodiments will be described with reference to the accompanying drawings. In the description of embodiments, it will be understood that when a layer (or film), region, pattern or structure is referred to as being "on" or "under" another layer (or film), region, pattern or structure, the terminology of "on" and "under" comprises both the meanings of "directly" or "by interposing another layer (indirectly)". Further, the reference about "on" and "under" each layer will be made on the basis of drawings, but embodiments are not limited thereto.

Hereinafter, a semiconductor device package according to embodiments of the present invention and a method of manufacturing a semiconductor device package will be described in detail with reference to the accompanying drawings. Hereinafter, it will be described based on the case where a light emitting device is applied as an example of a semiconductor device.

First, a light emitting device package according to an embodiment of the present invention will be described with reference to FIGS. 1 to 4.

The light emitting device package 100 according to an embodiment may comprise a package body 110 and a light emitting device 120, as shown in FIGS. 1 to 4.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

The first frame 111 and the second frame 112 may be provided as a conductive frame. The first frame 111 and the second frame 112 may stably provide the structural strength of the package body 110 and may be electrically connected to the light emitting device 120.

Figure 2:
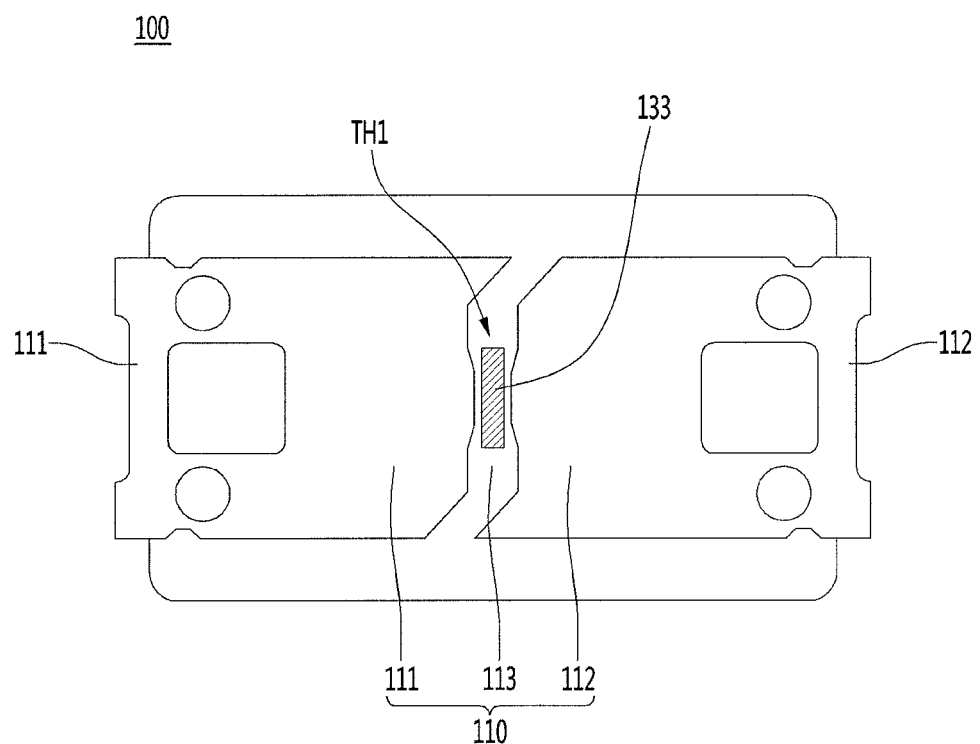
FIG. 2 is a bottom view of the light emitting device package shown in FIG. 1.
Figure 3:
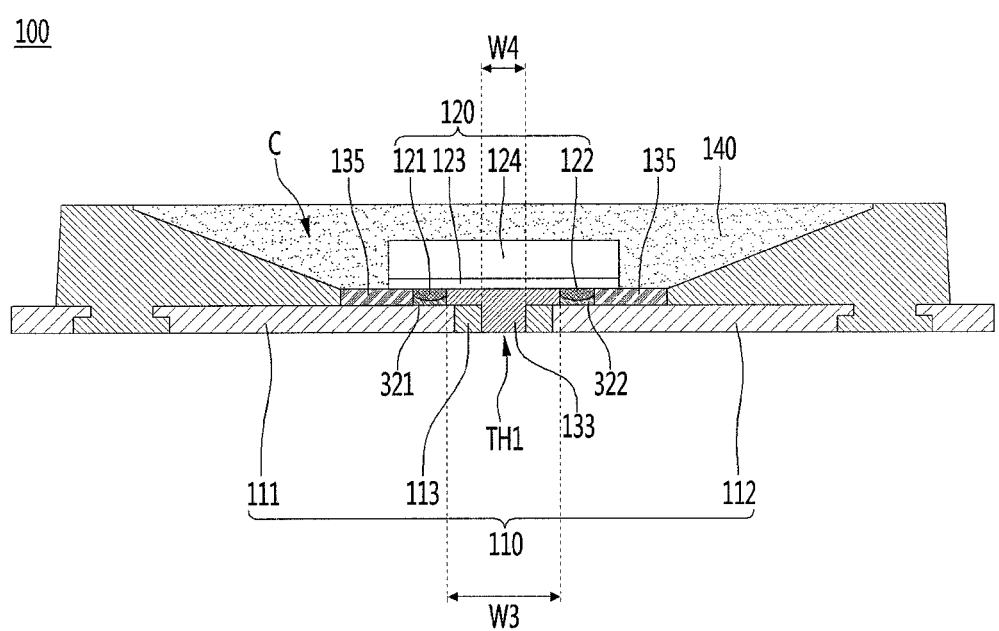
FIG. 3 is a cross-sectional view taken along line D-D of the light emitting device package shown in FIG. 1.
Figure 4:
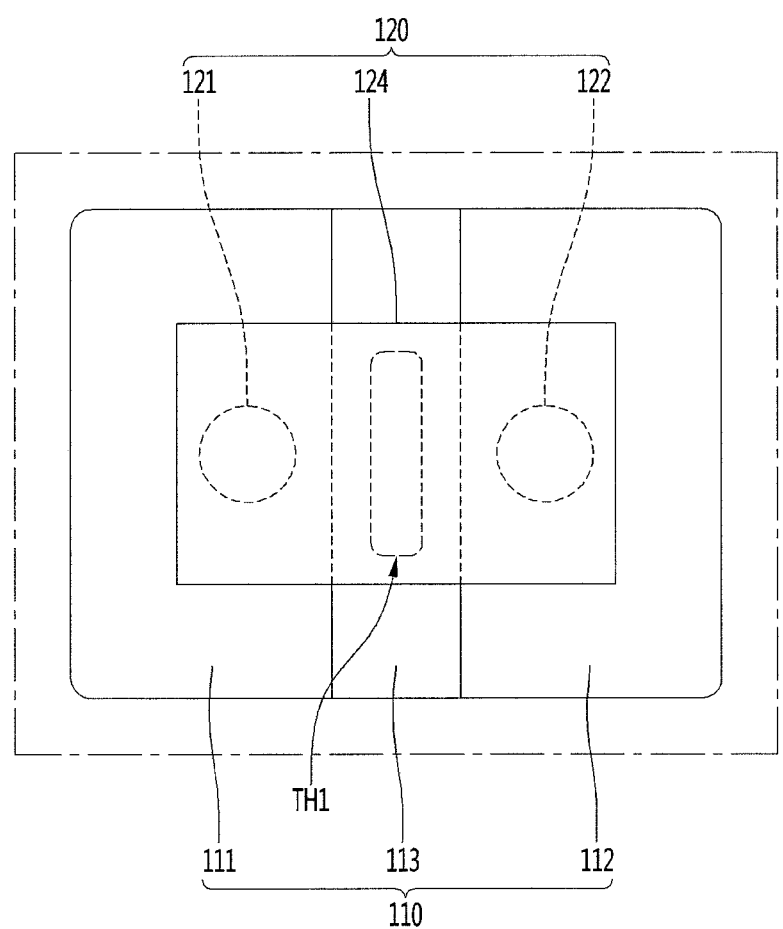
FIG. 4 is a view explaining an arrangement relationship of a first frame, a second frame, and a body applied to the light emitting device package according to an embodiment of the present invention.

According to the embodiment, as shown in FIGS. 2 to 4, the body 113 may comprise an opening TH1. The opening TH1 may be disposed between the first frame 111 and the second frame 112. The opening TH1 may be provided under the light emitting device 120.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 3. The first bonding part 121 and the second bonding part 122 may be disposed between the light emitting structure 123 and the package body 110.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The first bonding part 121 and the second bonding part 122 may be formed in a single layer or multiple layers by using at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, and Ni/IrOx/Au, Ni/IrOx/Au/ITO, or an alloy thereof.

In addition, the light emitting device package according to the embodiment may comprise a first conductive layer 321 and a second conductive layer 322. The first conductive layer 321 may be disposed to be spaced apart from the second conductive layer 322.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function of fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function of fixing the second bonding part 122 and the second frame 112.

The first conductive layer 321 and the second conductive layer 322 may comprise one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

A width W3 between the first conductive layer 321 and the second conductive layer 322 in lower surface regions of the first frame 111 and the second frame 112 may be provided at several hundreds of micrometers. The width W3 between the first conductive layer 321 and the second conductive layer 322 in the lower surface regions of the first frame 111 and the second frame 112 may be selected to be provided over a predetermined distance in order to prevent a short-circuit between the pads from occurring when the light emitting device package 100 according to the embodiment is mounted on a circuit board, a submount, or the like later.

The light emitting device package 100 according to the embodiment may comprise a heat dissipation member 133.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package 100 according to the embodiment may comprise an opening TH1, as shown in FIGS. 1 to 4.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, AlN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package 100 by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

The opening TH1 may provide a proper space in which a kind of under-filling process may be performed at a lower portion of the light emitting device 120. Here, the under-filling process may be a process of mounting the light emitting device 120 on the package body 110 and then disposing the heat dissipation member 133 under the light emitting device 120. The opening TH1 may be provided at a first depth or more so that the heat dissipation member 133 may be sufficiently provided between the lower surface of the light emitting device 120 and the upper surface of the body 113.

A depth and a width W4 of the opening TH1 may affect a forming position and fixing force of the heat dissipation member 133. The depth and the width W4 of the opening TH1 may be determined so that a fixing force may be sufficiently provided by the heat dissipation member 133 disposed between the body 113 and the light emitting device 120.

As an example, the depth of the opening TH1 may be provided to correspond to a thickness of the first frame 111 or the second frame 112. The depth of the opening TH1 may be provided at a thickness capable of maintaining a stable strength of the first frame 111 or the second frame 112.

In addition, the depth of the opening TH1 may be provided to correspond to a thickness of the body 113. The depth of the opening TH1 may be provided at a thickness capable of maintaining a stable strength of the body 113.

As an example, the depth of the opening TH1 may be provided at several hundreds of micrometers. The depth of the opening TH1 may be provided at 180 to 220 micrometers. As an example, the depth of the opening TH1 may be provided at 200 micrometers.

In addition, the width W4 of the opening TH1 may be provided at several tens of micrometers to several hundreds of micrometers. Here, the width W4 of the opening TH1 may be provided in a major axis direction of the light emitting device 120.

The width W4 of the opening TH1 may be provided to be narrower than a gap between the first bonding part 121 and the second bonding part 122. The width W4 of the opening TH1 may be provided at 140 to 400 micrometers.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1, as shown in FIG. 4. In addition, the area of the second bonding part 122 may be provided to be smaller than that of the area of the upper region of the opening TH1, as shown in FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package 100 according to the embodiment may comprise a molding member, as shown in FIGS. 1 to 3. As an example, the molding member according to the embodiment may comprise a resin portion 135 and a molding part 140.

The molding member according to the embodiment may comprise at least one of the resin portion 135 and the molding part 140. First, in the following embodiments, it is described based on the case in which the molding member comprises both the resin portion 135 and the molding part 140.

However, according to another embodiment, the molding member may comprise only the resin portion 135, or may comprise only the molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package 100 according to the embodiment may comprise the molding part 140, as shown in FIGS. 1 and 3.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

Meanwhile, as described above, according to another example of the light emitting device package according to the embodiment of the present invention, the resin portion 135 may not be provided separately, and the molding part 140 may be disposed to be in direct contact with the first frame 111 and the second frame 112. Further, the molding part 140 is not provided separately, and the resin portion 135 may be provided both at the periphery and the upper portion of the light emitting device 120.

In addition, according to an embodiment, the light emitting structure 123 may be provided as a compound semiconductor. The light emitting structure 123 may be provided as, for example, a Group II-VI or Group III-V compound semiconductor. As an example, the light emitting structure 123 may be provided with at least two or more elements selected from aluminum (Al), gallium (Ga), indium (In), phosphorus (P), arsenic (As), and nitrogen (N).

The light emitting structure 123 may comprise a first conductivity type semiconductor layer, an active layer, and a second conductivity type semiconductor layer.

The first and second conductivity type semiconductor layers may be implemented as at least one of the Group II-VI or Group III-V compound semiconductors. The first and second conductivity type semiconductor layers may be formed of a semiconductor material having an empirical formula of $In_xAl_yGa_{1-x-y}N$ ($0 \leq x \leq 1$, $0 \leq y \leq 1$, $0 \leq x+y \leq 1$). For example, the first and second conductivity type semiconductor layers may comprise at least one selected from the group consisting of GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, or Te. The second conductivity type semiconductor layer may be a p-type semiconductor layer doped with a p-type dopant such as Mg, Zn, Ca, Sr, or Ba.

The active layer may be implemented as a compound semiconductor. The active layer may be implemented as at least one of the Group III-V or Group II-VI compound semiconductors. When the active layer is implemented as a multi-well structure, the active layer may comprise a plurality of well layers and a plurality of barrier layers that are alternately disposed, and the active layer may be disposed as the semiconductor material having an empirical formula of $In_xAl_yGa_{1-x-y}N$ ($0 \leq x \leq 1$, $0 \leq y \leq 1$, $0 \leq x+y \leq 1$). For example, the active layer may comprise at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the light emitting device package 100 according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Then, referring to the accompanying drawings, a method of fabricating a light emitting device package according to the embodiment of the present invention will be described.

In describing the method of fabricating the light emitting device package according to the embodiment of the present invention with reference to the accompanying drawings, the description of the contents overlapping with the contents described with reference to FIGS. 1 to 4 may be omitted.

Figure 5A:
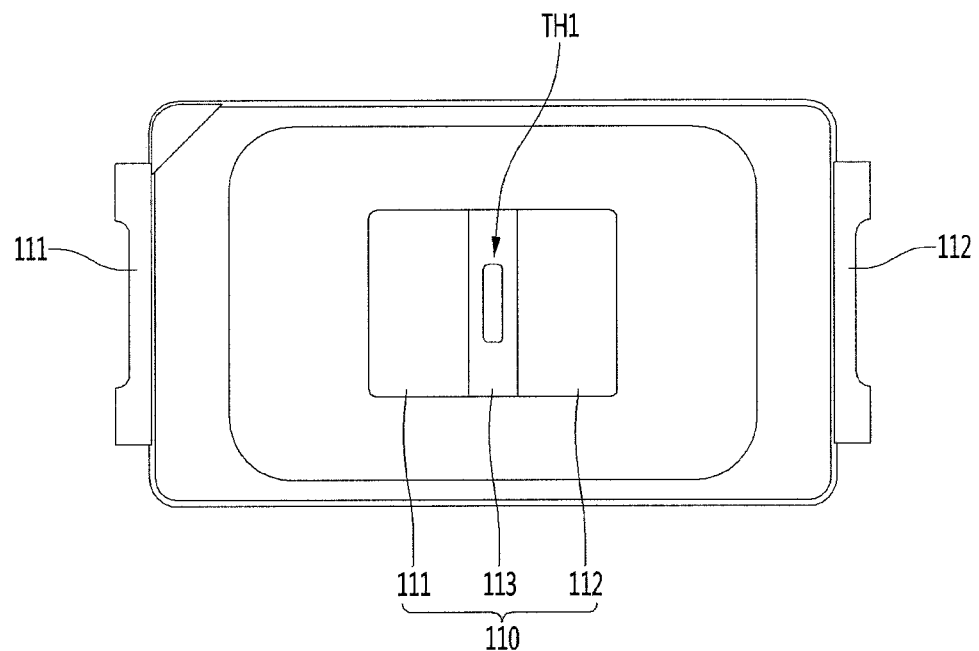
FIGS. 5a and 5b are views explaining a state in which a package body is provided by a method of fabricating a light emitting device package according to an embodiment of the present invention.
Figure 5B:
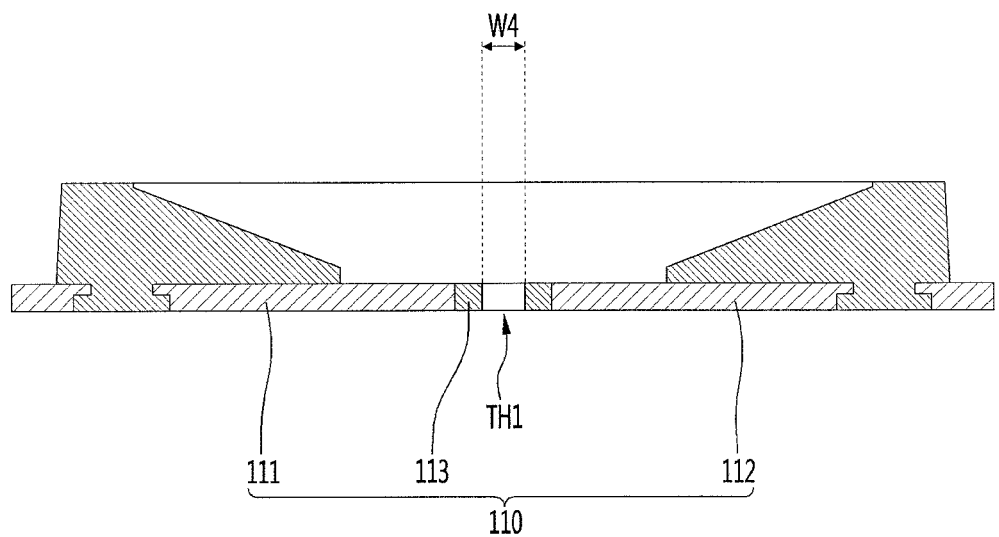

First, according to the method of fabricating the light emitting device package according to the embodiment of the present invention, as shown in FIGS. 5a and 5b, a package body 110 may be provided.

FIGS. 5a and 5b are a plan view and a cross-sectional view illustrating a state in which a package body is provided by the method of fabricating a light emitting device package according to an embodiment of the present invention.

The package body 110 may comprise a first frame 111 and a second frame 112 as shown in FIGS. 5a and 5b. The first frame 111 and the second frame 112 may be disposed to be spaced apart from each other.

The package body 110 may comprise a body 113. The body 113 may be disposed between the first frame 111 and the second frame 112.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The body 113 may comprise an opening TH1. The opening TH1 may be disposed between the first frame 111 and the second frame 112. The opening TH1 may be provided by passing through the body 113. The opening TH1 may be provided by passing through an upper surface and a lower surface of the body 113 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

Figure 6A:
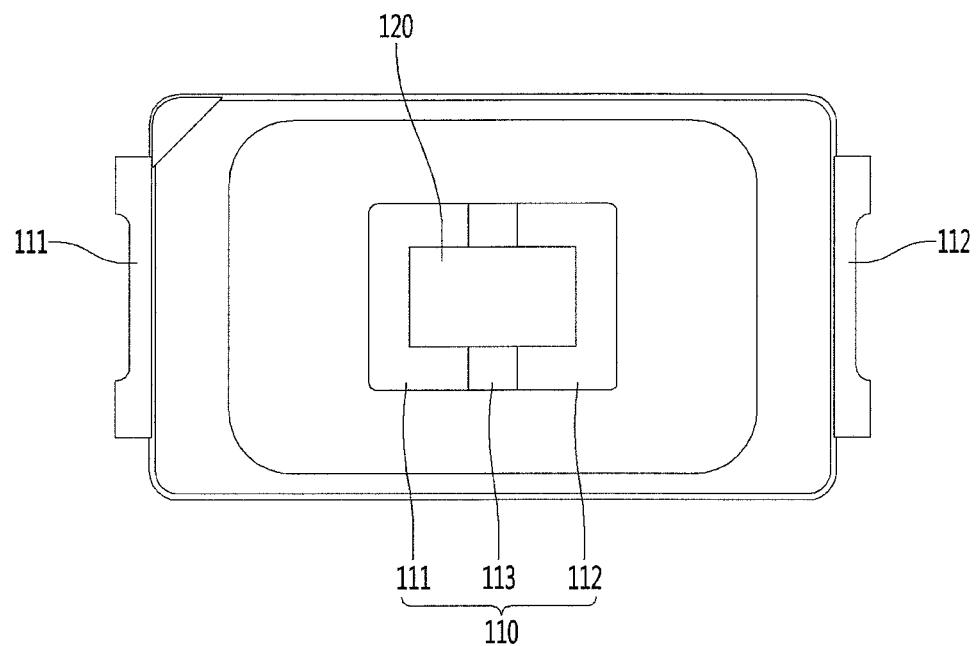
FIGS. 6a and 6b are views explaining a state in which a light emitting device is provided by a method of fabricating a light emitting device package according to an embodiment of the present invention.
Figure 6B:
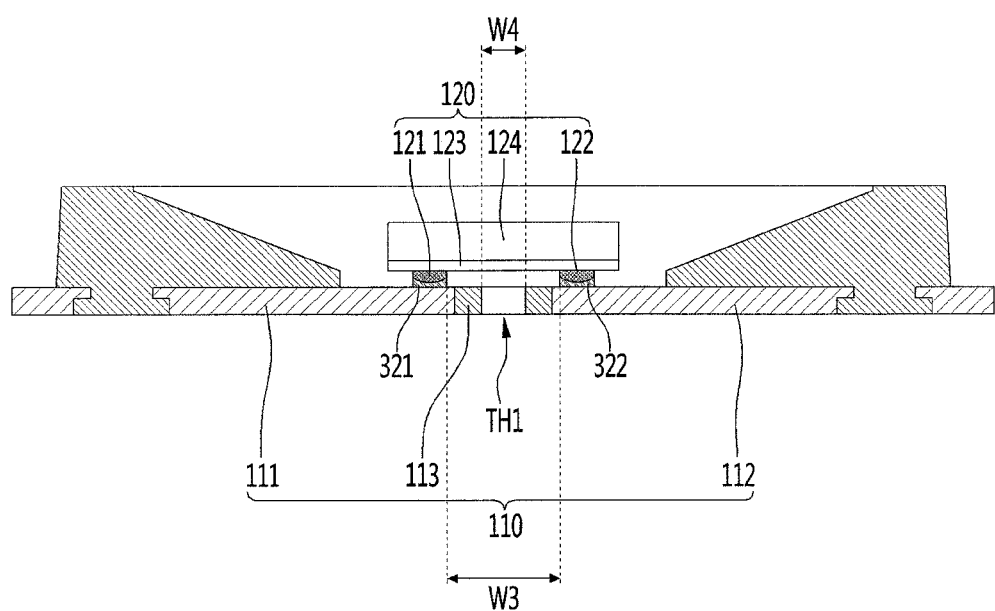

Then, according to the method of fabricating the light emitting device package according to the embodiment, as shown in FIGS. 6A and 6B, the light emitting device 120 may be provided on the package body 110.

FIGS. 6a and 6b are a plan view and a cross-sectional view illustrating a state in which a light emitting device is provided by the method of fabricating the light emitting device package according to the embodiment of the present invention.

According to the embodiment, the light emitting device 120 may comprise a first bonding part 121, a second bonding part 122, a light emitting structure 123, and a substrate 124.

The light emitting device 120 may be disposed on the first frame 111 and the second frame 112. The light emitting device 120 may be disposed on the body 113. The first bonding part 121 may be disposed on the first frame 111. The second bonding part 122 may be disposed on the second frame 112.

As an example, the first and second bonding parts 121 and 122 may be fixed on the first and second frames 111 and 112 by the first and second conductive layers 321 and 322.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function fixing the second bonding part 122 and the second frame 112.

The first conductive layer 321 and the second conductive layer 322 may comprise at least one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

According to the embodiment, the light emitting device 120 may be disposed on the opening TH1. The opening TH1 may be disposed between the first bonding part 121 and the second bonding part 122 when viewed from the upper direction of the light emitting device 120. The opening TH1 may be disposed to be overlapped with the lower surface of the light emitting structure 123 in a direction from the lower surface of the body 113 toward the upper surface thereof.

As an example, a curing process for the first and second conductive layers 321 and 322 may be performed. The first and second bonding parts 121 and 122 of the light emitting device 120 may be stably fixed on the first and second frames 111 and 112 by the curing process.

Figure 7A:
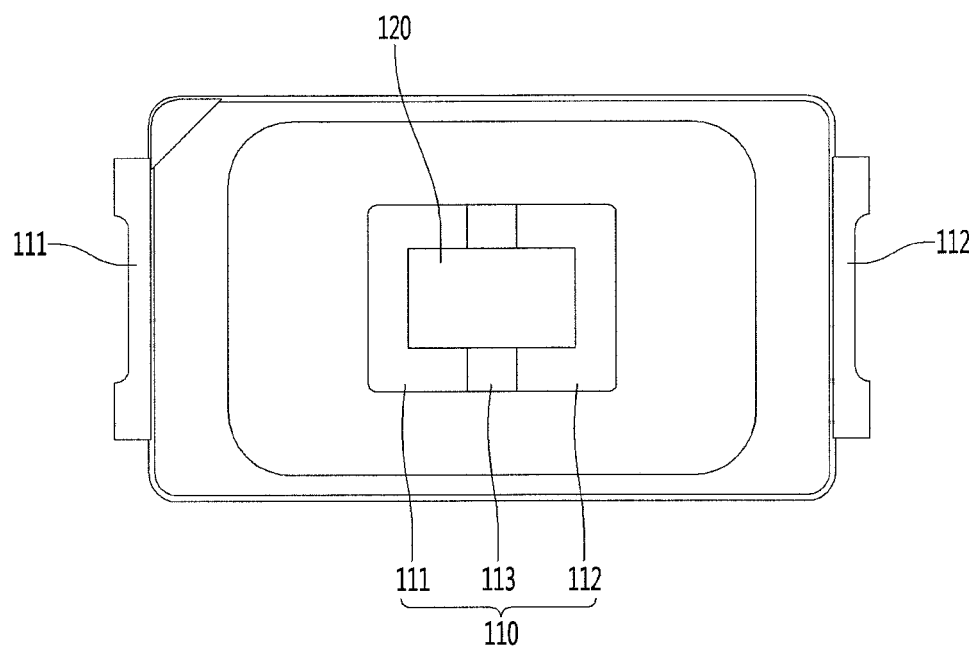
FIGS. 7a and 7b are views explaining a state in which a heat dissipation member is provided at an opening by a method of fabricating a light emitting device package according to an embodiment of the present invention.
Figure 7B:
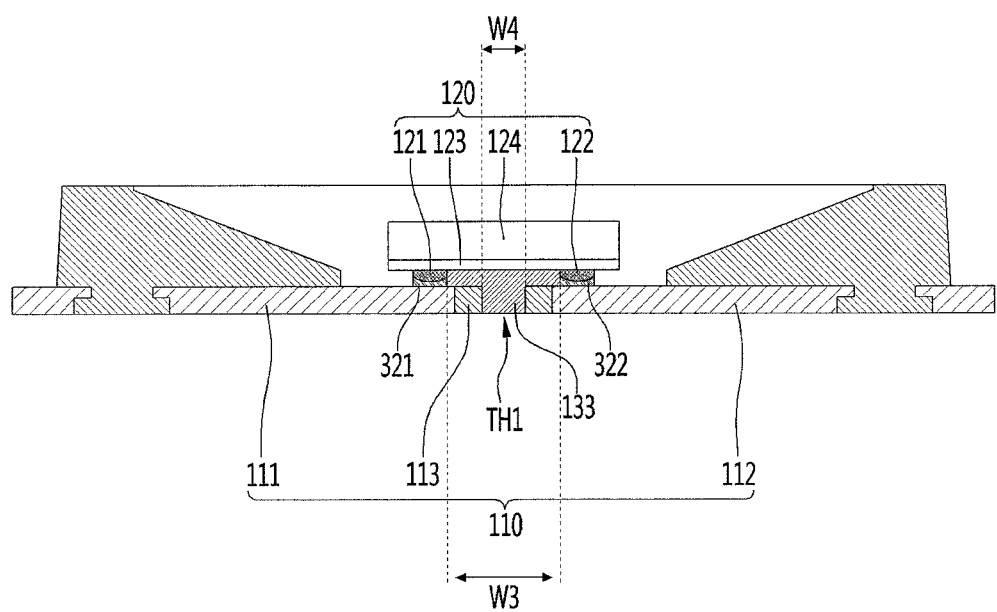

Then, in the method of fabricating the light emitting device package according to the embodiment, a heat dissipation member 133 may be provided at the opening TH1, as shown in FIGS. 7a and 7b.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, AlN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package 100 by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

As an example, the curing process for the heat dissipation member 133 may be performed. The heat dissipation member 133 may be stably fixed between the light emitting device 120 and the package body 110 by the curing process.

Figure 8A:
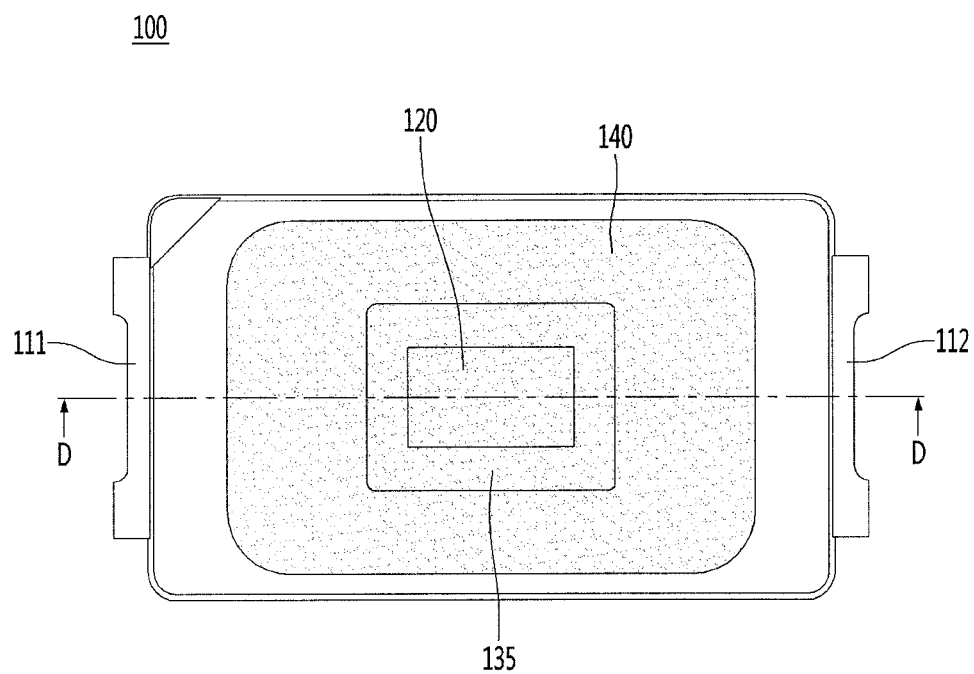
FIGS. 8a and 8b are views explaining a state in which a molding member is provided by a method of fabricating a light emitting device package according to an embodiment of the present invention.
Figure 8B:
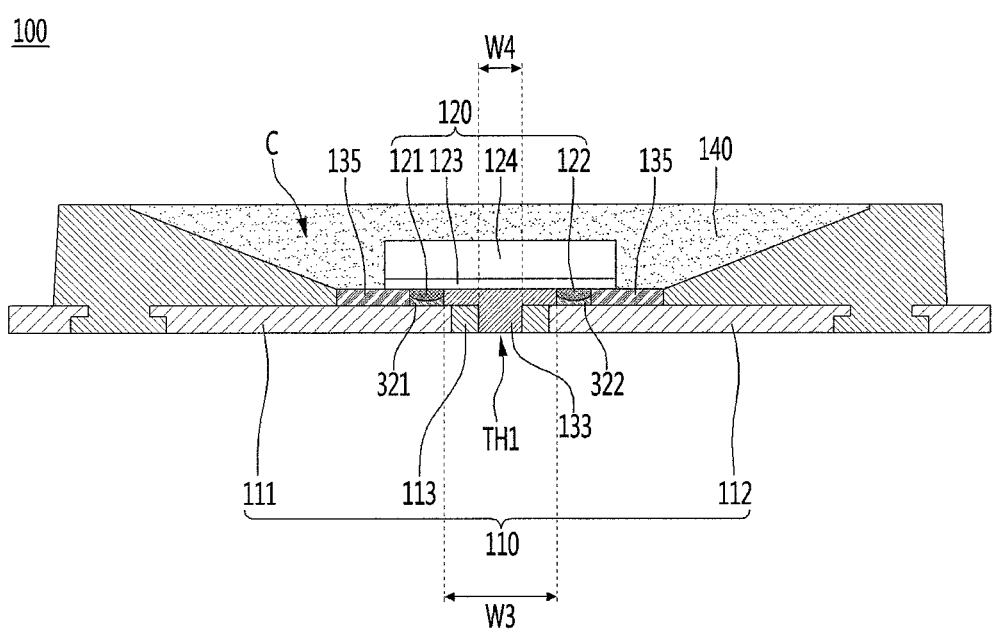

In addition, according to the method of fabricating the light emitting device package according to the embodiment, as shown in FIGS. 8a and 8b, a molding member may be formed.

FIGS. 8a and 8b are a plan view and a cross-sectional view explaining a state in which a molding member is provided by the method of fabricating the light emitting device package according to the embodiment of the present invention.

As described with reference to FIGS. 1 to 4, the molding member according to the embodiment may comprise at least one of the resin portion 135 and the molding member 140. Here, it is described based on the case in which the molding member comprises both the resin portion 135 and the molding part 140.

According to the embodiment, the resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package 100 according to the embodiment may comprise the molding part 140.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

Meanwhile, as described above, according to another example of the light emitting device package according to the embodiment of the present invention, the resin portion 135 may not be provided separately, and the molding part 140 may be disposed to be in direct contact with the first frame 111 and the second frame 112. Further, the molding part 140 is not provided separately, and the resin portion 135 may be provided both at the periphery and the upper portion of the light emitting device 120.

As described above, according to the method of fabricating the light emitting device package according to the embodiment, the periphery of the first and second bonding parts 121 and 122 may be stably sealed by the heat dissipation member 133 and the molding members 135 and 140.

Therefore, according to the method of fabricating the light emitting device package according to the embodiment, it is possible to prevent the first and second conductive layers 321 and 322 from diffusing in the side surface direction of the light emitting device 120 from the lower surfaces of the first and second bonding parts 121 and 122, and it is possible to prevent a short-circuit due to the light emitting device 120, thereby improving reliability of the light emitting device package.

Meanwhile, in the above description, it is described based on the case in which the molding members 135 and 140 are formed as shown in FIGS. 8a and 8b after the heat dissipation member 133 are formed as shown in FIGS. 7a and 7b.

However, according to another example of the method of fabricating the light emitting device package according to the embodiment, the molding members 135 and 140 may be formed first, and the heat dissipation member 133 may be formed later.

In addition, according to another example of the method of fabricating the light emitting device package according to the embodiment, the resin portion 135 may not be formed, and only the molding part 140 may be formed in the cavity of the package body 110.

In the light emitting device package 100 according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package 100 according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a frame and the light emitting device provided at the light emitting device package, so that stability of electrical connection and physical coupling may be weakened. Accordingly, a position of the light emitting device may be changed, and the optical and electrical characteristics and reliability of the light emitting device package may be deteriorated.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

In addition, according to the embodiment, the sum of areas of the first and second bonding parts 121 and 122 may be provided at 10% or less based on the area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1. In addition, the area of the second bonding part 122 may be provided to be smaller than that of the area of the upper region of the opening TH1.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, light emitted in a lower direction of the light emitting device 120 is reflected at the heat dissipation member 133, and is effectively emitted toward an upper direction of the light emitting device package 100, and thus light extraction efficiency may be improved.

Then, another example of the light emitting device package according to an embodiment of the present invention will be described with reference to FIG. 9.

In describing the light emitting device package according to the embodiment of with reference to FIG. 9, the description of the contents overlapping with the contents described with reference to the accompanying drawings may be omitted.

Figure 9:
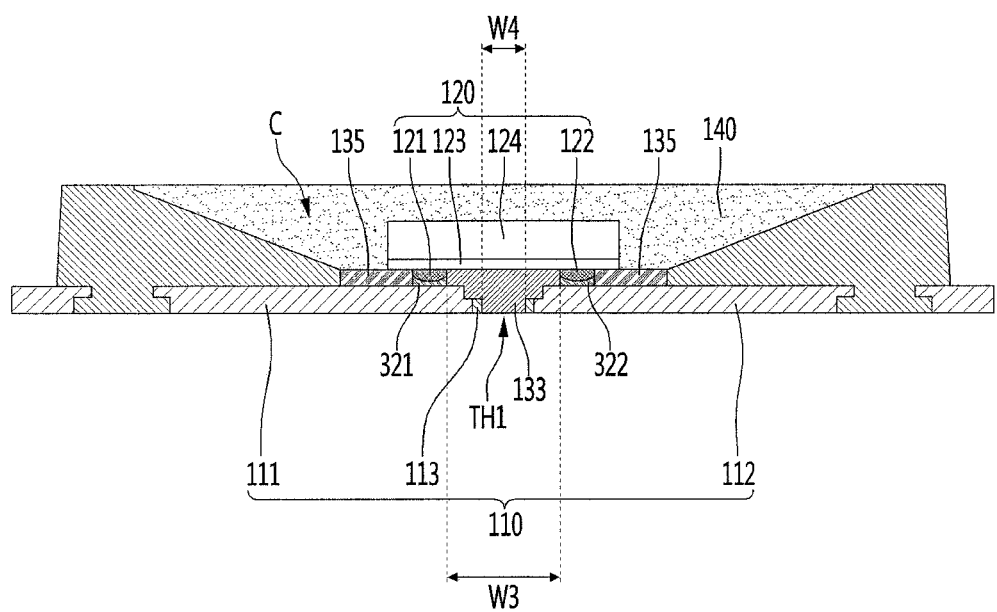
FIG. 9 is a view illustrating another example of a light emitting device package according to an embodiment of the present invention.

The light emitting device package according to the embodiment may comprise a package body 110 and a light emitting device 120, as shown in FIG. 9.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The first frame 111 and the second frame 112 may be provided as a conductive frame. The first frame 111 and the second frame 112 may stably provide the structural strength of the package body 110 and may be electrically connected to the light emitting device 120.

According to the embodiment, the body 113 may comprise an opening TH1. The opening TH1 may be disposed between the first frame 111 and the second frame 112. The opening TH1 may be provided under the light emitting device 120.

In addition, according to the embodiment, a stepped step-shape may be provided at the upper surface of the first frame 111 and the upper surface of the second frame 112. For example, the upper surface of the body 113 may be provided in a flat shape, the upper surface of the first frame 111 may be provided in a stepped step-shape with a different height, and the upper surface of the second frame 112 may be provided in a stepped step-shape with a different height.

According to the embodiment, a recess structure to concave from the upper surface of the package body 110 toward the lower surface thereof may be provided by the flat upper surface of the body 113, the stepped step-shaped upper surface of the first frame 111, the stepped step-shaped upper surface of the second frame 112.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 9. The first bonding part 121 and the second bonding part 122 may be disposed between the light emitting structure 123 and the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

In addition, the light emitting device package according to the embodiment may comprise a first conductive layer 321 and a second conductive layer 322. The first conductive layer 321 may be disposed to be spaced apart from the second conductive layer 322.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function of fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function of fixing the second bonding part 122 and the second frame 112.

The first conductive layer 321 and the second conductive layer 322 may comprise one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

The light emitting device package according to the embodiment may comprise a heat dissipation member 133, as shown in FIG. 9.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. The heat dissipation member 133 may be disposed at the recess structure of the stepped step shape disposed between the first frame 111 and the second frame 112. The heat dissipation member 133 may be disposed on the flat surface of the body 113.

As described above, according to the embodiment, the heat dissipation member 133 may be provided at a wide recess region provided by the upper surface of the first frame 111, the upper surface of the body 113, and the upper surface of the second frame 112, and thus a heat dissipation characteristic of the light emitting device package according to the embodiment may be further improved.

In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 9.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, AlN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package 100 by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1, as described above with reference to FIG. 4. In addition, the area of the second bonding part 122 may be provided to be smaller than that of the area of the upper region of the opening TH1, as described above with reference to FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package according to the embodiment may comprise a molding member, as shown in FIG. 9. As an example, the molding member according to the embodiment may comprise a resin portion 135 and a molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package 100 according to the embodiment may comprise the molding part 140, as shown in FIG. 9.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Then, another example of the light emitting device package according to an embodiment of the present invention will be described with reference to FIG. 10.

In describing the light emitting device package according to the embodiment of with reference to FIG. 10, the description of the contents overlapping with the contents described with reference to FIGS. 1 to 9 may be omitted.

Figure 10:
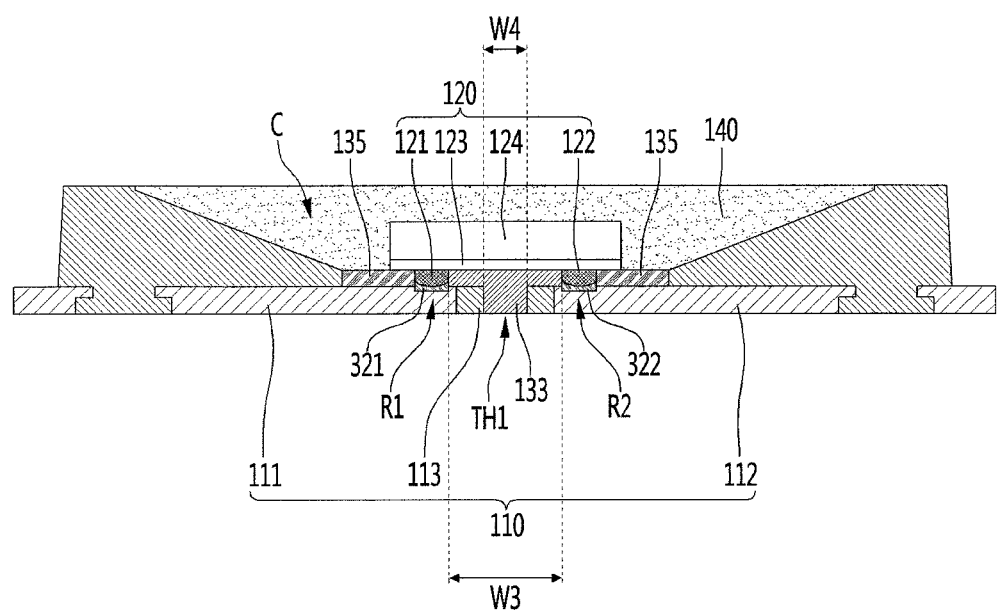
FIG. 10 is a view illustrating still another example of a light emitting device package according to an embodiment of the present invention.

The light emitting device package according to an embodiment may comprise a package body 110 and a light emitting device 120, as shown in FIG. 10.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

For example, the first frame 111 and the second frame 112 may be disposed to be spaced apart from each other at the body 113. For example, the first frame 111 and the second frame 112 may be disposed to be spaced apart from each other with the body 113 interposed therebetween.

According to the embodiment, the body 113 may comprise an opening TH1. The opening TH1 may be disposed between the first frame 111 and the second frame 112. The opening TH1 may be provided under the light emitting device 120.

The light emitting device package according to the embodiment shown in FIG. 10 may further comprise a first recess R1 and a second recess R2, as compared to the light emitting device package described with reference to FIG. 3.

The first recess R1 may be provided on the upper surface of the first frame 111. The first recess R1 may be provided to concave in a lower surface direction from the upper surface of the first frame 111. The first recess R1 may be disposed to be spaced apart from the opening TH1.

The second recess R2 may be provided on the upper surface of the second frame 112. The second recess R2 may be provided to concave in a lower surface direction from the upper surface of the second frame 112. The second upper recess R4 may be disposed to be spaced apart from the opening TH1.

According to the embodiment, the first conductive layer 321 may be provided at the first recess R1. In addition, the first bonding part 121 may be provided at the first recess R1 region. In addition, the second conductive layer 322 may be provided at the second recess R2. In addition, the second bonding part 122 2 may be provided at the second recess R2 region. The first and second recesses R1 and R2 may provide a sufficient space in which the first and second conductive layers 321 and 322 may be provided.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function of fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function of fixing the second bonding part 122 and the second frame 112.

The first conductive layer 321 and the second conductive layer 322 may comprise one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 10. The first bonding part 121 and the second bonding part 122 may be disposed between the light emitting structure 123 and the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The light emitting device package according to the embodiment may comprise a heat dissipation member 133, as shown in FIG. 10.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. According to the embodiment, the heat dissipation member 133 may be disposed on the upper surface of the first frame 111, the upper surface of the body 113 and the upper surface of the second frame 112.

In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 10.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, MN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1, as described above with reference to FIG. 4. In addition, the area of the second bonding part 122 may be provided to be smaller than that of the area of the upper region of the opening TH1, as described above with reference to FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package according to the embodiment may comprise a molding member, as shown in FIG. 10. As an example, the molding member according to the embodiment may comprise a resin portion 135 and a molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package according to the embodiment may comprise the molding part 140, as shown in FIG. 10.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Then, another example of the light emitting device package according to an embodiment of the present invention will be described with reference to FIG. 11.

In describing the light emitting device package according to the embodiment of with reference to FIG. 11, the description of the contents overlapping with the contents described with reference to FIGS. 1 to 10 may be omitted.

Figure 11:
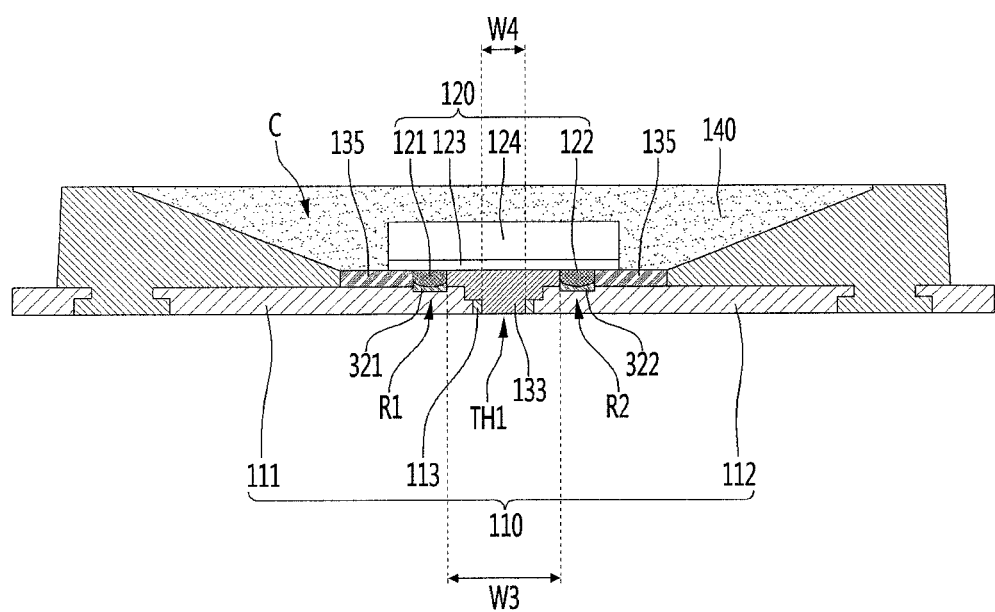
FIG. 11 is a view illustrating still another example of a light emitting device package according to an embodiment of the present invention.

The light emitting device package according to an embodiment may comprise a package body 110 and a light emitting device 120, as shown in FIG. 11.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line.

For example, the first frame 111 and the second frame 112 may be disposed to be spaced apart from each other at the body 113. For example, the first frame 111 and the second frame 112 may be disposed to be spaced apart from each other with the body 113 interposed therebetween.

According to the embodiment, the body 113 may comprise an opening TH1. The opening TH1 may be disposed between the first frame 111 and the second frame 112. The opening TH1 may be provided under the light emitting device 120.

The light emitting device package according to the embodiment shown in FIG. 11 may further comprise a first recess R1 and a second recess R2, as compared to the light emitting device package described with reference to FIG. 9.

The first recess R1 may be provided on the upper surface of the first frame 111. The first recess R1 may be provided to concave in a lower surface direction from the upper surface of the first frame 111. The first recess R1 may be disposed to be spaced apart from the recess R.

The second recess R2 may be provided on the upper surface of the second frame 112. The second recess R2 may be provided to concave in a lower surface direction from the upper surface of the second frame 112. The second upper recess R4 may be disposed to be spaced apart from the recess R.

The second recess R2 may be provided on the upper surface of the second frame 112. The second recess R2 may be provided to concave in a lower surface direction from the upper surface of the second frame 112. The second upper recess R4 may be disposed to be spaced apart from the opening TH1.

According to the embodiment, the first conductive layer 321 may be provided at the first recess R1. In addition, the first bonding part 121 may be provided at the first recess R1 region. In addition, the second conductive layer 322 may be provided at the second recess R2. In addition, the second bonding part 122 2 may be provided at the second recess R2 region. The first and second recesses R1 and R2 may provide a sufficient space in which the first and second conductive layers 321 and 322 may be provided.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function of fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function of fixing the second bonding part 122 and the second frame 112.

The first conductive layer 321 and the second conductive layer 322 may comprise one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 11. The first bonding part 121 and the second bonding part 122 may be disposed between the light emitting structure 123 and the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The light emitting device package according to the embodiment may comprise a heat dissipation member 133, as shown in FIG. 11.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. The heat dissipation member 133 may be disposed at the recess structure of the stepped step shape disposed between the first frame 111 and the second frame 112. The heat dissipation member 133 may be disposed on the flat surface of the body 113.

As described above, according to the embodiment, the heat dissipation member 133 may be provided at a wide recess region provided by the upper surface of the first frame 111, the upper surface of the body 113, and the upper surface of the second frame 112, and thus a heat dissipation characteristic of the light emitting device package according to the embodiment may be further improved.

In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 11.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, MN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package 100 by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1, as described above with reference to FIG. 4. In addition, the area of the second bonding part 122 may be provided to be smaller than that of the area of the upper region of the opening TH1, as described above with reference to FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package according to the embodiment may comprise a molding member, as shown in FIG. 11. As an example, the molding member according to the embodiment may comprise a resin portion 135 and a molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package according to the embodiment may comprise the molding part 140, as shown in FIG. 11.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package 100 according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Meanwhile, the light emitting device package 100 according to the embodiment described above referring to FIGS. 1 to 11 may be supplied and mounted on a submount, a circuit board, or the like.

Then, another example of the light emitting device package according to an embodiment of the present invention will be described with reference to FIG. 12.

Figure 12:
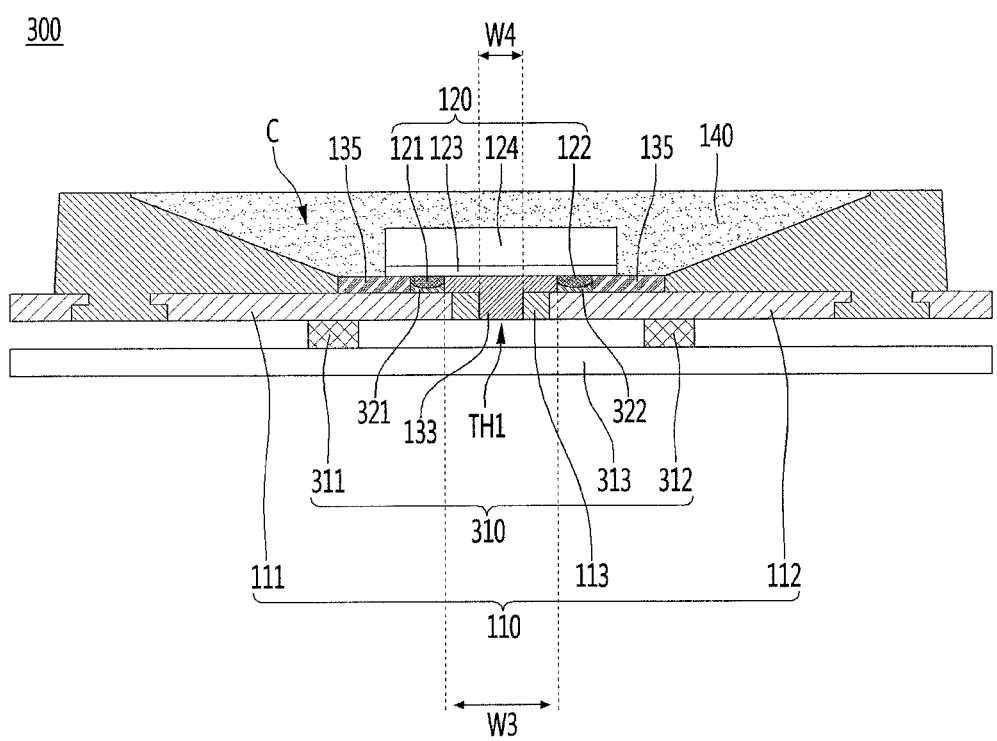
FIG. 12 is a view illustrating still another example of a light emitting device package according to an embodiment of the present invention.

The light emitting device package 300 according to the embodiment of the present invention shown in FIG. 12 is an example in which the light emitting device package described with reference to FIGS. 1 to 11 is mounted on a circuit board 310 and supplied.

In describing the manufacturing method of the light emitting device package 300 according to the embodiment of the present invention with reference to FIG. 12, the description overlapping with the contents described with reference to FIGS. 1 to 11 may be omitted.

The light emitting device package 300 according to the embodiment may comprise a circuit board 310, a package body 110, and a light emitting device 120, as shown in FIG. 12.

The circuit board 310 may comprise a first pad 311, a second pad 312, and a support substrate 313. The support substrate 313 may be provided with a power supply circuit configured to control driving of the light emitting device 120.

The package body 110 may be disposed on the circuit board 310. The first pad 311 and the first pad electrode 121 may be electrically connected to each other. The second pad 312 and the second pad electrode 122 may be electrically connected to each other.

The first pad 311 and the second pad 312 may comprise a conductive material. For example, the first pad 311 and the second pad 312 may comprise one material selected from the group consisting of Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

The first frame 111 and the second frame 112 may be provided as a conductive frame. The first frame 111 and the second frame 112 may stably provide the structural strength of the package body 110 and may be electrically connected to the light emitting device 120.

According to the embodiment, as shown in FIG. 12, the body 113 may comprise an opening TH1. The opening TH1 may be disposed between the first frame 111 and the second frame 112. The opening TH1 may be provided under the light emitting device 120.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 12. The first bonding part 121 and the second bonding part 122 may be disposed between the light emitting structure 123 and the package body 110.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

In addition, the light emitting device package according to the embodiment may comprise a first conductive layer 321 and a second conductive layer 322. The first conductive layer 321 may be disposed to be spaced apart from the second conductive layer 322.

The first conductive layer 321 may be disposed on the first frame 111. The first conductive layer 321 may be disposed under the first bonding part 121.

The first conductive layer 321 may be disposed to be in direct contact with the lower surface of the first bonding part 121. The first conductive layer 321 may be electrically connected to the first bonding part 121. The first conductive layer 321 may provide a function of fixing the first bonding part 121 and the first frame 111.

The second conductive layer 322 may be disposed on the second frame 112. The second conductive layer 322 may be disposed under the second bonding part 122.

The second conductive layer 322 may be disposed to be in direct contact with the lower surface of the second bonding part 122. The second conductive layer 322 may be electrically connected to the second bonding part 122. The second conductive layer 322 may provide a function of fixing the second bonding part 122 and the second frame 112.

The first conductive layer 321 and the second conductive layer 322 may comprise one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

The light emitting device package according to the embodiment may comprise a heat dissipation member 133.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 12.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, MN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may be set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As an example, the area of the first bonding part 121 may be provided to be smaller than that of the area of the upper region of the opening TH1, as described above with reference to FIG. 4. In addition, the area of the second bonding part 122 may be provided to be smaller than that of the area of the upper region of the opening TH1, as described above with reference to FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package according to the embodiment may comprise a molding member, as shown in FIG. 12. As an example, the molding member according to the embodiment may comprise a resin portion 135 and a molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package according to the embodiment may comprise the molding part 140, as shown in FIG. 12.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

According to an embodiment, the first pad 311 of the circuit board 310 and the first conductive layer 321 may be electrically connected. In addition, the second pad 312 of the circuit board 310 and the second conductive layer 322 may be electrically connected.

Meanwhile, according to the embodiment, a separate bonding layer may be additionally provided between the first pad 311 and the first conductive layer 321. In addition, a separate bonding layer may be additionally provided between the second pad 312 and the second conductive layer 322.

Further, according to another embodiment, the first conductive layer 321 and the second conductive layer 322 may be mounted on the circuit board 310 by eutectic bonding.

As described above, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

In addition, according to the light emitting device package according to the embodiment described above, the package body 110 comprises only the support member in which an upper surface is flat, and may not be provided with a reflective part disposed to be inclined.

As another representation, according to the light emitting device package according to the embodiment, the package body 110 may be provided with a structure in which the cavity C is provided. Further, the package body 110 may be provided with a structure in which an upper surface is flat without providing the cavity C.

As described with reference to FIGS. 1 to 12, light emitted between the first bonding part 121 and the second bonding part 122 may be incident to the heat dissipation member 133 disposed at the body 113 region. Light emitted in the lower direction of the light emitting device may be optically diffused by the heat dissipation member 133, and thus light extraction efficiency may be improved.

In addition, according to the embodiment, the sum of areas of the first and second bonding parts 121 and 122 may be provided at 10% or less based on the area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

For example, a width of the first bonding part 121 according to the major axis direction of the light emitting device may be several tens of micrometers. The width of the first bonding part 121 may be, for example, 70 to 90 micrometers. In addition, an area of the first bonding part 121 may be several thousands of square micrometers.

In addition, a width of the second bonding part 122 according to the major axis direction of the light emitting device may be several tens of micrometers. The width of the second bonding part 122 may be, for example, 70 to 90 micrometers. In addition, an area of the second bonding part 122 may be several thousands of square micrometers.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

Meanwhile, the light emitting device package according to the embodiment described above is described based on a case in which the first and second bonding parts 121 and 122 are in direct contact with the first and second conductive layers 321 and 322.

However, according to still another example of the light emitting device package according to the embodiment, another conductive component may be further disposed between the first and second bonding parts 121 and 122 and the first and second conductive layers 321 and 322.

Then, another example of the light emitting device package according to an embodiment of the present invention will be described with reference to FIG. 13.

In describing the light emitting device package according to the embodiment of with reference to FIG. 13, the description of the contents overlapping with the contents described with reference to FIGS. 1 to 12 may be omitted.

Figure 13:
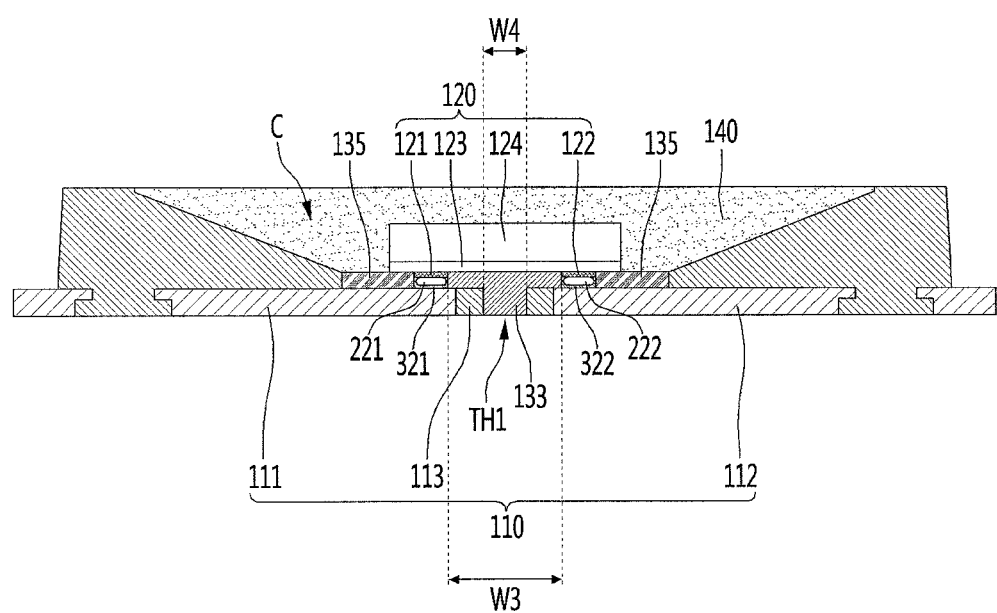
FIG. 13 is a view illustrating still another example of a light emitting device package according to an embodiment of the present invention.

The light emitting device package according to the embodiment may comprise a package body 110 and a light emitting device 120, as shown in FIG. 13.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 13. The first bonding part 121 and the second bonding part 122 may be disposed between the light emitting structure 123 and the body 113.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The light emitting device package according to the embodiment, as shown in FIG. 13, may comprise a first conductor 221 and a second conductor 222. In addition, the light emitting device package according to the embodiment may comprise a first conductive layer 321 and a second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be disposed on the first frame 111. The first conductor 221 may be disposed between the first bonding part 121 and the first conductive layer 321. The first conductor 221 may be electrically connected to the first bonding part 121 and the first conductive layer 321.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be disposed on the second frame 112. The second conductor 222 may be disposed between the second bonding part 122 and the second conductive layer 322. The second conductor 222 may be electrically connected to the second bonding part 122 and the second conductive layer 322.

According to the embodiment, the first conductive layer 321 may be disposed on a lower surface and side surface of the first conductor 221. The first conductive layer 321 may be disposed to be in direct contact with the lower surface and side surface of the first conductor 221.

As described above, according to the light emitting device package according to the embodiment, a contact area between the first conductive layer 321 and the first conductor 221 is increased, so that an electrical connection between the first conductive layer 321 and the first bonding part 121 may be more stably provided by the first conductor 221.

In addition, according to the embodiment, the second conductive layer 322 may be disposed at lower surface and side surface of the second conductor 222. The second conductive layer 322 may be disposed to be in direct contact with the lower surface and side surface of the second conductor 222.

As described above, according to the light emitting device package 200 according to the embodiment, a contact area between the second conductive layer 322 and the second conductor 222 is increased, so that an electrical connection between the second conductive layer 322 and the second bonding part 122 may be more stably provided by the second conductor 222.

As an example, the first and second conductors 221 and 222 may be stably bonded to the first and second bonding parts 121 and 122 via separate bonding materials, respectively. In addition, side surfaces and lower surfaces of the first and second conductors 221 and 222 may be in contact with the first and second conductive layers 321 and 322, respectively.

Therefore, an area in which the first and second conductive layers 321 and 322 are respectively in contact with the first and second conductors 221 and 222 may be further increased as compared with a case in which the first and second conductive layers 321 and 322 are directly contacted to the lower surfaces of the first and second bonding parts 121 and 122, respectively.

Accordingly, a power may be stably provided from the first and second conductive layers 321 and 322 to the first and second bonding parts 121 and 122 via the first and second conductors 221 and 222.

The first conductive layer 321 and the second conductive layer 322 may comprise at least one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof.

In addition, the first and second conductors 221 and 222 may comprise at least one material selected from the group consisting of Ag, Au, Pt, Sn, Al, etc. or an alloy thereof. However, the present invention is not limited thereto, and a material capable of securing a conductive function may be used for the first and second conductors 221 and 222.

In addition, the light emitting device package according to the embodiment may comprise a heat dissipation member 133.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 13.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be disposed to be in contact with a side surface of the first bonding part 121 and a side surface of the second bonding part 122.

The first bonding part 121 may comprise a first side surface close to the second bonding part 122 and a second side surface facing the first side surface. The second bonding part 122 may comprise a third side surface close to the first bonding part 121 and a fourth side surface facing the third side surface.

According to the embodiment, the heat dissipation member 133 may be disposed to be in contact with the first side surface of the first bonding part 121 and the third side surface of the second bonding part 122. As an example, the heat dissipation member 133 may be disposed to be in direct contact with the first side surface of the first bonding part 121 and the third side surface of the second bonding part 122.

In addition, the heat dissipation member 133 may be disposed between the light emitting device 120 and the package body 110. The heat dissipation member 133 may be disposed between the light emitting device 120 and the first frame 111. The heat dissipation member 133 may be disposed between the light emitting device 120 and the second frame 112. The heat dissipation member 133 may be provided to be surrounded by the body 113.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, AlN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

According to the light emitting device package according to the embodiment, the sum of the areas of the first and second bonding parts 121 and 122 may be set at 0.7% or more based on the area of the upper surface of the substrate 124 so that the first conductor 221 and the second conductor 222 can be stably arranged.

As an example, the area of the first bonding part 121 may be provided to be smaller than that of the area of the upper region of the opening TH1, as shown in FIG. 4. In addition, the area of the second bonding part 122 may be provided to be smaller than that of the area of the upper region of the opening TH1, as shown in FIG. 4.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package 200 according to the embodiment may comprise a molding member, as shown in FIG. 13. As an example, the molding member according to the embodiment may comprise a resin portion 135 and a molding part 140.

The molding member according to the embodiment may comprise at least one of the resin portion 135 and the molding part 140. First, in the following embodiments, it is described based on the case in which the molding member comprises both the resin portion 135 and the molding part 140.

However, according to another embodiment, the molding member may comprise only the resin portion 135, or may comprise only the molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package according to the embodiment may comprise the molding part 140, as shown in FIG. 13.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. As an example, the molding part 140 may be referred to as a wavelength converting molding member.

In addition, according to the embodiment, the molding part 140 may be disposed on the resin portion 135.

According to the embodiment, as described above, the first bonding part 121 may comprise the first side surface close to the second bonding part 122 and the second side surface facing the first side surface. The second bonding part 122 may comprise the third side surface close to the first bonding part 121 and the fourth side surface facing the third side surface.

As an example, the first side surface of the first bonding part 121 and the third side surface of the second bonding part 122 may be disposed to be in contact with the heat dissipation member 133. In addition, the second side surface of the first bonding part 121 and the fourth side surface of the second bonding part 122 may be disposed to be in contact with the molding members 135 and 140.

Meanwhile, as described above, according to another example of the light emitting device package according to the embodiment of the present invention, the resin portion 135 may not be provided separately, and the molding part 140 may be disposed to be in direct contact with the first frame 111 and the second frame 112. Further, the molding part 140 is not provided separately, and the resin portion 135 may be provided both at the periphery and the upper portion of the light emitting device 120.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Then, another example of the light emitting device package according to an embodiment of the present invention will be described with reference to FIG. 14.

In describing the tight emitting device package according to the embodiment of with reference to FIG. 14, the description of the contents overlapping with the contents described with reference to FIGS. 1 to 13 may be omitted.

Figure 14:
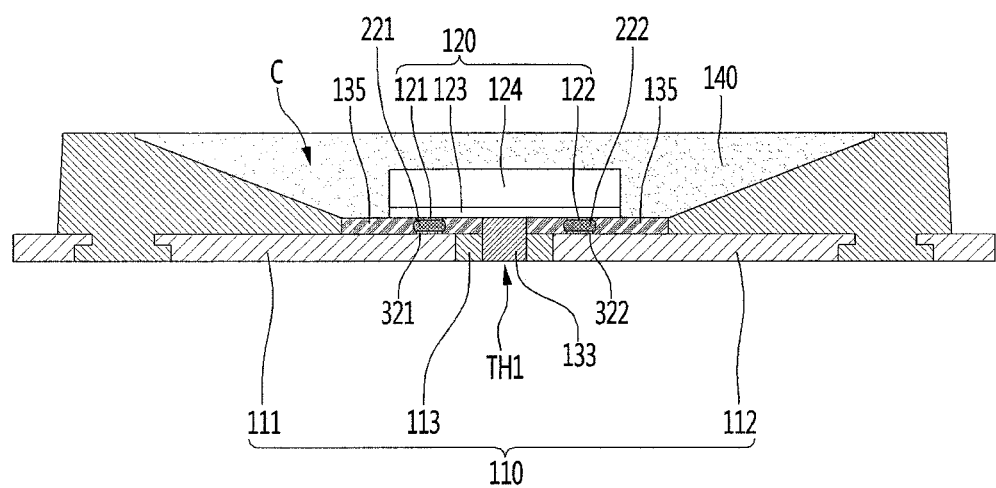
FIG. 14 is a view illustrating still another example of a light emitting device package according to an embodiment of the present invention.

The light emitting device package according to the embodiment may comprise a package body 110 and a light emitting device 120, as shown in FIG. 14.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

For example, the first frame 111 and the second frame 112 may be disposed to be spaced apart from each other at the body 113. For example, the first frame 111 and the second frame 112 may be disposed to be spaced apart from each other with the body 113 interposed therebetween.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124, as shown in FIG. 13. The first bonding part 121 and the second bonding part 122 may be disposed between the light emitting structure 123 and the body 113.

The light emitting device package according to the embodiment may comprise a first conductor 221 and a second conductor 222. In addition, the light emitting device package according to the embodiment may comprise a first conductive layer 321 and a second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be disposed on the first frame 111. The first conductor 221 may be disposed between the first bonding part 121 and the first conductive layer 321. The first conductor 221 may be electrically connected to the first bonding part 121 and the first conductive layer 321.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be disposed on the second frame 112. The second conductor 222 may be disposed between the second bonding part 122 and the second conductive layer 322. The second conductor 222 may be electrically connected to the second bonding part 122 and the second conductive layer 322.

The first conductive layer 321 and the second conductive layer 322 may comprise at least one material selected from the group consisting of Ag, Au, and Pt, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may be selected from at least one of the group consisting of a solder paste, a silver paste, or the like.

According to the embodiment, the first conductive layer 321 and the second conductive layer 322 may be referred to as a conductive adhesive. The first and second conductive layers 321 and 322 may fix the first and second bonding parts 121 and 122 to the first and second frames 111 and 112. In addition, the first and second conductive layers 321 and 322 may electrically connect the first and second bonding parts 121 and 122 to the first and second frames 111 and 112.

In addition, the first and second conductors 221 and 222 may comprise at least one material selected from the group consisting of Ag, Au, Pt, Sn, Al, etc. or an alloy thereof. However, the present invention is not limited thereto, and a material capable of securing a conductive function may be used for the first and second conductors 221 and 222.

According to the embodiment, an area of the lower surface of the first and second conductors 221 and 222 may be provided to be greater than that of the lower surface of the first and second bonding parts 121 and 122. Accordingly, an area in which the first and second conductive layers 321 and 322 are in direct contact with the first and second conductors 221 and 222 may be provided to be greater than that in which the first and second conductive layers 321 and 322 are in direct contact with the first and second bonding parts 121 and 122. Therefore, according to the light emitting device package according to the embodiment, as the first and second conductors 221 and 222 are provided, power supplied from the first and second frames 111 and 112 to the light emitting device 120 may be more stably provided.

In addition, the light emitting device package according to the embodiment may comprise a heat dissipation member 133.

The heat dissipation member 133 may be disposed between the package body 110 and the light emitting device 120. The heat dissipation member 133 may be disposed between an upper surface of the package body 110 and a lower surface of the light emitting device 120. The heat dissipation member 133 may be disposed between the upper surface of the body 113 and the lower surface of the light emitting device 120.

The heat dissipation member 133 may be disposed between the first frame 111 and the second frame 112. In addition, the lower surface of the body 113 and the lower surfaces of the first and second frames 111 and 112 may be disposed at the same plane.

The upper surface of the heat dissipation member 133 may be disposed to be in contact with the light emitting device 120 and to be extended in the first direction. The first direction may be defined as a direction from an upper surface of the light emitting device 120 toward a lower surface of the body 113.

According to the embodiment, a first distance from the upper surface of the light emitting device 120 to a lower surface of the first frame 111 may be provided to be equal to or greater than a second distance from the upper surface of the light emitting device 120 to a lower surface of the heat dissipation member 133.

In addition, the light emitting device package according to the embodiment may comprise an opening TH1, as shown in FIG. 14.

The opening TH1 may be provided at the body 113. The opening TH1 may be provided by passing through the body 113. The opening TH1 may be provided by passing through the upper surface and the lower surface of the body 113 in the first direction. The opening TH1 may be disposed under the light emitting device 120. The opening TH1 may be provided to be overlapped with the light emitting device 120 in the first direction.

As an example, the opening TH1 may be provided to be surrounded by the body 113. The opening TH1 may be provided to be surrounded by the body 113 when viewed from the upper direction of the light emitting device 120. The opening TH1 may be disposed at a central region of the body 113.

According to the embodiment, the heat dissipation member 133 may be disposed at the opening TH1. The heat dissipation member 133 may be disposed between the light emitting device 120 and the body 113. The heat dissipation member 133 may be disposed between the first bonding part 121 and the second bonding part 122. As an example, the heat dissipation member 133 may be provided to be surrounded by the resin portion 135 under the light emitting device 120.

The heat dissipation member 133 may provide a stable fixing force between the light emitting device 120 and the package body 110. The heat dissipation member 133 may provide a stable fixing force between the light emitting device 120 and the body 113. The heat dissipation member 133 may be disposed, to be in direct contact with the upper surface of the body 113, as an example. In addition, the heat dissipation member 133 may be disposed to be in direct contact with the lower surface of the light emitting device 120.

According to the embodiment, as described above, the first distance from the upper surface of the light emitting device 120 to the lower surface of the first frame 111 may be provided to be equal to or greater than the second distance from the upper surface of the light emitting device 120 to the lower surface of the heat dissipation member 133.

As an example, the heat dissipation member 133 may be disposed to be spaced apart from the lower surface of the opening TH1 in the upper direction at a predetermined distance. The upper region of the opening TH1 may be filled with the heat dissipation member 133 and the lower region of the opening TH1 may be provided as an empty space in which the heat dissipation member 133 is not filled.

As an example, the heat dissipation member 133 may comprise at least one of an epoxy-based material, a silicone-based material, and a hybrid material comprising an epoxy-based material and a silicone-based material. Further, as an example, when the heat dissipation member 133 comprises a reflective function, the heat dissipation member 133 may comprise a white silicone. In addition, the heat dissipation member 133 may comprise a material selected from the group comprising $Al_2O_3$, AlN, etc. having good thermal conductivity.

According to the embodiment, when the heat dissipation member 133 comprises a material having a good thermal conductivity, it is possible to stably fix the light emitting device 120 to the package body 110 and to effectively dissipate heat generated from the light emitting device 120. Accordingly, the light emitting device 120 may be stably fixed to the package body 110, and heat may be effectively dissipated, and thus light extraction efficiency of the light emitting device 120 may be improved.

In addition, the heat dissipation member 133 may provide a stable fixing force between the body 113 and the light emitting device 120, when the heat dissipation member 133 comprises a reflective material, and the heat dissipation member 133 may provide a light diffusion function between the light emitting device 120 and the body 113 with respect to light emitted to the lower surface of the light emitting device 120. When light is emitted from the light emitting device 120 to the lower surface of the light emitting device 120, the heat dissipation member 133 may improve light extraction efficiency of the light emitting device package by providing the light diffusion function.

According to the embodiment, the heat dissipation member 133 may reflect light emitted from the light emitting device 120. When the heat dissipation member 133 comprises the reflective function, the heat dissipation member 133 may be formed of a material comprising $TiO_2$, silicone, and the like.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As described above, as the area of the first and second bonding parts 121 and 122 is provided to be small, an amount of light transmitted to the lower surface of the light emitting device 120 may be increased. In addition, the heat dissipation member 133 having a good reflective characteristic and heat dissipation characteristic may be provided under the light emitting device 120. Therefore, the light emitted in a lower direction of the light emitting device 120 is reflected at the heat dissipation member 133, and is effectively emitted toward an upper direction of the light emitting device package 100, and thus light extraction efficiency may be improved.

In addition, the light emitting device package 200 according to the embodiment may comprise a molding member, as shown in FIG. 13. As an example, the molding member according to the embodiment may comprise a resin portion 135 and a molding part 140.

The molding member according to the embodiment may comprise at least one of the resin portion 135 and the molding part 140. First, in the following embodiments, it is described based on the case in which the molding member comprises both the resin portion 135 and the molding part 140.

However, according to another embodiment, the molding member may comprise only the resin portion 135, or may comprise only the molding part 140.

The resin portion 135 may be disposed between the first frame 111 and the light emitting device 120. The resin portion 135 may be disposed between the second frame 112 and the light emitting device 120. The resin portion 135 may be provided at the lower surface of the cavity C provided in the package body 110.

As an example, the resin portion 135 may be disposed under the light emitting device 120. The resin portion 135 may be referred to as a reflective resin portion. In addition, the resin portion 135 may be referred to as a reflective molding member.

The resin portion 135 may be disposed at the side surface of the first bonding part 121. In addition, the resin portion 135 may be disposed at the side surface of the second bonding part 122. The resin portion 135 may be disposed under the light emitting structure 123. The resin portion 135 may be disposed at the periphery of the heat dissipation member 133 under the light emitting device 120.

As an example, the resin portion 135 may comprise at least one of an epoxy-based material, a silicone-based material, and a hybrid material comprising an epoxy-based material and a silicone-based material. In addition, the resin portion 135 may be a reflector that reflects the light emitted from the light emitting device 120, as an example, a resin comprising a reflective material such as $TiO_2$, or may comprise white silicone.

The resin portion 135 may be disposed under the light emitting device 120 and may perform a sealing function. In addition, the resin portion 135 may improve an adhesion force between the light emitting device 120 and the first frame 111. The resin portion 135 may improve the adhesion force between the light emitting device 120 and the second frame 112.

The resin portion 135 may seal around the first bonding part 121 and the second bonding part 122. The resin portion 135 may prevent the first conductive layer 321 and the second conductive layer 322 from being separated from an area under the first bonding part 121 and an area under the second bonding part, and diffusing and moving in direction of the light emitting device 120.

When the first and second conductive layers 321 and 322 are diffused and moved in the outer side surface direction of the light emitting device 120, the first and second conductive layers 321 and 322 may be in contact with the active layer of the light emitting device 120, thereby causing a failure due to a short-circuit. Therefore, when the resin portion 135 is disposed, it is possible to prevent a short-circuit due to the first and second conductive layers 321 and 322 and the active layer, thereby improving reliability of the light emitting device package according to the embodiment.

In addition, when the resin portion 135 comprises a material having a reflective characteristic such as white silicone, the resin portion 135 may reflect light provided from the light emitting device 120 toward an upper direction of the package body 110, thereby improving light extraction efficiency of the light emitting device package 100.

In addition, the light emitting device package according to the embodiment may comprise the molding part 140, as shown in FIG. 14.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and providing wavelength converted light. As an example, the molding part 140 may comprise at least one selected from the group consisting of a phosphor, a quantum dot, and the like.

The molding part 140 may be disposed at the periphery of the light emitting device 120. In addition, according to the embodiment, the molding part 140 may be disposed on the resin portion 135.

In the light emitting device package according to the embodiment, power may be connected to the first bonding part 121 through the first conductive layer 321, and power may be connected to the second bonding part 122 through the second conductive layer 322.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a method of fabricating the light emitting device package according to the embodiment, the first bonding part and the second bonding part of the light emitting device according to the embodiment may be provided driving power through the first and second conductive layers disposed at the first and second frames. In addition, a melting point of the first and second conductive layers disposed at the first and second openings may be selected to have a higher value than that of a general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Figure 15:
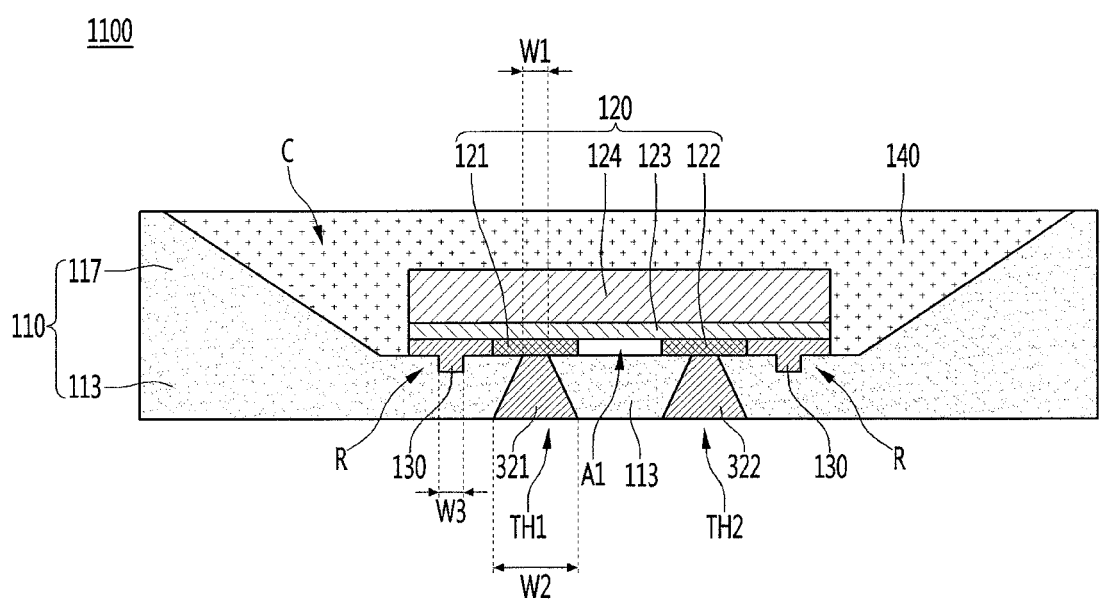
FIG. 15 is a view illustrating still another example of a light emitting device package according to an embodiment of the present invention.
Figure 16:
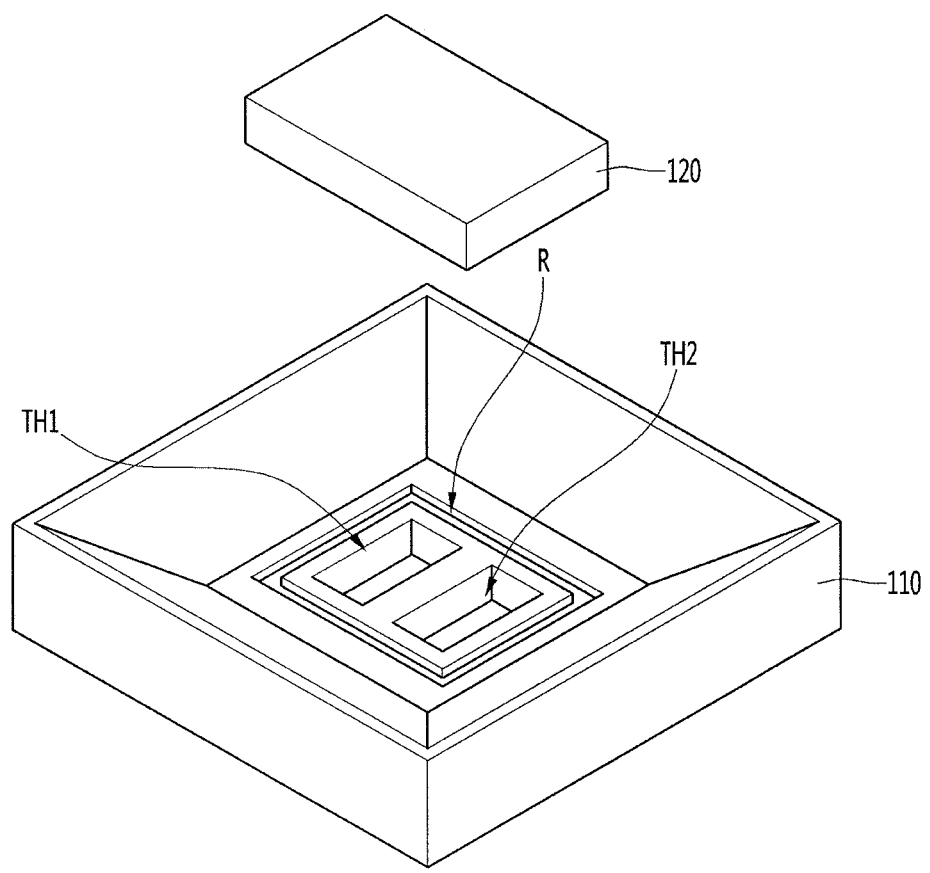
FIG. 16 is an exploded perspective view explaining a light emitting device package according to an embodiment of the present invention.
Figure 17:
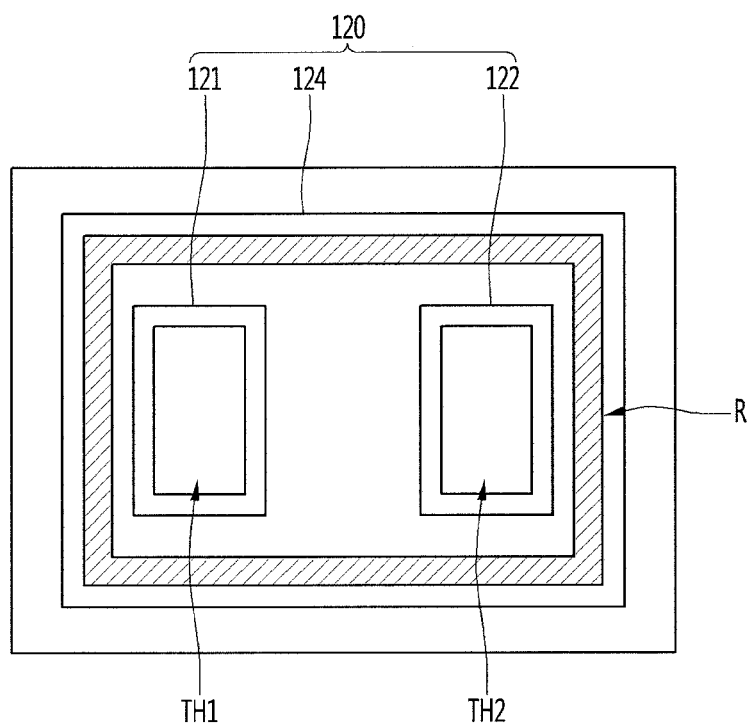
FIG. 17 is a view explaining an arrangement relationship of a package body, a recess, and openings of the light emitting device package according to an embodiment of the present invention.

Next, the light emitting device package according to an embodiment of the present invention will be described with reference to FIGS. 15 to 17. The light emitting device package 1100 according to the embodiment may comprise a package body 110 and a light emitting device 120, as shown in FIGS. 15 to 17.

The package body 110 may comprise a body 113 and a reflector 117. The reflector 117 may be disposed on the body 113. The reflector 117 may be disposed at a periphery of the upper surface of the body 113. The reflector 117 may provide a cavity C on the upper surface of the body 113.

In other words, the body 113 may be referred to as a lower body, and the reflector 117 may be referred to as an upper body. In addition, according to the embodiment, the package body 110 may not comprise the reflector 117 that provides the cavity, but may comprise only the body 113 that provides a flat upper surface.

The reflector 117 may reflect light emitted from the light emitting device 120 in an upper direction. The reflector 117 may be disposed to be inclined with respect to the upper surface of the body 113.

The package body 110 may comprise the cavity C. The cavity may comprise a bottom surface and a side surface inclined to the upper surface of the package body 110 from the bottom surface.

According to the embodiment, the package body 110 may be provided as a structure with the cavity C, or may be provided as a structure with a flat upper surface without the cavity C.

For example, the package body 110 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the package body 110 may comprise a high refractive index filler such as $TiO_2$ and $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124. The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting device 120 may be disposed on the package body 110. The light emitting device 120 may be disposed on the body 113. The light emitting device 120 may be disposed in the cavity C provided by reflector 117.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed between the light emitting structure 123 and the body 113. The second bonding part 122 may be disposed between the light emitting structure 123 and the body 113.

The first bonding part 121 and the second bonding part 122 may be formed in a single layer or multiple layers by using at least one material selected from the group consisting of Ti, Al, Sn, In, Ir, Ta, Pd, Co, Cr, Mg, Zn, Ni, Si, Ge, Ag, Ag alloy, Au, Hf, Pt, Ru, Rb, Sn, Cu, ZnO, IrOx, RuOx, NiO, RuOx/ITO, and Ni/IrOx/Au, Ni/IrOx/Au/ITO, or an alloy thereof.

Meanwhile, the light emitting device package 1100 according to the embodiment may comprise a first opening TH1 and a second opening TH2, as shown in FIGS. 15 to 17.

The package body 110 may comprise the first opening TH1 passing through the lower surface of the package body 110 from the bottom surface of the cavity C. The package body 110 may comprise the second opening TH2 passing through the lower surface of the package body 110 from the bottom surface of the cavity C.

The first opening TH1 may be provided at the body 113. The first opening TH1 may be provided by passing through the body 113. The first opening TH1 may be provided by passing through an upper surface and a lower surface of the body 113 in the first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the body 113 toward the lower surface thereof.

The second opening TH2 may be provided at the body 113. The second opening TH2 may be provided by passing through the body 113. The second opening TH2 may be provided by passing through an upper surface and a lower surface of the body 113 in the first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the body 113 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Further, the width W1 of the upper region of the first opening TH1 may be provided to be smaller than or equal to a width W2 of a lower region of the first opening TH1. Furthermore, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

A width between the first opening TH1 and the second opening TH2 in a lower surface region of the body 113 may be provided at several hundreds of micrometers. The width between the first opening TH1 and the second opening TH2 in the lower surface region of the body 113 may be provided at, as an example, 100 to 150 micrometers.

The width between the first opening TH1 and the second opening TH2 in the lower surface region of body 113 may be selected to be provided over a predetermined distance in order to prevent a short-circuit between bonding parts from occurring when the light emitting device package 1100 according to the embodiment is mounted on a circuit board, a submount, or the like later.

The light emitting device package 1100 according to the embodiment may comprise a recess R, as shown in FIGS. 15 to 17. The recess R may be provided to concave in a lower surface of the package body 110 from the bottom surface of the cavity C.

The recess R may be provided at the body 113. The recess R may be provided between the first opening TH1 and the reflector 117. In addition, the recess R may be provided between the second opening TH2 and the reflector 117. The recess R may be provided to concave from the upper surface of the body 113 toward the lower surface thereof. The recess R may be disposed under the light emitting device 120. As an example, the recess R may be provided under the light emitting device 120 in the closed loop shape.

The recess R may be disposed between the first bonding part 121 and the reflector 117 disposed to be adjacent to the first opening TH1 when viewed from the upper direction of the light emitting device 120. In addition, the recess R may be disposed between the second bonding part 122 and the reflector 117 disposed to be adjacent to the second opening TH2 when viewed from the upper direction of the light emitting device 120.

The recess R may be provided at the periphery of the first and second openings TH1 and TH2 in the closed loop shape.

A size of the light emitting device 120 may be provided to be greater than the closed loop area provided by the recess R when viewed from the upper direction of the light emitting device 120.

A closed loop formed by the recess R may be provided in an outline connecting four side surfaces of the light emitting device 120 when viewed from the upper direction of the light emitting device 120.

The light emitting device package 1100 according to the embodiment may comprise an adhesive 130, as shown in FIG. 15.

The adhesive 130 may be disposed at the recess R. The adhesive 130 may be disposed between the light emitting device 120 and the body 113. The adhesive 130 may be disposed between the first bonding part 121 and the reflector 117. The adhesive 130 may be disposed between the second bonding part 122 and the reflector 117. As an example, the adhesive 130 may be disposed to be in contact with a side surface of the first bonding part 121 and a side surface of the second bonding part 122.

The adhesive 130 may provide a stable fixing force between the light emitting device 120 and the body 113. The adhesive 130 may be disposed to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. In addition, the adhesive 130 may reflect light emitted from the light emitting device 120. When the adhesive 130 comprises a reflective function, the adhesive 130 may comprise a white silicone. When the adhesive 130 comprises the reflective function, the adhesive 130 may be formed of a material comprising as an example, $TiO_2$, silicone, and the like.

According to the embodiment, a depth of the recess R may be provided to be smaller than that of the first opening TH1 or that of the second opening TH2.

The depth of the recess R may be determined in consideration of the adhesion force of the adhesive 130. In addition, the depth T1 of the recess R may be determined by considering stable strength of the body 113 and/or not to occur a crack in the light emitting device package 1100 due to heat dissipated from the light emitting device 120.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth and the width W3 of the recess R may affect a forming position and fixing force of the adhesive 130. The depth and the width W3 of the recess R may be determined so that a fixing force may be sufficiently provided by the adhesive 130 disposed between the body 113 and the light emitting device 120.

As an example, the depth of the recess R may be provided at several tens of micrometers. The depth of the recess R may be provided at 40 to 60 micrometers.

In addition, the width W3 of the recess R may be provided at several hundreds of micrometers. The width W3 of the recess R may be provided at 140 to 160 micrometers. As an example, the width W3 of the recess R may be provided at 150 micrometers.

The first and second bonding parts 121 and 122 of the light emitting device 120 may be sealed from the outside by the adhesive 130 provided at the recess R. The adhesive 130 may be provided under the light emitting device 120 in the closed loop shape.

The adhesive 130 may be provided in the closed loop shape along the shape of the recess R as shown in FIGS. 16 and 17. The recess R may be provided as a closed loop having a rectangular shape or a closed loop having a circular or elliptical shape.

A depth of the first opening TH1 may be provided to correspond to a thickness of the body 113. The depth of the first opening TH1 may be provided at a thickness capable of maintaining a stable strength of the body 113.

As an example, the depth of the first opening TH1 may be provided at several hundreds of micrometers. The depth of the first opening TH1 may be provided at 180 to 220 micrometers. As an example, the depth of the first opening TH1 may be provided at 200 micrometers.

As an example, a thickness obtained by subtracting the depth of the recess R may from the depth of the first opening TH1 may be selected to be at least 100 micrometers or more. This is in consideration of a thickness of an injection process capable of providing crack free of the body 113.

According to the embodiment, the depth of the first opening TH1 may be provided at two to ten times of the depth of the recess R. As an example, when the depth of the first opening TH1 is provided at 200 micrometers, the depth of the recess R may be provided at 20 to 100 micrometers.

In addition, the light emitting device package 1100 according to the embodiment may comprise a molding part 140, as shown in FIG. 15.

The molding part 140 may be provided on the light emitting device 120. The molding part 140 may be disposed on the body 113. The molding part 140 may be disposed at the cavity C provided by the reflector 117.

The molding part 140 may comprise an insulating material. In addition, the molding part 140 may comprise a wavelength converting part configured to be incident light emitted from the light emitting device 120 and configured to provide wavelength converted light. As an example, the molding part 140 may comprise a phosphor, a quantum dot, and the like.

In addition, according to the embodiment, the light emitting structure 123 may be provided as a compound semiconductor. The light emitting structure 123 may be provided as, as an example, a Group II-VI or Group III-V compound semiconductor. For example, the light emitting structure 123 may be provided with at least two or more elements selected from aluminum (Al), gallium (Ga), indium (In), phosphorus (P), arsenic (As), and nitrogen (N).

The light emitting structure 123 may comprise a first conductivity type semiconductor layer, an active layer, and a second conductivity type semiconductor layer.

In addition, as shown in FIG. 15, the light emitting device package 1100 according to an embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. A width of the first conductive layer 321 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the body 113.

The second conductive layer 322 may be provided at the second opening TH2. The second conductive layer 322 may be disposed under the second bonding part 122. A width of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the body 113.

The first conductive layer 321 and the second conductive layer 322 may comprise at least one material selected from the group consisting of Ag, Au, and Pt, Sn, Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

According to the embodiment, the first conductive layer 321 may be electrically connected to the first bonding part 121, and the second conductive layer 322 may be electrically connected to the second bonding part 122. As an example, external power may be supplied to the first conductive layer 321 and the second conductive layer 322, and thus, the light emitting device 120 may be driven.

Meanwhile, according to the light emitting device package 1100 according to the embodiment, the adhesive 130 provided at the recess R may be provided between the lower surface of the light emitting device 120 and the upper surface of the package body 110 as shown in FIGS. 15 to 17. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package 1100 according to the embodiment, it is possible to prevent the first and second conductive layers 321 and 322 from moving to the side surface of the light emitting device 120, and to prevent the light emitting device 120 from being shorted electrically, thereby improving light extraction efficiency.

According to an embodiment of the present invention, the adhesive 130 provided at the recess R may be moved along the lower surface of the light emitting device 120 to the first region Al located under the light emitting device 120, and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Then, a method of fabricating a light emitting device package according to an embodiment of the present invention will be described with reference to FIGS. 18 to 21.

In describing the method of fabricating the light emitting device package according to the embodiment of the present invention with reference to FIGS. 18 to 21, the description of the contents overlapping with the contents described with reference to FIGS. 1 to 17 may be omitted.

Figure 18:
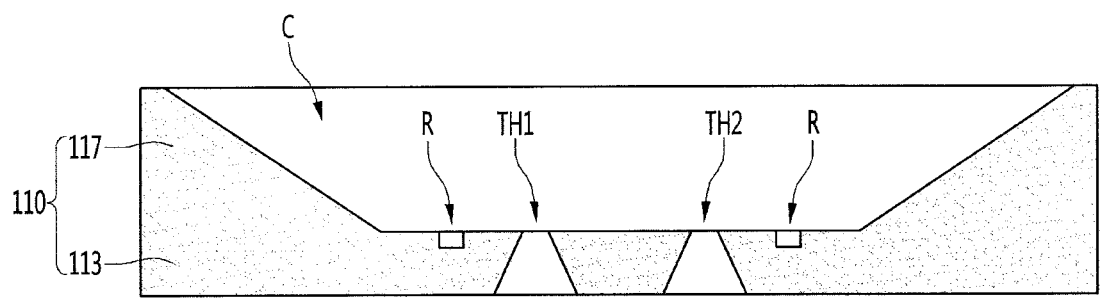
FIGS. 18 to 21 are views explaining a method of fabricating a light emitting device package according to an embodiment of the present invention.

First, according to the method of fabricating the light emitting device package according to the embodiment of the present invention, as shown in FIG. 18, a package body 110 may be provided.

The package body 110 may comprise a body 113 and a reflector 117. The package body 110 may comprise a first opening TH1 and a second opening TH2. In addition, the package body 110 may comprise a recess R.

The first opening TH1 may be provided at the body 113. The first opening TH1 may be provided by passing through the body 113. The first opening TH1 may be provided by passing through an upper surface and a lower surface of the body 113 in the first direction.

The second opening TH2 may be provided at the body 113. The second opening TH2 may be provided by passing through the body 113. The second opening TH2 may be provided by passing through an upper surface and a lower surface of the body 113 in the first direction.

The first opening TH1 and the second opening TH2 may be disposed to be spaced apart from each other.

The recess R may be provided at the body 113. The recess R may be provided between the first opening TH1 and the reflector 117. In addition, the recess R may be provided between the second opening TH2 and the reflector 117. The recess R may be provided to concave from the upper surface of the body 113 toward the lower surface thereof. The recess R may be disposed under the light emitting device 120. As an example, the recess R may be provided under the light emitting device 120 in the closed loop shape.

The recess R may be disposed between the first bonding part 121 and the reflector 117. The recess R may be disposed between the second bonding part 122 and the reflector 117.

Figure 19:
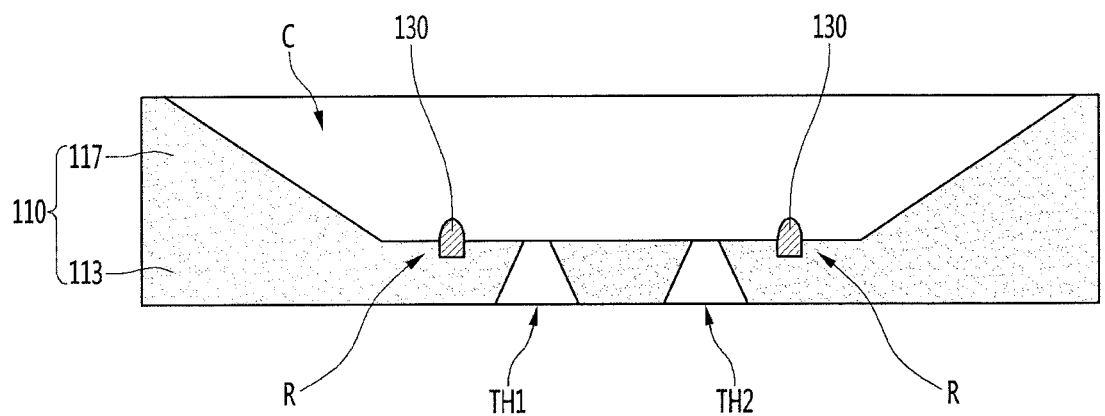

Next, in the method of fabricating the light emitting device package according to the embodiment, an adhesive 130 may be provided at the recess R as shown in FIG. 19.

The adhesive 130 may be provided at a recess region via a dotting method or the like. For example, the adhesive 130 may be provided at a predetermined amount to a region in which the recess R is formed, and may be provided to overflow the recess R.

Figure 20:
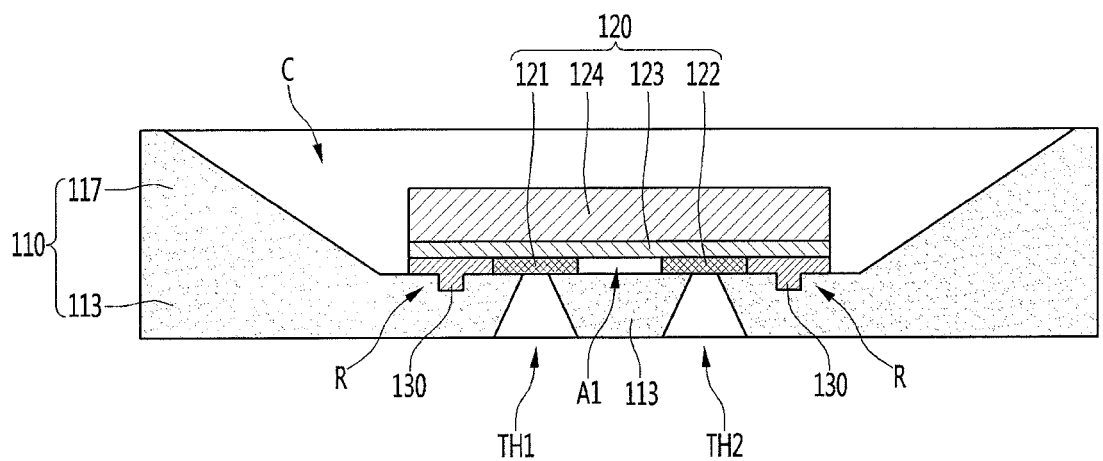

In addition, according to the method of fabricating the light emitting device package according to the embodiment, the light emitting device 120 may be provided on the body 113, as shown in FIG. 20.

According to the embodiment, in the process of disposing the light emitting device 120 on the body 113, the recess R may also be used to function as a kind of align key.

The light emitting device 120 may be fixed at the body 113 by the adhesive 130. A part of the adhesive 130 provided at the recess R may be moved in a direction of the first bonding part 121 and the second bonding part 122 and may be cured. Accordingly, the adhesive 130 may be provided at a wide region between the lower surface of the light emitting device 120 and the upper surface of the body 113, and the fixing force between the light emitting device 120 and the body 113 may be improved.

According to the embodiment, the first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the body 113 toward the lower surface thereof.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the body 113 toward the lower surface thereof.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

Figure 21:
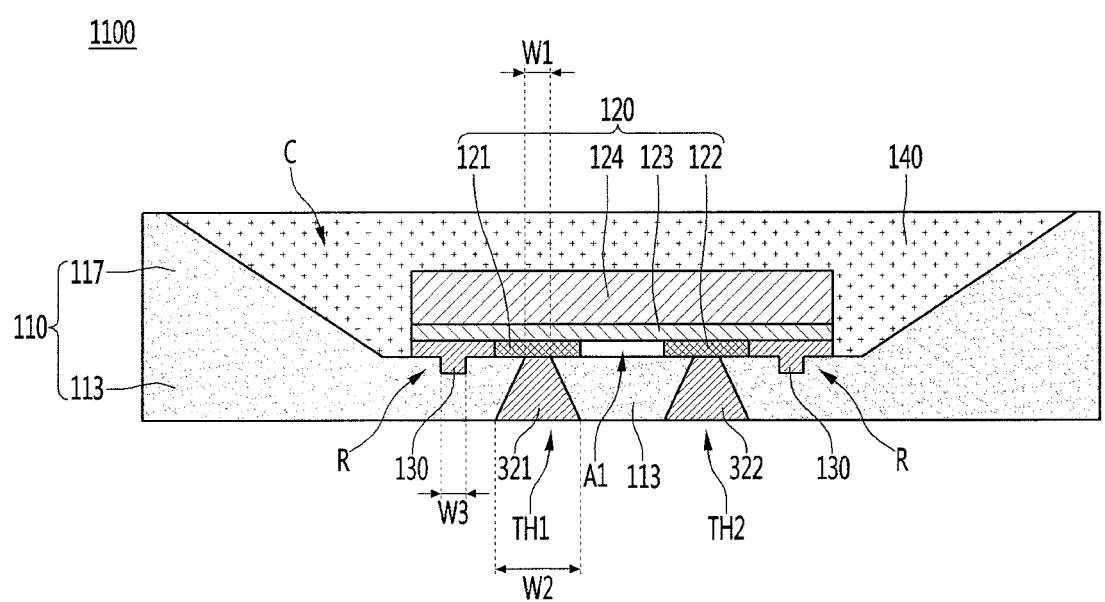

Next, according to the method of fabricating the light emitting device package according to the embodiment, as shown in FIG. 21, a molding part 140 may be provided on the light emitting device 120 and first and second conductive layers 321 and 322 may be provided at the first and second openings TH1 and TH2.

The first conductive layer 321 may be provided at the first opening TH1. The first conductive layer 321 may be disposed under the first bonding part 121. A width of the first conductive layer 321 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the body 113.

The second conductive layer 322 may be provided at the second opening TH2. The second conductive layer 322 may be disposed under the second bonding part 122. A width of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the body 113.

The first conductive layer 321 and the second conductive layer 322 may comprise at least one material selected from the group consisting of Ag, Au, and Pt, Sn, and Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package 1100 according to the embodiment, it is possible to prevent the first and second conductive layers 321 and 322 from moving to the side surface of the light emitting device 120, and to prevent the light emitting device 120 from being shorted electrically, thereby improving light extraction efficiency.

In addition, according to the embodiment of the present invention, the adhesive 130 provided at the recess R may be moved along the lower surface of the light emitting device 120 to the first region Al located under the light emitting device 120 and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the first and second conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Meanwhile, according to the embodiment, the first and second conductive layers 321 and 322 may be formed after the molding part 140 is formed. In addition, the molding part 140 may be formed after the first and second conductive layers 321 and 322 are formed.

In the light emitting device package 1100 according to the embodiment, the conventional lead frame is not used in forming the package body 110.

In the case of the light emitting device package to which the conventional lead frame is applied, although a process of forming a lead frame is additionally required, according to the method of fabricating a light emitting device package according to the embodiment of the present invention, a process of forming a lead frame is not required. Accordingly, according to the method of fabricating a light emitting device package according to the embodiment of the present invention, not only the process time may be shortened but also the material may be reduced.

Further, in the case of the light emitting device package to which the conventional lead frame is applied, although a silver plating process should be added to prevent deterioration of the lead frame, according to the method of fabricating a light emitting device package according to the embodiment of the present invention, since a lead frame is not required, an additional process such as silver plating may not be required. As described above, according to the method of fabricating a light emitting device package according to the embodiment of the present invention, a fabricating cost may be reduced and fabricating yield may be improved.

In the light emitting device package 1100 according to the embodiment, power may be connected to the first bonding part 121 through the first conductive layer 321 provided at the first opening TH1, and power may be connected to the second bonding part 122 through the second conductive layer 322 provided at the second opening TH2.

Accordingly, the light emitting device 120 may be driven by the driving power supplied through the first bonding part 121 and the second bonding part 122. In addition, the light emitted from the light emitting device 120 may be provided in the upper direction of the package body 110.

Meanwhile, the light emitting device package according to an embodiment described above may be supplied and mounted on a submount, a circuit board, or the like.

Next, another example of the light emitting device package according to an embodiment of the present invention will be described with reference to FIG. 22.

Figure 22:
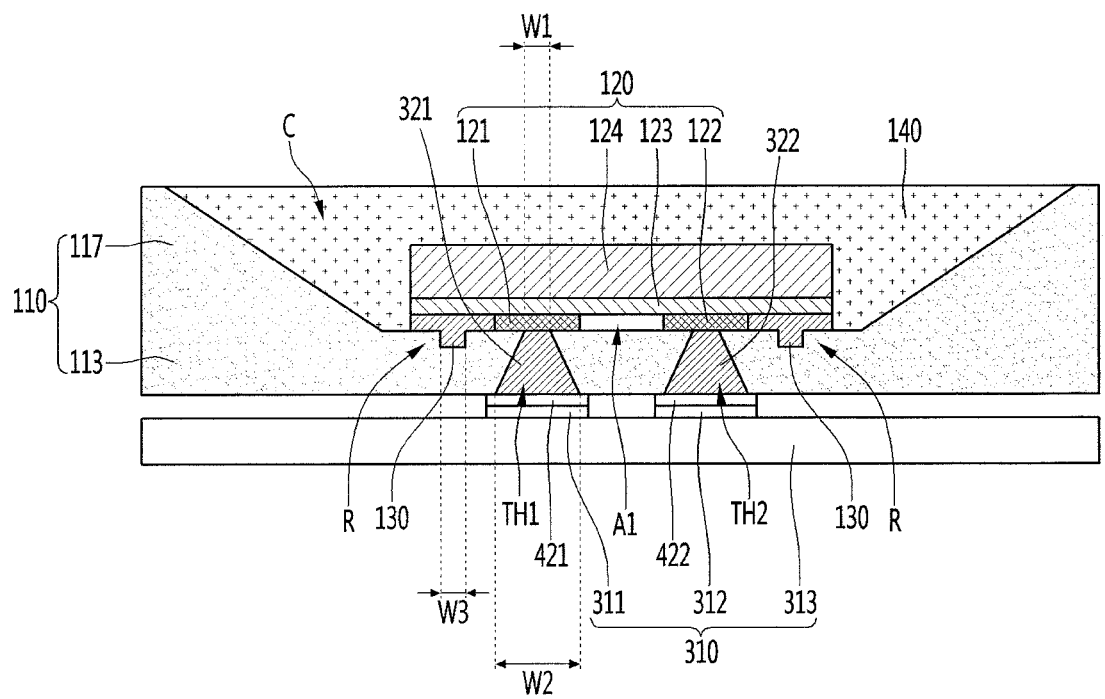
FIG. 22 is a view illustrating still another example of a light emitting device package according to an embodiment of the present invention.

The light emitting device package according to the embodiment of the present invention shown in FIG. 22 is an example in which the light emitting device package 1100 described with reference to FIGS. 15 to 21 is mounted on a circuit board 310 and supplied. For example, the light emitting device package 1100 mounted on the circuit board 310 may be used in a lighting apparatus.

In describing the manufacturing method of the light emitting device package according to the embodiment of the present invention with reference to FIG. 22, the description overlapping with the contents described with reference to FIGS. 1 to 21 may be omitted.

The light emitting device package according to the embodiment may comprise a circuit board 310, a package body 110, and a light emitting device 120, as shown in FIG. 22.

The circuit board 310 may comprise a first pad 311, a second pad 312, and a support substrate 313. The support substrate 313 may be provided with a power supply circuit configured to control driving of the light emitting device 120.

The package body 110 may be disposed on the circuit board 310. The first pad 311 and the first pad electrode 121 may be electrically connected to each other. The second pad 312 and the second pad electrode 122 may be electrically connected to each other.

The first pad 311 and the second pad 312 may comprise a conductive material. For example, the first pad 311 and the second pad 312 may comprise one material selected from the group consisting of Ti, Cu, Ni, Au, Cr, Ta, Pt, Sn, Ag, P, Fe, Sn, Zn, and Al or an alloy thereof. The first pad 311 and the second pad 312 may be provided as a single layer or multiple layers.

The package body 110 may comprise a body 113 and a reflector 117.

The package body 110 may comprise a first opening TH1 and a second opening TH2 passing through from the upper surface to the lower surface in the first direction. The first opening TH1 and second opening TH2 may be provided by passing through from an upper surface of the body 113 to a lower surface thereof in the first direction.

The light emitting device 120 may comprise a first bonding part 121, a second bonding part 122, and a light emitting structure 123.

The light emitting device 120 may be disposed on the package body 110. The light emitting device 120 may be disposed on the body 113. The light emitting device 120 may be disposed in the cavity C provided by the reflector 117.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other under the lower surface of the light emitting device 120.

The first bonding part 121 may be disposed between the light emitting structure 123 and the body 113. The second bonding part 122 may be disposed between the light emitting structure 123 and the body 113.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the body 113 toward the lower surface thereof.

The first opening TH1 may be provided to be overlapped with the first pad 311. The first bonding part 121 and the first pad 311 may be provided to be overlapped with each other in a vertical direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the body 113 toward the lower surface thereof.

The second opening TH2 may be provided to be overlapped with the second pad 312. The second bonding part 122 and the second pad 312 may be provided to be overlapped with each other in a vertical direction.

The first opening TH1 and the second opening TH2 may be disposed to be spaced apart from each other. The first opening TH1 and the second opening TH2 may be disposed to be spaced apart from each other under the lower surface of the light emitting device 120.

The light emitting device package according to the embodiment may comprise a first conductive layer 321 and a second conductive layer 322, as shown in FIG. 22.

The first conductive layer 321 may be disposed at the first opening TH1. The first conductive layer 321 may be disposed to be in direct contact at the lower surface of the first bonding part 121. The first conductive layer 321 may be provided to be overlapped with the first bonding part 121 in a vertical direction.

The upper surface of the first conductive layer 321 may be disposed at the same plane as the upper surface of the body 113. The lower surface of the first conductive layer 321 may be provided at the same plane as the lower surface of the body 113.

The second conductive layer 322 may be disposed at the second opening TH2. The second conductive layer 322 may be disposed to be in direct contact at the lower surface of the second bonding part 122. The second conductive layer 322 may be provided to be overlapped with the second bonding part 122 in a vertical direction.

The upper surface of the second conductive layer 322 may be disposed at the same plane as the upper surface of the body 113. The lower surface of the second conductive layer 322 may be provided at the same plane as the lower surface of the body 113.

As an example, the first conductive layer 321 and the second conductive layer 322 may comprise at least one material selected from the group consisting of Ag, Au, Pt, Sn, and Cu, etc. or an alloy thereof.

The light emitting device package according to the embodiment, as shown in FIG. 22, may comprise a first bonding layer 421 and a second bonding layer 422.

The first bonding layer 421 may be electrically connected to the first bonding part 121 in the process in which the package body 110 is mounted on the circuit board 310. The second bonding layer 422 may be electrically connected to the second bonding part 122 in the process in which the package body 110 is mounted at the circuit board 310.

The first and second bonding layers 421 and 422 may be formed of at least one metal selected from the group consisting of Ti, Cu, Ni, Au, Cr, Ta, Pt, Sn, Ag, and P, and a selective alloy thereof.

According to an embodiment, the first pad 311 and the first conductive layer 321 of the circuit board 310 may be electrically connected each other by the first bonding layer 421. In addition, the second pad 312 and the second conductive layer 322 of the circuit board 310 may be electrically connected each other by the second bonding layer 422.

Meanwhile, according to the embodiment, the first conductive layer 321 and the second conductive layer 322 may be mounted on the circuit board 310 by eutectic bonding. Further, according to the embodiment, the first and second bonding layers 421 and 422 may not provided, and the first and second conductive layers 321 and 322 may be electrically connected to the first and second pads 311 and 312, respectively.

The light emitting device package according to the embodiment may comprise a recess R, as shown in FIG. 22.

The recess R may be provided at the body 113. The recess R may be provided between the first opening TH1 and the reflector 117. In addition, the recess R may be provided between the second opening TH2 and the reflector 117. The recess R may be provided to concave from the upper surface of the body 113 toward the lower surface thereof. The recess R may be disposed under the light emitting device 120. As an example, the recess R may be provided under the light emitting device 120 in the closed loop shape.

The recess R may be disposed between the first bonding part 121 and the reflector 117. The recess R may be disposed between the second bonding part 122 and the reflector 117.

The light emitting device package according to the embodiment may comprise an adhesive 130, as shown in FIG. 22.

The adhesive 130 may be disposed at the recess R. The adhesive 130 may be disposed between the light emitting device 120 and the body 113. The adhesive 130 may be disposed between the first bonding part 121 and the reflector 117. The adhesive 130 may be disposed between the second bonding part 122 and the reflector 117. As an example, the adhesive 130 may be disposed to be in contact with a side surface of the first bonding part 121 and a side surface of the second bonding part 122.

The adhesive 130 may provide a stable fixing force between the light emitting device 120 and the body 113. The adhesive 130 may be disposed to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. In addition, the adhesive 130 may reflect light emitted from the light emitting device 120. When the adhesive 130 comprises a reflective function, the adhesive 130 may comprise a white silicone. When the adhesive 130 comprises the reflective function, the adhesive 130 may be formed of a material comprising as an example, $TiO_2$, silicone, and the like.

According to the embodiment, a depth of the recess R may be provided to be smaller than that of the first opening TH1 or that of the second opening TH2.

The depth of the recess R may be determined in consideration of the adhesion force of the adhesive 130. In addition, the depth T1 of the recess R may be determined by considering stable strength of the body 113 and/or not to occur a crack in the light emitting device package 1100 due to heat dissipated from the light emitting device 120.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth and the width W3 of the recess R may affect a forming position and fixing force of the adhesive 130. The depth and the width W3 of the recess R may be determined so that a fixing force may be sufficiently provided by the adhesive 130 disposed between the body 113 and the light emitting device 120.

As an example, the depth of the recess R may be provided at several tens of micrometers. The depth of the recess R may be provided at 40 to 60 micrometers.

In addition, the width W3 of the recess R may be provided at several hundreds of micrometers. The width W3 of the recess R may be provided at 140 to 160 micrometers. As an example, the width W3 of the recess R may be provided at 150 micrometers.

The first and second bonding parts 121 and 122 of the light emitting device 120 may be sealed from the outside by the adhesive 130 provided at the recess R. The adhesive 130 may be provided under the light emitting device 120 in the closed loop shape. The adhesive 130 may be provided in the closed loop shape along the shape of the recess R as shown in FIGS. 16 and 17. The recess R may be provided as a closed loop having a rectangular shape or a closed loop having a circular or elliptical shape.

A depth of the first opening TH1 may be provided to correspond to a thickness of the body 113. The depth of the first opening TH1 may be provided at a thickness capable of maintaining a stable strength of the body 113.

As an example, the depth of the first opening TH1 may be provided at several hundreds of micrometers. The depth of the first opening TH1 may be provided at 180 to 220 micrometers. As an example, the depth of the first opening TH1 may be provided at 200 micrometers.

As an example, a thickness obtained by subtracting the depth of the recess R may from the depth of the first opening TH1 may be selected to be at least 100 micrometers or more. This is in consideration of a thickness of an injection process capable of providing crack free of the body 113.

According to the embodiment, the depth of the first opening TH1 may be provided at two to ten times of the depth of the recess R. As an example, when the depth of the first opening TH1 is provided at 200 micrometers, the depth of the recess R may be provided at 20 to 100 micrometers.

In addition, the light emitting device package according to the embodiment may comprise a molding part 140, as shown in FIG. 22.

The molding part 140 may be provided on the light emitting device 120. The molding part 140 may be disposed on the body 113. The molding part 140 may be disposed at the cavity C provided by the reflector 117.

In the light emitting device package according to the embodiment, the conventional lead frame is not used in forming the package body 110, as described above with reference to FIG. 22.

In the case of the light emitting device package to which the conventional lead frame is applied, although a process of forming a lead frame is additionally required, according to the method of fabricating a light emitting device package according to the embodiment of the present invention, a process of forming a lead frame is not required. Accordingly, according to the method of fabricating a light emitting device package according to the embodiment of the present invention, not only the process time may be shortened but also the material may be reduced.

Further, in the case of the light emitting device package to which the conventional lead frame is applied, although a silver plating process should be added to prevent deterioration of the lead frame, according to the light emitting device package according to the embodiment of the present invention, since a lead frame is not required, an additional process such as silver plating may be omitted. Therefore, the embodiments of the light emitting device package may solve the problem of discoloration of materials such as silver plating, and a manufacturing cost may be reduced by omitting the process. Therefore, according to the method of fabricating a light emitting device package according to the embodiment of the present invention, a manufacturing cost may be reduced, and a manufacturing yield and reliability of the product may be improved.

Meanwhile, according to the light emitting device package 1100 according to the embodiment, the adhesive 130 provided at the recess R may be provided between the lower surface of the light emitting device 120 and the upper surface of the package body 110. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package 1100 according to the embodiment, it is possible to prevent the first and second conductive layers 321 and 322 from moving to the side surface of the light emitting device 120, and to prevent the light emitting device 120 from being shorted electrically, thereby improving light extraction efficiency.

According to an embodiment of the present invention, the adhesive 130 provided at the recess R may be moved along the lower surface of the light emitting device 120 to the first region Al located under the light emitting device 120, and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region A1 through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Figure 23:
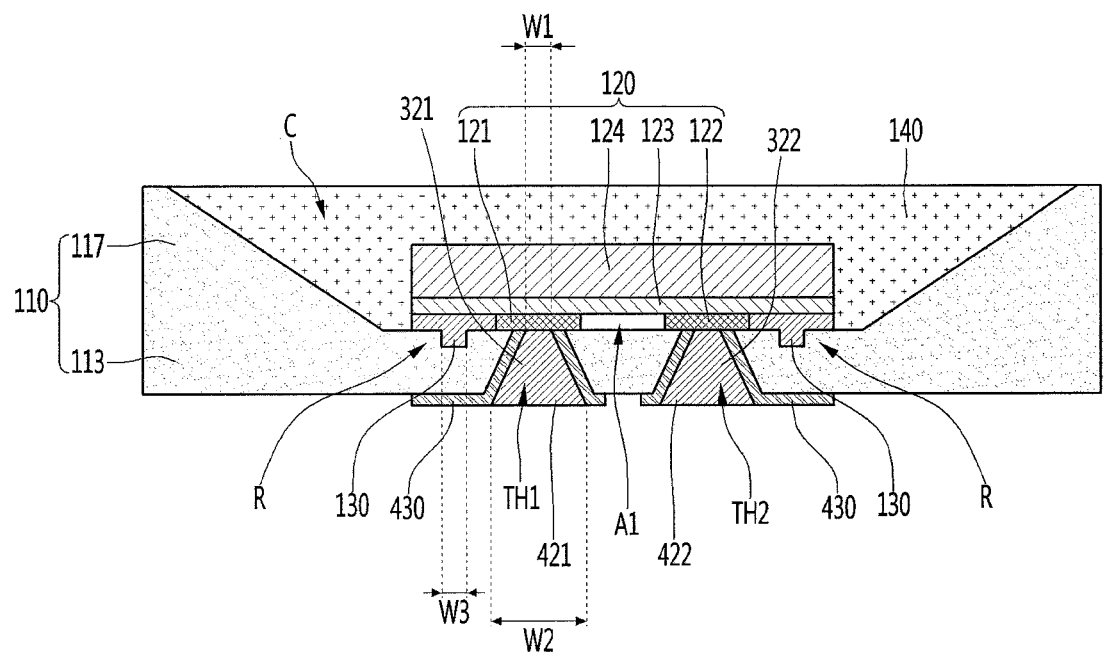
FIG. 23 is a view illustrating still another example of a light emitting device package according to an embodiment of the present invention.

Meanwhile, FIG. 23 is a view illustrating still another example of a light emitting device package according to an embodiment of the present invention. As shown in FIG. 23, the light emitting device package according to the embodiment may further comprise a metal layer 430 in compared to the light emitting device package described with reference to FIGS. 15 to 22.

The metal layer 430 may be provided at the first opening TH1 and the second opening TH2. The metal layer 430 may be provided at a sidewall of the package body 110 providing the first opening TH1 and a sidewall of the package body 110 providing the second opening TH2.

The metal layer 430 may be disposed between the package body 110 providing the first opening TH1 and the first conductive layer 321. In addition, the metal layer 430 may be disposed between the package body 110 providing the second opening TH2 and the second conductive layer 322.

In addition, according to the embodiment, the metal layer 430 may also be provided at the lower surface of the package body 110 adjacent to the first and second openings TH1 and TH2.

The metal layer 430 may be formed of a material having good adhesive properties to the package body 110. In addition, the metal layer 430 may be formed of a material having good adhesive properties to the first and second conductive layers 321 and 322.

Accordingly, the first and second conductive layers 321 and 322 may be stably provided in the first and second openings TH1 and TH2. According to the embodiment, even when an adhesion force between the first and second conductive layers 321 and 322 and the package body 110 is insufficient, the first and second conductive layers 321 and 322 may be stably provided in the first and second openings TH1 and TH2 by the metal layer 430.

Meanwhile, in the case of the light emitting device package according to the embodiment described above, the light emitting device package is explained based on the case in which one opening is provided under each bonding part.

However, according to a light emitting device package according to another embodiment, a plurality of openings may be provided under each opening. Further, the plurality of openings may be provided as openings having different widths.

In addition, a shape of the opening according to the embodiment may be provided in various shapes.

For example, the opening according to the embodiment may be provided with the same width from an upper region to a lower region thereof.

In addition, the opening according to the embodiment may be provided in a shape of multi stepped structure. As an example, the openings may be provided in a shape having a different inclination angle of a two stepped structure. Further, the openings may be provided in a shape having a different inclination angle of a three or more stepped structure.

Further, the opening may be provided in a shape in which the width changes as toward the lower region from the upper region. As an example, the opening may be provided in a shape having a curvature as toward the lower region from the upper region.

In addition, according to the light emitting device package according to the embodiment, the package body 110 comprises only a body 113 and may be provided so as not to comprise the reflector 117 disposed on the body 113.

Next, another example of the light emitting device package according to an embodiment of the present invention will be described with reference to FIGS. 24 and 25.

In describing the light emitting device package according to the embodiment of the present invention with reference to FIGS. 24 and 25, the description overlapping with the contents described with reference to FIGS. 1 to 23 may be omitted.

Figure 24:
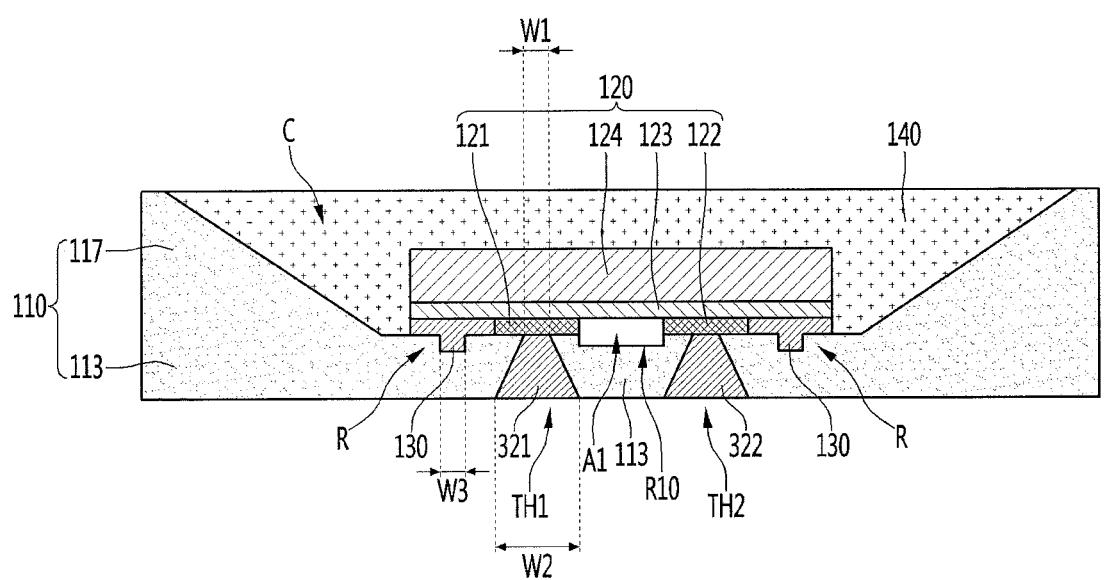
FIG. 24 is a view illustrating still another example of a light emitting device package according to an embodiment of the present invention.
Figure 25:
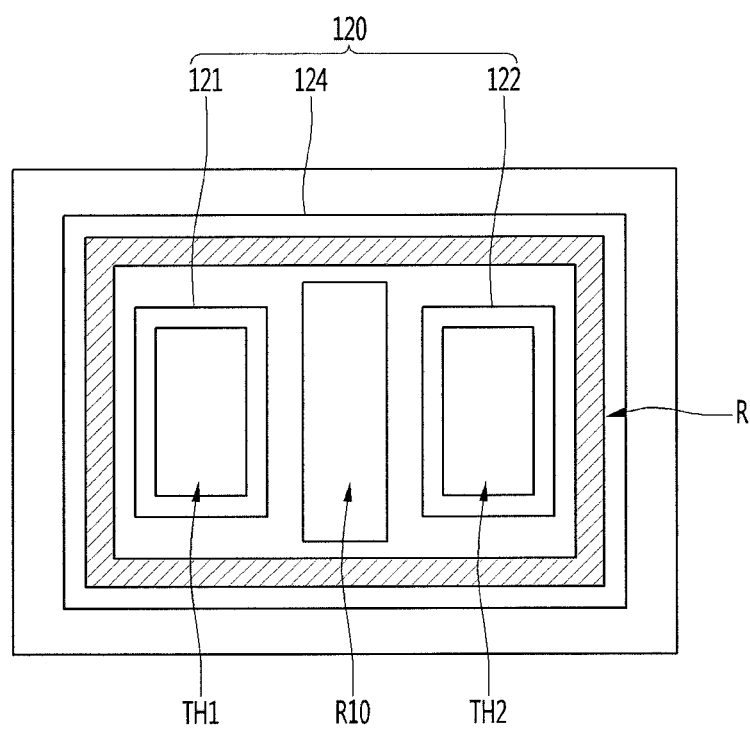
FIG. 25 is a view explaining an arrangement relationship of the package body, the recess, the opening, and the upper recess of the light emitting device package shown in FIG. 24.

The semiconductor device package according to the embodiment, as shown in FIGS. 24 and 25, may further comprise an upper recess R10 as compared to the semiconductor device package described with reference to FIGS. 15 to 23.

The upper recess R10 may be provided at an upper surface of the body 113. The upper recess R10 may be provided at the first region Al located under the lower surface of the light emitting device 120. The upper recess R10 may be provided to concave in a first direction from the upper surface of the body 113 toward the lower surface thereof.

The recess R10 may be disposed under the light emitting device 120 and may be provided between the first bonding part 121 and the second bonding part 122. The upper recess R10 may be provided to be extended under the light emitting device 120 in a minor axis direction of the light emitting device 120.

As described with reference to FIGS. 15 to 23, when the amount of the adhesive 130 provided to the recess R is insufficient, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

In addition, when the light emitting device package according to the embodiment comprises the upper recess R10, the upper recess R10 may provide a function that further restricts a diffusion and movement of the first and second conductive layers 321 and 322 in the first region A1.

As the upper recess R10 is provided, a kind of trap effect is generated in the upper recess R10 even when a part of the first and second conductive layers 321 and 322 is diffused to the upper portion of the body 113, the flow of the first and second conductive layers 321 and 322 is restricted. A phenomenon occurs in which the first conductive layer 321 diffused through the first opening TH1 may not be moved in the lower direction of the upper recess R10 from a boundary surface of the concave region of the upper recess R10. In addition, a phenomenon occurs in which the second conductive layer 322 diffused through the second opening TH2 may not be moved in the lower direction of the upper recess R10 from a boundary surface of the concave region of the upper recess R10. This is interpreted as the flow of the first and second conductive layers 321 and 322 is restricted at a boundary surface of the concave region of the upper recess R10 due to an influence of surface tension and the like.

Accordingly, since the distance by which the first and second conductive layers 321 and 322 are moved at the upper surface of the body 113 may be stably and reliably controlled, the first conductive layer 321 and the second conductive layer 322 may be prevented from being electrically short-circuited in the first region Al.

Next, another example of the light emitting device package according to an embodiment of the present invention will be described with reference to FIG. 26.

In describing the light emitting device package according to the embodiment of the present invention with reference to FIG. 26, the description overlapping with the contents described with reference to FIGS. 1 to 25 may be omitted.

Figure 26:
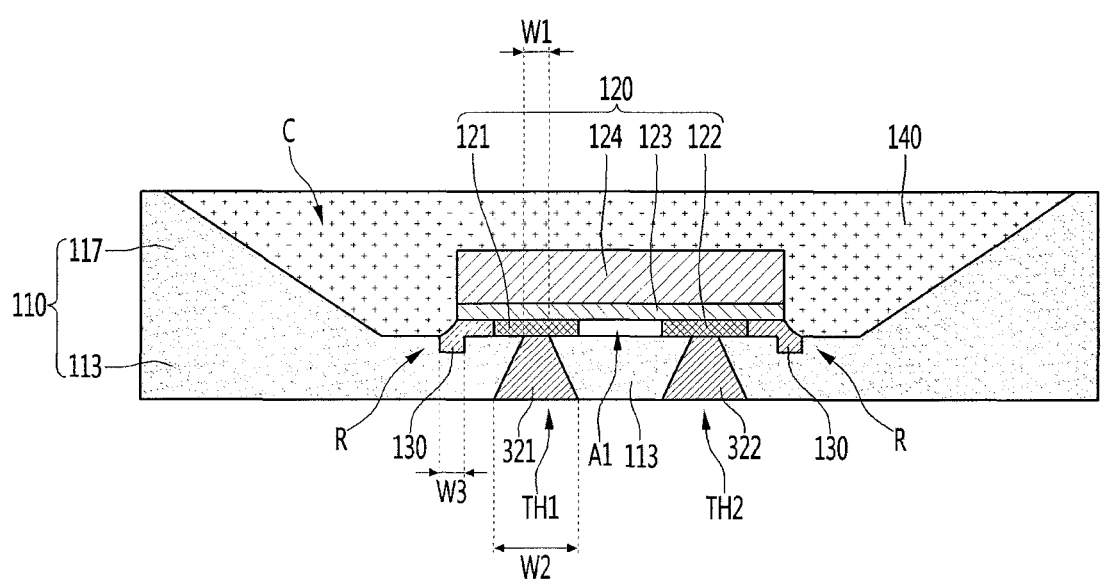
FIG. 26 is a view illustrating still another example of a light emitting device package according to an embodiment of the present invention.

As shown in FIG. 26, in the light emitting device package according to the embodiment, a size of the light emitting device 120 may be smaller than that of the semiconductor device package described with reference to FIGS. 15 to 25.

As described with reference to FIGS. 15 to 25, the lower surface of the light emitting device 120 and the upper surface of the body 113 may be connected and sealed by the adhesive 130.

When viewed from the upper direction of the light emitting device 120, in the light emitting device package described with reference to FIGS. 15 to 25, it is described based on the case in which the light emitting device 120 is provided to be greater than an area formed by the outer boundary surface of the recess R.

However, in the light emitting device package according to the embodiment, as shown in FIG. 26, when viewed from the upper direction of the light emitting device 120, the outer side surface of the light emitting device 120 may be provided to be overlapped with the recess R.

As described above, the outer surface of the light emitting device 120 may be disposed on the region of the recess R, so that the lower surface of the light emitting device 120 and the upper surface of the body 113 may be fixed and sealed by the adhesive 130 provided in the recess R.

In addition, the light emitting device package according to the embodiment, as shown in FIG. 26, may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. A width of the first conductive layer 321 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the body 113.

The second conductive layer 322 may be provided at the second opening TH2. The second conductive layer 322 may be disposed under the second bonding part 122. A width of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the body 113.

The first conductive layer 321 and the second conductive layer 322 may comprise at least one material selected from the group consisting of Ag, Au, and Pt, Sn, and Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

According to the embodiment, the first conductive layer 321 may be electrically connected to the first bonding part 121, and the second conductive layer 322 may be electrically connected to the second bonding part 122. As an example, external power may be supplied to the first conductive layer 321 and the second conductive layer 322, and thus, the light emitting device 120 may be driven.

Meanwhile, according to the light emitting device package according to the embodiment, the adhesive 130 provided at the recess R may be provided between the lower surface of the light emitting device 120 and the upper surface of the package body 110 as shown in FIG. 26. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120. An outline connecting four side surfaces of the light emitting device 120 may be provided to be overlapped on the recess R when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since an inside and an outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package according to the embodiment, it is possible to prevent the first and second conductive layers 321 and 322 from moving to the side surface of the light emitting device 120, and to prevent the light emitting device 120 from being shorted electrically, thereby improving light extraction efficiency.

In addition, according to the embodiment of the present invention, the adhesive 130 provided at the recess R may be moved along the lower surface of the light emitting device 120 to the first region Al located under the light emitting device 120 and may be disposed to be in contact with the four side surfaces of the first and second bonding parts 121 and 122. Accordingly, the first and second bonding parts 121 and 122 may be disposed to be surrounded by the adhesive 130 and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region A1 through a void of the adhesive 130.

However, in selecting the physical properties of the body 113 according to the embodiment and the physical properties of the first and second conductive layers 321 and 322, a distance by which the first and second conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Next, another example of the light emitting device package according to an embodiment of the present invention will be described with reference to FIG. 27.

In describing the light emitting device package according to the embodiment of the present invention with reference to FIG. 27, the description overlapping with the contents described with reference to FIGS. 1 to 26 may be omitted.

Figure 27:
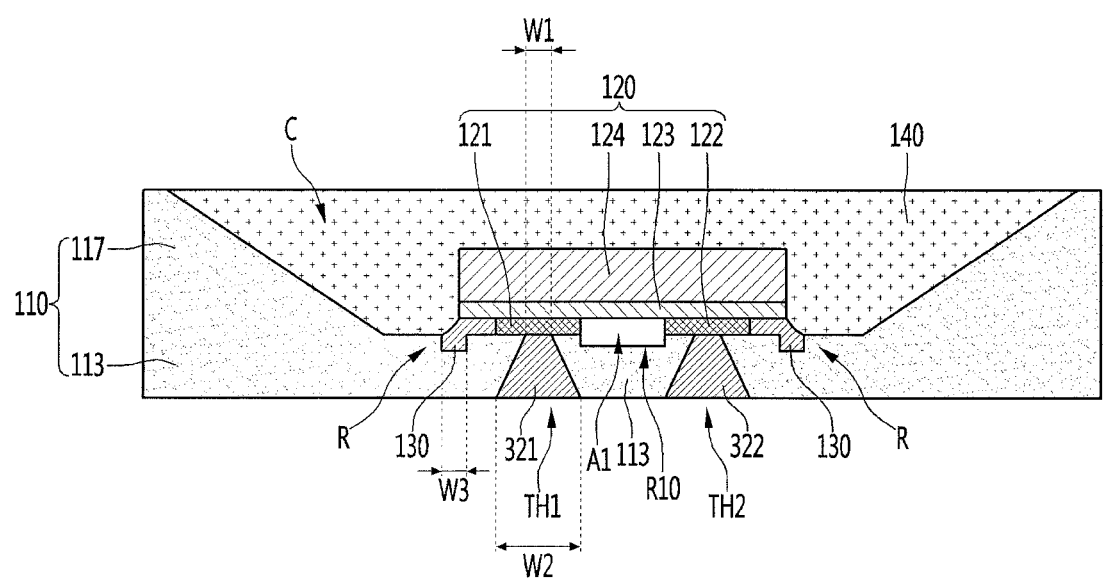
FIG. 27 is a view illustrating still another example of a light emitting device package according to an embodiment of the present invention.
Figure 28:
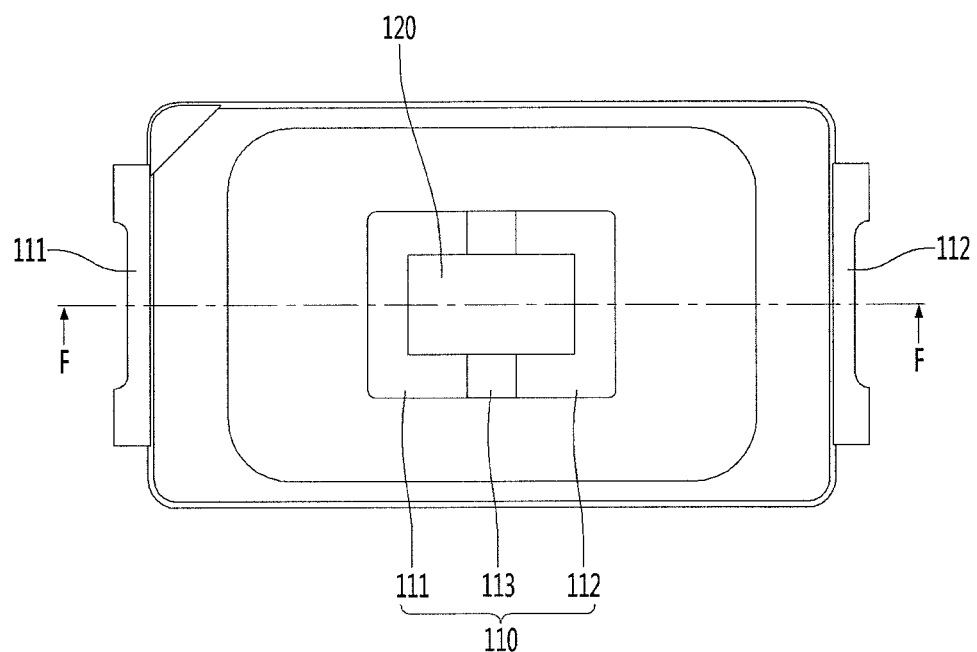
FIG. 28 is a plan view illustrating still another example of a light emitting device package according to an embodiment of the present invention.

The semiconductor device package according to the embodiment, as shown in FIG. 27, may further comprise an upper recess R10 as compared to the semiconductor device package described with reference to FIG. 26.

The upper recess R10 may be provided at an upper surface of the body 113. The upper recess R10 may be provided at the first region Al located under the lower surface of the light emitting device 120. The upper recess R10 may be provided to concave in a first direction from the upper surface of the body 113 toward the lower surface thereof.

The recess R10 may be disposed under the light emitting device 120 and may be provided between the first bonding part 121 and the second bonding part 122. The upper recess R10 may be provided to be extended under the light emitting device 120 in a minor axis direction of the light emitting device 120.

As described with reference to FIGS. 15 to 23, and 26, when the amount of the adhesive 130 provided to the recess R is insufficient, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

In addition, when the light emitting device package according to the embodiment comprises the upper recess R10, the upper recess R10 may provide a function that further restricts a diffusion and movement of the first and second conductive layers 321 and 322 in the first region Al.

As the upper recess R10 is provided, a kind of trap effect is generated in the upper recess R10 even when a part of the first and second conductive layers 321 and 322 is diffused to the upper portion of the body 113, the flow of the first and second conductive layers 321 and 322 is restricted. A phenomenon occurs in which the first conductive layer 321 diffused through the first opening TH1 may not be moved in the lower direction of the upper recess R10 from a boundary surface of the concave region of the upper recess R10. In addition, a phenomenon occurs in which the second conductive layer 322 diffused through the second opening TH2 may not be moved in the lower direction of the upper recess R10 from a boundary surface of the concave region of the upper recess R10. This is interpreted as the flow of the first and second conductive layers 321 and 322 is restricted at a boundary surface of the concave region of the upper recess R10 due to an influence of surface tension and the like.

Accordingly, since the distance by which the first and second conductive layers 321 and 322 are moved at the upper surface of the body 113 may be reliably controlled, the first conductive layer 321 and the second conductive layer 322 may be prevented from being electrically short-circuited in the first region Al.

Next, another example of the light emitting device package according to an embodiment of the present invention will be described with reference to FIGS. 28 to 31.

In describing the light emitting device package according to the embodiment of the present invention with reference to FIGS. 28 to 31, the description overlapping with the contents described with reference to FIGS. 1 to 27 may be omitted.

The light emitting device package according to the embodiment may comprise a package body 110 and a light emitting device 120.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyimide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

The first frame 111 and the second frame 112 may be provided as an insulating frame. The first frame 111 and the second frame 112 may stably provide a structural strength of the package body 110.

In addition, the first frame 111 and the second frame 112 may be provided as a conductive frame. The first frame 111 and the second frame 112 may stably provide the structural strength of the package body 110 and may be electrically connected to the light emitting device 120.

The light emitting device 120 may comprise a first bonding part 121, a second bonding part 122, a light emitting structure 123, and a substrate 124.

The light emitting device 120 may be disposed on the package body 110. The light emitting device 120 may be disposed on the first frame 111 and the second frame 112. The light emitting device 120 may be disposed on the body 113. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to the embodiment may comprise a first opening TH1 and a second opening TH2. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be smaller than or equal to that of the first bonding part 121. In addition, a width of an upper region of the second opening TH2 may be provided to be smaller than or equal to that of the second bonding part 122.

Therefore, the first bonding part 121 of the light emitting device 120 and the first frame 111 may be more firmly attached. In addition, the second bonding part 122 of the light emitting device 120 and the second frame 112 may be more firmly attached.

Further, the width W1 of the upper region of the first opening TH1 may be provided to be smaller than or equal to a width W2 of a lower region of the first opening TH1. Furthermore, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

A width between the first opening TH1 and the second opening TH2 in lower surface regions of the first frame 111 and the second frame 112 may be provided at several hundreds of micrometers. The width between the first opening TH1 and the second opening TH2 in the lower surface regions of the first frame 111 and the second frame 112 may be provided at 100 to 150 micrometers, as an example.

The width between the first opening TH1 and the second opening TH2 in the lower surface regions of the first frame 111 and the second frame 112 may be selected to be provided over a predetermined distance in order to prevent an electrical short-circuit between the pads from occurring when the light emitting device package according to the embodiment is mounted on a circuit board, a submount, or the like later.

The light emitting device package according to the embodiment may comprise an adhesive 130.

The adhesive 130 may be disposed between the body 113 and the light emitting device 120. The adhesive 130 may be disposed between the upper surface of the body 113 and the lower surface of the light emitting device 120.

In addition, the light emitting device package according to the embodiment may comprise a recess R.

The recess R may be provided at the body 113. The recess R may be provided between the first opening TH1 and the reflector 117. In addition, the recess R may be provided between the second opening TH2 and the reflector 117. The recess R may be provided to concave from the upper surface of the body 113 toward the lower surface thereof. The recess R may be disposed under the light emitting device 120. As an example, the recess R may be provided under the light emitting device 120 in the closed loop shape.

The recess R may be disposed between the first bonding part 121 and the reflector 117 disposed to be adjacent to the first opening TH1 when viewed from the upper direction of the light emitting device 120. In addition, the recess R may be disposed between the second bonding part 122 and the reflector 117 disposed to be adjacent to the second opening TH2 when viewed from the upper direction of the light emitting device 120.

The adhesive 130 may be disposed at the recess R. The adhesive 130 may be disposed between the light emitting device 120 and the body 113. The adhesive 130 may be disposed between the first bonding part 121 and the reflector 117. The adhesive 130 may be disposed between the second bonding part 122 and the reflector 117. As an example, the adhesive 130 may be disposed to be in contact with a side surface of the first bonding part 121 and a side surface of the second bonding part 122.

The adhesive 130 may provide a stable fixing force between the light emitting device 120 and the body 113. The adhesive 130 may be disposed to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. In addition, the adhesive 130 may reflect light emitted from the light emitting device 120. When the adhesive 130 comprises a reflective function, the adhesive 130 may comprise a white silicone. When the adhesive 130 comprises the reflective function, the adhesive 130 may be formed of a material comprising as an example, $TiO_2$, silicone, and the like.

According to the embodiment, a depth of the recess R may be provided to be smaller than that of the first opening TH1 or that of the second opening TH2.

The depth of the recess R may be determined in consideration of the adhesion force of the adhesive 130. In addition, the depth T1 of the recess R may be determined by considering stable strength of the body 113 and/or not to occur a crack in the light emitting device package 1100 due to heat dissipated from the light emitting device 120.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth and the width W3 of the recess R may affect a forming position and fixing force of the adhesive 130. The depth and the width W3 of the recess R may be determined so that a fixing force may be sufficiently provided by the adhesive 130 disposed between the body 113 and the light emitting device 120.

As an example, the depth of the recess R may be provided at several tens of micrometers. The depth of the recess R may be provided at 40 to 60 micrometers.

In addition, the width W3 of the recess R may be provided at several hundreds of micrometers. The width W3 of the recess R may be provided at 140 to 160 micrometers. As an example, the width W3 of the recess R may be provided at 150 micrometers.

The first and second bonding parts 121 and 122 of the light emitting device 120 may be sealed from the outside by the adhesive 130 provided at the recess R. The adhesive 130 may be provided under the light emitting device 120 in the closed loop shape.

Figure 30:
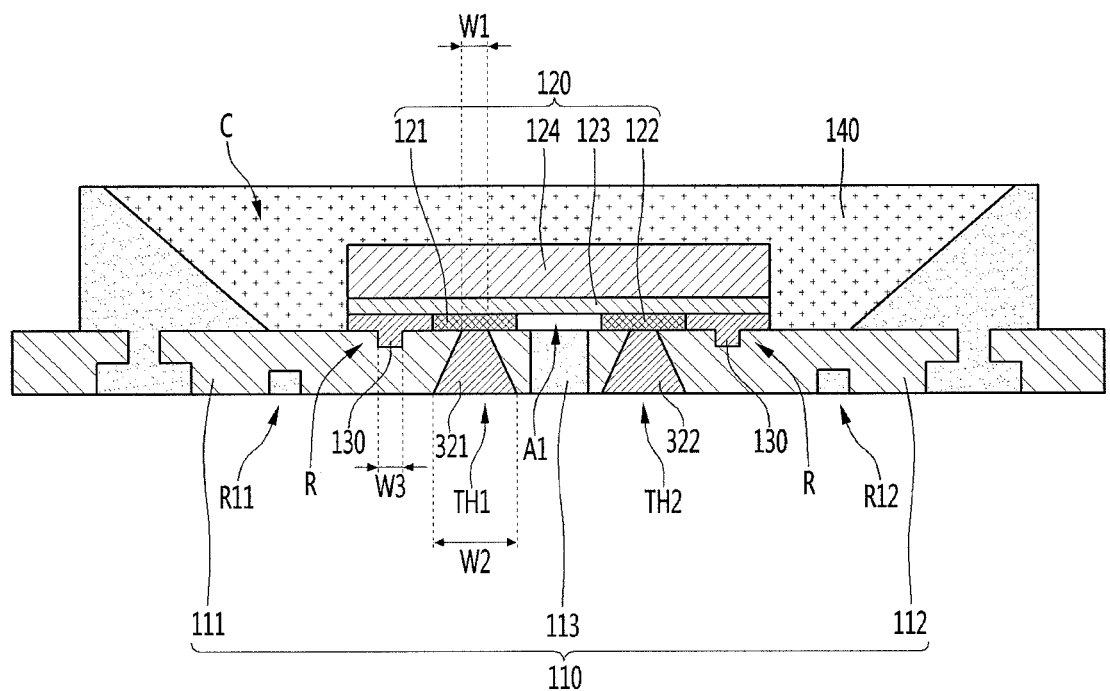
FIG. 30 is a cross-sectional view taken along line F-F of the light emitting device package shown in FIG. 29.
Figure 31:
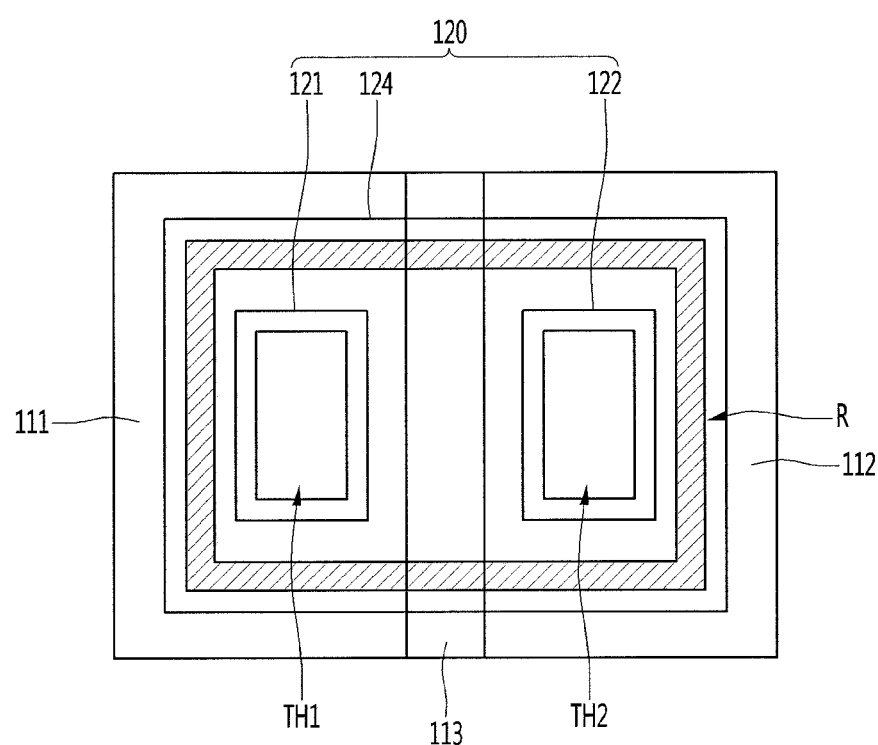
FIG. 31 is a view explaining an arrangement relationship of the package body, the recess, the opening of the light emitting device package shown in FIG. 28.

The adhesive 130 may be provided in the closed loop shape along the shape of the recess R as shown in FIGS. 30 and 31. The recess R may be provided as a closed loop having a rectangular shape or a closed loop having a circular or elliptical shape.

A depth of the first opening TH1 may be provided to correspond to a thickness of the first frame 111. The depth of the first opening TH1 may be provided at a thickness capable of maintaining a stable strength of the first frame 111.

A depth of the second opening TH2 may be provided to correspond to a thickness of the second frame 112. The depth of the second opening TH2 may be provided at a thickness capable of maintaining a stable strength of the second frame 112.

As an example, the depth of the first opening TH1 may be provided at several hundreds of micrometers. The depth of the first opening TH1 may be provided at 180 to 220 micrometers. As an example, the depth of the first opening TH1 may be provided at 200 micrometers.

As an example, a thickness obtained by subtracting the depth of the recess R may from the depth of the first opening TH1 may be selected to be at least 100 micrometers or more. This is in consideration of a thickness of an injection process capable of providing crack free of the body 113.

According to the embodiment, the depth of the first opening TH1 may be provided at two to ten times of the depth of the recess R. As an example, when the depth of the first opening TH1 is provided at 200 micrometers, the depth of the recess R may be provided at 20 to 100 micrometers.

In addition, the light emitting device package according to the embodiment may comprise a molding part 140.

The molding part 140 may be provided on the light emitting device 120. The molding part 140 may be disposed on the first frame 111 and the second frame 112. The molding part 140 may be disposed at the cavity C provided by the package body 110.

The molding part 140 may comprise an insulating material. In addition, the molding part 140 may comprise a wavelength converting part configured to be incident the light emitted from the light emitting device 120 and configured to provide wavelength converted light. As an example, the molding part 140 may comprise at least one selected from the group consisting of a phosphor, a quantum dot, and the like.

In addition, the light emitting device package according to the embodiment may comprise a first conductive layer 321 and a second conductive layer 322. The first conductive layer 321 may be disposed to be spaced apart from the second conductive layer 322.

The first conductive layer 321 may be provided at the first opening TH1. The first conductive layer 321 may be disposed under the first bonding part 121. A width of the first conductive layer 321 may be provided to be smaller than that of the first bonding part 121.

The first bonding part 121 may have a width of a second direction perpendicular to the first direction in which the first opening TH1 is formed. The width of the first bonding part 121 may be provided to be greater than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the first frame 111.

The second conductive layer 322 may be provided at the second opening TH2. The second conductive layer 322 may be disposed under the second bonding part 122. A width of the second conductive layer 322 may be provided to be smaller than that of the second bonding part 122.

The second bonding part 122 may have a width of a second direction perpendicular to the first direction in which the second opening TH2 is formed. The width of the second bonding part 122 may be provided to be greater than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise at least one material selected from the group consisting of Ag, Au, and Pt, Sn, Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

In addition, the light emitting device package according to the embodiment may comprise a first lower recess R11 and a second lower recess R12. The first lower recess R11 and the second lower recess R12 may be disposed to be spaced apart from each other.

The first lower recess R11 may be provided at the lower surface of the first frame 111. The first lower recess R11 may be provided to concave in a direction from the lower surface to the upper surface of the first frame 111. The first lower recess R11 may be disposed to be spaced apart from the first opening TH1.

The first lower recess R11 may be provided to have a width of several micrometers to several tens of micrometers. A resin portion may be provided at the first lower recess R11. The resin portion filled in the first lower recess R11 may be provided to have, for example, the same material as the body 113.

However, the present invention is not limited thereto, and the resin portion may be provided to have a material selected from materials having a poor adhesion force and wettability with the first and second conductive layers 321 and 322. Alternatively, the resin portion may be provided to be selected from a material having a low surface tension with respect to the first and second conductive layers 321 and 322.

As an example, the resin portion filled in the first lower recess R11 may be provided in the process of forming the first frame 111, the second frame 112, and the body 113 through an injection process or the like.

The resin portion filled in the first lower recess R11 may be disposed at the periphery of the lower surface region of the first frame 111 providing the first opening TH1. The lower surface of the first frame 111 providing the first opening TH1 may be disposed to be separated from a lower surface of the first frame 111 forming in the periphery of the first frame 111 in a kind of an island shape.

As an example, as shown in FIG. 15, the lower surface of the first frame 111 providing the first opening TH1 may be isolated from the periphery of the first frame 111 by the resin portion filled in the first lower recess R11 and the body 113.

Therefore, when the resin portion is disposed to have a material having a poor adhesion force and a poor wettability with the first and second conductive layers 321 and 322 or a material having a low surface tension between the resin portion and the first and second conductive layers 321 and 322, it is possible to prevent the first conductive layer 321 provided at the first opening TH1 from being separated from the first opening TH1 and being diffused over the resin portion filled in the first lower recess R11 or the body 113.

This is based on facts that an adhesion relationship between the first conductive layer 321 and the resin portion and the body 113 or wettability and the surface tension between the resin portion and the first and second conductive layers 321 and 322, or the like are not good. That is, a material constituting the first conductive layer 321 may be selected to have a good adhesion characteristic with the first frame 111. In addition, a material constituting the first conductive layer 321 may be selected to have a poor adhesion characteristic with the resin portion and the body 113.

Accordingly, since the first conductive layer 321 overflows from the first opening TH1 toward a region in which the resin or the body 113 is provided, it is prevented from overflowing or extending an outside of a region in which the resin portion or the body 113 is provided, so that the first conductive layer 321 may be stably disposed at a region in which the first opening TH1 is provided.

When the first conductive layer 321 disposed at the first opening TH1 overflows, it is possible to prevent the first conductive layer 321 from being extended to an outer region of the first lower recess R11 in which the resin portion or the body 113 are provided. In addition, the first conductive layer 321 may be stably connected to the lower surface of the first bonding part 121 in the first opening TH1.

Therefore, when the light emitting device package is mounted at a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the second lower recess R12 may be provided at the lower surface of the second frame 112. The second lower recess R12 may be provided to concave in a upper surface direction from the lower surface of the second frame 112. The second lower recess R12 may be disposed to be spaced apart from the second opening TH2.

The second lower recess R12 may be provided to have a width of several micrometers to several tens of micrometers. A resin portion may be provided at the second lower recess R12. The resin portion filled in the second lower recess R12 may be provided to have, for example, the same material as the body 113.

However, the present invention is not limited thereto, and the resin portion may be provided to have a material selected from materials having a poor adhesion force and wettability with the first and second conductive layers 321 and 322. Alternatively, the resin portion may be provided to be selected from a material having a low surface tension with respect to the first and second conductive layers 321 and 322.

As an example, the resin portion filled in the second lower recess R12 may be provided in the process of forming the first frame 111, the second frame 112, and the body 113 through an injection process or the like.

The resin portion filled in the second lower recess R12 may be disposed at the periphery of the lower surface region of the second frame 112 providing the second opening TH2. The lower surface of the second frame 112 providing the second opening TH2 may be disposed to be separated from a lower surface of the second frame 112 forming in the periphery of the second frame 112 in a kind of an island shape.

Figure 29:
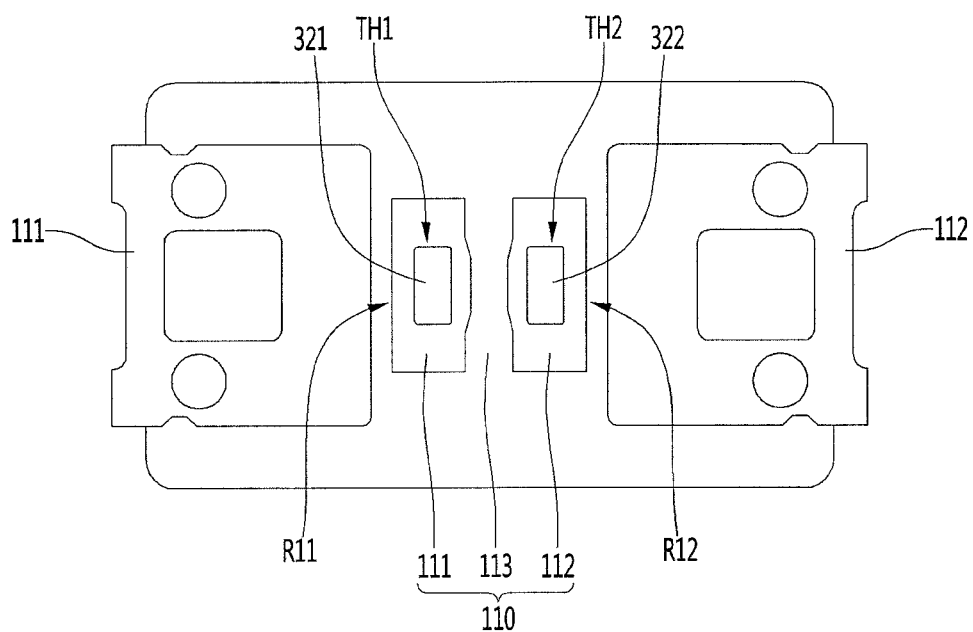
FIG. 29 is a bottom view of the light emitting device package shown in FIG. 28.

As an example, as shown in FIG. 29, the lower surface of the second frame 112 providing the second opening TH2 may be isolated from the periphery of the first frame 111 by the resin portion filled in the second lower recess R12 and the body 113.

Therefore, when the resin portion is disposed to have a material having a poor adhesion force and a poor wettability with the first and second conductive layers 321 and 322 or a material having a low surface tension between the resin portion and the first and second conductive layers 321 and 322, it is possible to prevent the second conductive layer 322 provided at the second opening TH2 from being separated from the second opening TH2 and being diffused over the resin portion filled in the second lower recess R12 or the body 113.

This is based on facts that an adhesion relationship between the second conductive layer 322 and the resin portion and the body 113 or wettability and the surface tension between the resin portion and the first and second conductive layers 321 and 322, or the like are not good. That is, a material constituting the second conductive layer 322 may be selected to have a good adhesion characteristic with the second frame 112. In addition, a material constituting the second conductive layer 322 may be selected to have a poor adhesion characteristic with the resin portion and the body 113.

Accordingly, since the second conductive layer 322 overflows from the second opening TH2 toward a region in which the resin or the body 113 is provided, it is prevented from overflowing or extending an outside of a region in which the resin portion or the body 113 is provided, so that the second conductive layer 322 may be stably disposed at a region in which the second opening TH2 is provided.

Therefore, when the second conductive layer 322 disposed at the second opening TH2 overflows, it is possible to prevent the second conductive layer 322 from being extended to an outer region of the second lower recess R12 in which the resin portion or the body 113 are provided. In addition, the second conductive layer 322 may be stably connected to the lower surface of the second bonding part 122 in the second opening TH2.

Therefore, when the light emitting device package is mounted at a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

According to the embodiment, the first conductive layer 321 may be electrically connected to the first bonding part 121, and the second conductive layer 322 may be electrically connected to the second bonding part 122. As an example, external power may be supplied to the first conductive layer 321 and the second conductive layer 322, and thus, the light emitting device 120 may be driven.

Meanwhile, according to the light emitting device package 1100 according to the embodiment, the adhesive 130 provided at the recess R may be provided between the lower surface of the light emitting device 120 and the upper surface of the package body 110 as shown in FIGS. 15 to 17. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package according to the embodiment, it is possible to prevent the first and second conductive layers 321 and 322 from moving to the side surface of the light emitting device 120, and to prevent the light emitting device 120 from being shorted electrically, thereby improving light extraction efficiency.

According to an embodiment of the present invention, the adhesive 130 provided at the recess R may be moved along the lower surface of the light emitting device 120 to the first region Al located under the light emitting device 120, and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow or heat treatment may be applied. At this point, in the reflow or heat treatment process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the electrode part of the light emitting device according to the embodiment may be provided to have driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphtalamide (PPA) resin, polycyclohexylenedimethylene terephthalate (PCT) resin, epoxy molding compound (EMC) resin, and silicone molding compound (SMC) resin.

Next, the light emitting device package according to an embodiment of the present invention will be described with reference to FIGS. 32 and 33.

In describing the light emitting device package according to the embodiment of the present invention with reference to FIGS. 32 and 33, the description overlapping with the contents described with reference to FIGS. 1 to 31 may be omitted.

Figure 32:
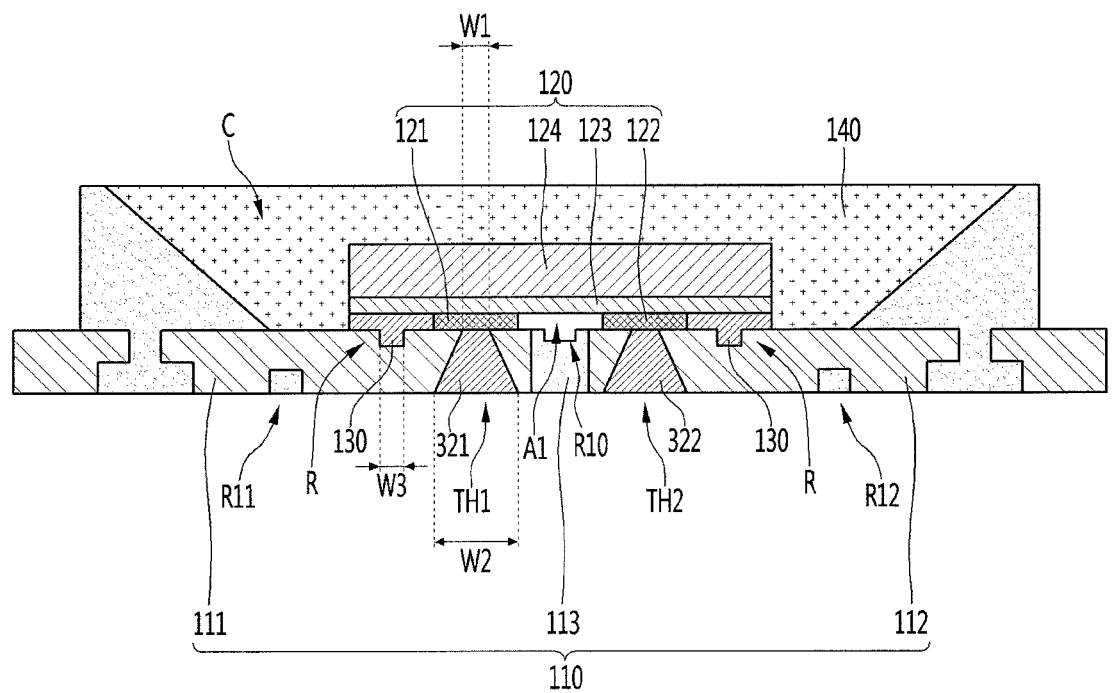
FIG. 32 is a view illustrating still another example of a light emitting device package according to an embodiment of the present invention.
Figure 33:
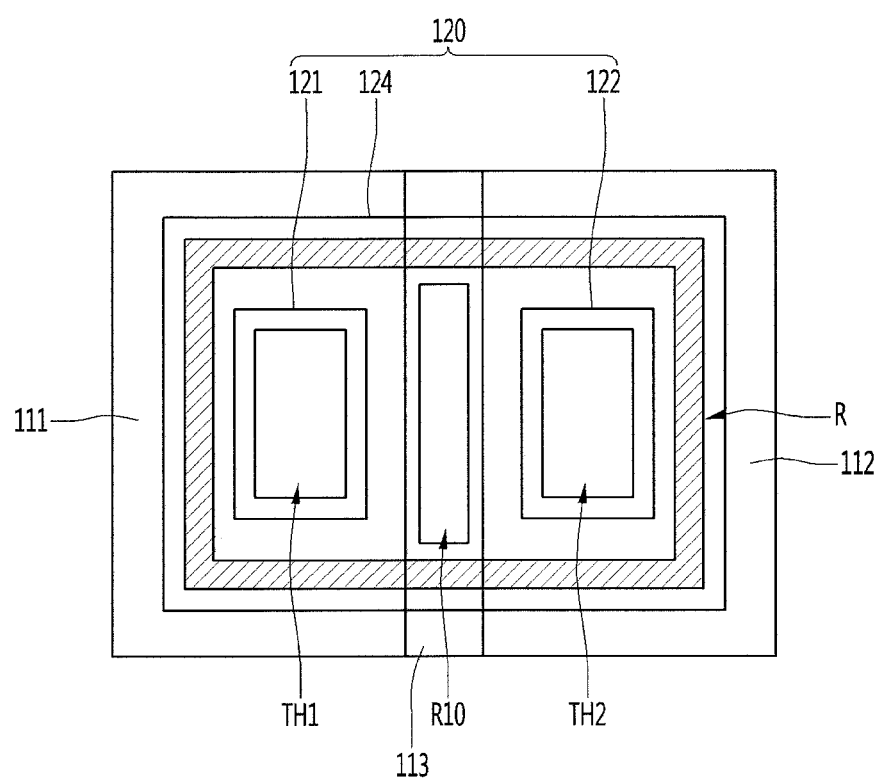
FIG. 33 is a view explaining an arrangement relationship of the package body, the recess, the opening, and the upper recess of the light emitting device package shown in FIG. 32.

The semiconductor device package according to the embodiment, as shown in FIGS. 32 and 33, may further comprise an upper recess R10 as compared to the semiconductor device package described with reference to FIGS. 28 to 31.

The upper recess R10 may be provided at an upper surface of the body 113. The upper recess R10 may be provided at the first region Al located under the lower surface of the light emitting device 120. The upper recess R10 may be provided to concave in a first direction from the upper surface of the body 113 toward the lower surface thereof.

The recess R10 may be disposed under the light emitting device 120 and may be provided between the first bonding part 121 and the second bonding part 122. The upper recess R10 may be provided to be extended under the light emitting device 120 in a minor axis direction of the light emitting device 120.

As described with reference to FIGS. 28 to 31, when the amount of the adhesive 130 provided to the recess R is insufficient, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

In addition, when the light emitting device package according to the embodiment comprises the upper recess R10, the upper recess R10 may provide a function that further restricts a diffusion and movement of the first and second conductive layers 321 and 322 in the first region A1.

As the upper recess R10 is provided, a kind of trap effect is generated in the upper recess R10 even when a part of the first and second conductive layers 321 and 322 is diffused to the upper portion of the body 113, the flow of the first and second conductive layers 321 and 322 is restricted. A phenomenon occurs in which the first conductive layer 321 diffused through the first opening TH1 may not be moved in the lower direction of the upper recess R10 from a boundary surface of the concave region of the upper recess R10. In addition, a phenomenon occurs in which the second conductive layer 322 diffused through the second opening TH2 may not be moved in the lower direction of the upper recess R10 from a boundary surface of the concave region of the upper recess R10. This is interpreted as the flow of the first and second conductive layers 321 and 322 is restricted at a boundary surface of the concave region of the upper recess R10 due to an influence of surface tension and the like.

Accordingly, since the distance by which the first and second conductive layers 321 and 322 are moved at the upper surface of the body 113 may be stably and reliably controlled, the first conductive layer 321 and the second conductive layer 322 may be prevented from being electrically short-circuited in the first region Al.

Meanwhile, in the light emitting device package described with reference to FIGS. 28 to 33, when viewed from the upper direction of the light emitting device 120, it is described based on the case in which the light emitting device 120 is provided to be greater than an area formed by the outer boundary surface of the recess R.

However, in the light emitting device package according to another embodiment, similar to the light emitting device package described with reference to FIG. 26, when viewed from the upper direction of the light emitting device 120, the outer side surface of the light emitting device 120 may be provided to be overlapped with the recess R.

As described above, the outer surface of the light emitting device 120 may be disposed on the region of the recess R, so that the lower surface of the light emitting device 120 and the upper surface of the body 113 may be fixed and sealed by the adhesive 130 provided in the recess R.

Figure 34:
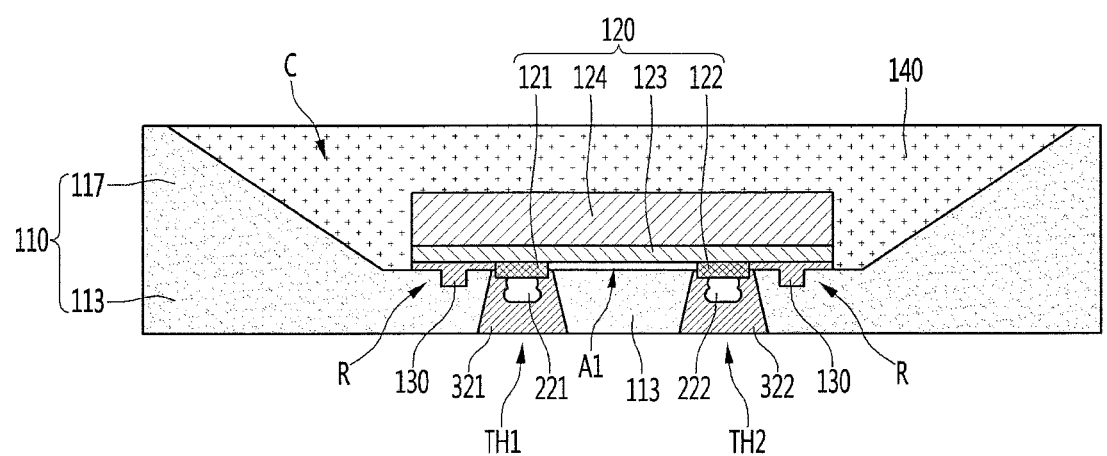
FIG. 34 is a view illustrating still another example of a light emitting device package according to an embodiment of the present invention.

Then, another example of the light emitting device package according to an embodiment of the present invention will be described with reference to FIG. 34.

In describing the light emitting device package according to the embodiment of with reference to FIG. 34, the description of the contents overlapping with the contents described with reference to FIGS. 1 to 33 may be omitted.

The light emitting device package 1100 according to the embodiment may comprise a package body 110 and a light emitting device 120.

The package body 110 may comprise a body 113 and a reflector 117. The reflector 117 may be disposed on the body 113. The reflector 117 may be disposed at a periphery of the upper surface of the body 113. The reflector 117 may provide a cavity C on the upper surface of the body 113.

According to the embodiment, the package body 110 may be provided as a structure with the cavity C, or may be provided as a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

According to the embodiment, the light emitting device 120 may comprise a first bonding part 121, a second bonding part 122, a light emitting structure 123, and a substrate 124.

The light emitting device 120 may comprise the light emitting structure 123 disposed under the substrate 124. The first bonding part 121 and the second bonding part 122 may be disposed between the light emitting structure 123 and the body 113.

The light emitting device 120 may be disposed on the package body 110. The light emitting device 120 may be disposed on the body 113. The light emitting device 120 may be disposed in the cavity C provided by the reflector 117.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other under the lower surface of the light emitting device 120.

The first bonding part 121 may be disposed between the light emitting structure 123 and the body 113. The second bonding part 122 may be disposed between the light emitting structure 123 and the body 113.

Meanwhile, the light emitting device package according to the embodiment may comprise a first opening TH1 and a second opening TH2.

The package body 110 may comprise the first opening TH1 passing through the lower surface of the package body 110 from the bottom surface of the cavity C. The package body 110 may comprise the second opening TH2 passing through the lower surface of the package body 110 from the bottom surface of the cavity C.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the body 113 toward the lower surface thereof.

The second opening TH2 may be provided at the body 113. The second opening TH2 may be provided by passing through the body 113. The second opening TH2 may be provided by passing through an upper surface and a lower surface of the body 113 in the first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the body 113 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be greater than that of the first bonding part 121. In addition, a width of the upper region of the second opening TH2 may be provided to be greater than that of the second bonding part 122.

According to the embodiment, the lower region of the first bonding part 121 may be disposed in the upper region of the first opening TH1. The bottom surface of the first bonding part 121 may be disposed to be lower than the upper surface of the body 113.

In addition, the lower region of the second bonding part 122 may be disposed in the upper region of the second opening TH2. The bottom surface of the second bonding part 122 may be disposed to be lower than the upper surface of the body 113.

Further, the width W1 of the upper region of the first opening TH1 may be provided to be smaller than or equal to a width W2 of a lower region of the first opening TH1. Furthermore, the width of the upper region of the second opening TH2 may be provided to be smaller than or equal to a width of a lower region of the second opening TH2.

The first opening TH1 may be provided in an inclined shape in which a width gradually decreases as toward the upper region from the lower region. The second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

A width between the first opening TH1 and the second opening TH2 in a lower surface region of the body 113 may be provided at several hundreds of micrometers. The width between the first opening TH1 and the second opening TH2 in the lower surface region of the body 113 may be provided at, as an example, 100 to 150 micrometers.

The width between the first opening TH1 and the second opening TH2 in the lower surface region of body 113 may be selected to be provided over a predetermined distance in order to prevent a short-circuit between pads from occurring when the light emitting device package according to the embodiment is mounted on a circuit board, a submount, or the like later.

The light emitting device package according to the embodiment may comprise an adhesive 130.

The adhesive 130 may be disposed between the body 113 and the light emitting device 120. The adhesive 130 may be disposed between the upper surface of the body 113 and the lower surface of the light emitting device 120.

In addition, the light emitting device package according to the embodiment may comprise a recess R.

The recess R may be provided at the body 113. The recess R may be provided between the first opening TH1 and the reflector 117. In addition, the recess R may be provided between the second opening TH2 and the reflector 117. The recess R may be provided to concave from the upper surface of the body 113 toward the lower surface thereof. The recess R may be disposed under the light emitting device 120. As an example, the recess R may be provided under the light emitting device 120 in the closed loop shape.

The recess R may be disposed between the first bonding part 121 and the reflector 117 disposed to be adjacent to the first opening TH1 when viewed from the upper direction of the light emitting device 120. In addition, the recess R may be disposed between the second bonding part 122 and the reflector 117 disposed to be adjacent to the second opening TH2 when viewed from the upper direction of the light emitting device 120.

The adhesive 130 may be disposed at the recess R. The adhesive 130 may be disposed between the light emitting device 120 and the body 113. The adhesive 130 may be disposed between the first bonding part 121 and the reflector 117. The adhesive 130 may be disposed between the second bonding part 122 and the reflector 117. As an example, the adhesive 130 may be disposed to be in contact with a side surface of the first bonding part 121 and a side surface of the second bonding part 122.

The adhesive 130 may provide a stable fixing force between the light emitting device 120 and the body 113. The adhesive 130 may be disposed to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. In addition, the adhesive 130 may reflect light emitted from the light emitting device 120. When the adhesive 130 comprises a reflective function, the adhesive 130 may comprise a white silicone. When the adhesive 130 comprises the reflective function, the adhesive 130 may be formed of a material comprising as an example, $TiO_2$, silicone, and the like.

According to the embodiment, a depth of the recess R may be provided to be smaller than that of the first opening TH1 or that of the second opening TH2.

The depth of the recess R may be determined in consideration of the adhesion force of the adhesive 130. In addition, the depth T1 of the recess R may be determined by considering stable strength of the body 113 and/or not to occur a crack in the light emitting device package 1100 due to heat dissipated from the light emitting device 120.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth and the width W3 of the recess R may affect a forming position and fixing force of the adhesive 130. The depth and the width W3 of the recess R may be determined so that a fixing force may be sufficiently provided by the adhesive 130 disposed between the body 113 and the light emitting device 120.

As an example, the depth of the recess R may be provided at several tens of micrometers. The depth of the recess R may be provided at 40 to 60 micrometers.

In addition, the width W3 of the recess R may be provided at several hundreds of micrometers. The width W3 of the recess R may be provided at 140 to 160 micrometers. As an example, the width W3 of the recess R may be provided at 150 micrometers.

The first and second bonding parts 121 and 122 of the light emitting device 120 may be sealed from the outside by the adhesive 130 provided at the recess R. The adhesive 130 may be provided under the light emitting device 120 in the closed loop shape.

The adhesive 130 may be provided in the closed loop shape along the shape of the recess R as described above with reference to FIGS. 16 and 17. The recess R may be provided as a closed loop having a rectangular shape or a closed loop having a circular or elliptical shape.

A depth of the first opening TH1 may be provided to correspond to a thickness of the body 113. The depth of the first opening TH1 may be provided at a thickness capable of maintaining a stable strength of the body 113.

As an example, the depth of the first opening TH1 may be provided at several hundreds of micrometers. The depth of the first opening TH1 may be provided at 180 to 220 micrometers. As an example, the depth of the first opening TH1 may be provided at 200 micrometers.

As an example, a thickness obtained by subtracting the depth of the recess R may from the depth of the first opening TH1 may be selected to be at least 100 micrometers or more. This is in consideration of a thickness of an injection process capable of providing crack free of the body 113.

According to the embodiment, the depth of the first opening TH1 may be provided at two to ten times of the depth of the recess R. As an example, when the depth of the first opening TH1 is provided at 200 micrometers, the depth of the recess R may be provided at 20 to 100 micrometers.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

As described above, as the area of the first and second bonding parts 121 and 122 is provided to be small, an amount of light transmitted to the lower surface of the light emitting device 120 may be increased. In addition, the adhesive 130 having a good reflective characteristic may be provided under the light emitting device 120. Therefore, light emitted in a lower direction of the light emitting device 120 is reflected at the adhesive 130, and is effectively emitted toward an upper direction of the light emitting device package, and thus light extraction efficiency may be improved.

In addition, the light emitting device package according to the embodiment may comprise a molding part 140.

The molding part 140 may be provided on the light emitting device 120. The molding part 140 may be disposed on the body 113. The molding part 140 may be disposed at the cavity C provided by the reflector 117.

The molding part 140 may comprise an insulating material. In addition, the molding part 140 may comprise a wavelength converting part configured to be incident light emitted from the light emitting device 120 and configured to provide wavelength converted light. As an example, the molding part 140 may comprise a phosphor, a quantum dot, and the like.

The light emitting device package according to the embodiment may comprise a first conductor 221 and a second conductor 222. In addition, the light emitting device package according to the embodiment may comprise a first conductive layer 321 and a second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be provided at the first opening TH1. The first conductor 221 may be disposed between the first bonding part 121 and the first conductive layer 321. The first conductor 221 may be electrically connected to the first bonding part 121 and the first conductive layer 321.

A lower surface of the first conductor 221 may be disposed to be lower than an upper surface of the first opening TH1. The lower surface of the first conductor 221 may be disposed to be lower than an upper surface of the first conductive layer 321.

The first conductor 221 may be disposed on the first opening TH1. In addition, the first conductor 221 may be disposed to be extended from the first bonding part 121 to an inside of the first opening TH1.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be provided at the second opening TH2. The second conductor 222 may be disposed between the second bonding part 122 and the second conductive layer 322. The second conductor 222 may be electrically connected to the second bonding part 122 and the second conductive layer 322.

A lower surface of the second conductor 222 may be disposed to be lower than an upper surface of the second opening TH2. The lower surface of the second conductor 222 may be disposed to be lower than an upper surface of the second conductive layer 322.

The second conductor 222 may be disposed on the second opening TH2. In addition, the second conductor 222 may be disposed to be extended from the second bonding part 122 to an inside of the second opening TH2.

According to the embodiment, the first conductive layer 321 may be disposed on a lower surface and side surface of the first conductor 221. The first conductive layer 321 may be disposed to be in direct contact with the lower surface and side surface of the first conductor 221.

The first conductive layer 321 may be provided at the first opening TH1. The first conductive layer 321 may be disposed under the first bonding part 121. A width of the first conductive layer 321 may be provided to be greater than that of the first bonding part 121.

As described above, according to the light emitting device package according to the embodiment, an electrical connection between the first conductive layer 321 and the first bonding part 121 may be more stably provided by the first conductor 221.

In addition, according to the embodiment, the second conductive layer 322 may be disposed at lower surface and side surface of the second conductor 222. The second conductive layer 322 may be disposed to be in direct contact with the lower surface and side surface of the second conductor 222.

The second conductive layer 322 may be provided at the second opening TH2. The second conductive layer 322 may be disposed under the second bonding part 122. A width of the second conductive layer 322 may be provided to be greater than that of the second bonding part 122.

As described above, according to the light emitting device package according to the embodiment, an electrical connection between the second conductive layer 322 and the second bonding part 122 may be more stably provided by the second conductor 222.

As an example, the first and second conductors 221 and 222 may be stably bonded to the first and second bonding parts 121 and 122 via separate bonding materials, respectively. In addition, side surfaces and lower surfaces of the first and second conductors 221 and 222 may be in contact with the first and second conductive layers 321 and 322, respectively.

Therefore, an area in which the first and second conductive layers 321 and 322 are respectively in contact with the first and second conductors 221 and 222 may be further increased as compared with a case in which the first and second conductive layers 321 and 322 are directly contacted to the lower surfaces of the first and second bonding parts 121 and 122, respectively.

Accordingly, a power may be stably provided from the first and second conductive layers 321 and 322 to the first and second bonding parts 121 and 122 via the first and second conductors 221 and 222.

As an example, the first and second conductors 221 and 222 may comprise at least one material selected from the group consisting of Al. Au, Ag, and Pt, etc. or an alloy thereof. In addition, the first and second conductors 221 and 222 may be provided as a single layer or a multilayer.

The first bonding part 121 may have a width of a second direction perpendicular to the first direction in which the first opening TH1 is formed. The width of the first bonding part 121 may be provided to be smaller than that of the second direction of the first opening TH1.

The first conductive layer 321 may be disposed to be in direct contact with the lower surface of the first bonding part 121. The first conductive layer 321 may be electrically connected to the first bonding part 121. The first conductive layer 321 may be disposed to be surrounded by the body 113.

An upper portion of the first conductive layer 321 may be disposed at the periphery of a lower portion of the first bonding part 121 in the upper region of the first opening TH1. The upper surface of the first conductive layer 321 may be disposed to be higher than the lower surface of the first bonding part 121.

The second conductive layer 322 may be provided at the second opening TH2. The second conductive layer 322 may be disposed under the second bonding part 122. The width of the second conductive layer 322 may be provided to be greater than that of the second bonding part 122.

The second bonding part 122 may have a width of a second direction perpendicular to the first direction in which the second opening TH2 is formed. The width of the second bonding part 122 may be provided to be smaller than that of the second direction of the second opening TH2.

The second conductive layer 322 may be disposed to be in direct contact with the lower surface of the second bonding part 122. The second conductive layer 322 may be electrically connected to the second bonding part 122. The second conductive layer 322 may be disposed to be surrounded by the body 113.

An upper portion of the second conductive layer 322 may be disposed at the periphery of a lower portion of the second bonding part 122 in the upper region of the second opening TH2. The upper surface of the second conductive layer 322 may be disposed to be higher than the lower surface of the second bonding part 122.

The first conductive layer 321 and the second conductive layer 322 may comprise at least one material selected from the group consisting of Ag, Au, and Pt, Sn, Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

According to the embodiment, the first conductive layer 321 may be electrically connected to the first bonding part 121, and the second conductive layer 322 may be electrically connected to the second bonding part 122. As an example, external power may be supplied to the first conductive layer 321 and the second conductive layer 322, and thus, the light emitting device 120 may be driven.

Meanwhile, according to the light emitting device package according to the embodiment, the adhesive 130 provided at the recess R may be provided between the lower surface of the light emitting device 120 and the upper surface of the package body 110. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package according to the embodiment, it is possible to prevent the first and second conductive layers 321 and 322 from moving to the side surface of the light emitting device 120, and to prevent the light emitting device 120 from being shorted electrically, thereby improving light extraction efficiency.

According to an embodiment of the present invention, the adhesive 130 provided at the recess R may be moved along the lower surface of the light emitting device 120 to the first region Al located under the light emitting device 120, and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow or heat treatment may be applied. At this point, in the reflow or heat treatment process, a re-melting phenomenon occurs in a bonding region between a lead frame and the light emitting device provided at the light emitting device package, so that stability of electrical connection and physical coupling may be weakened.

However, according to the light emitting device package and a method of fabricating the light emitting device package according to the embodiment, the electrode part of the light emitting device according to the embodiment may be provided to have driving power by the conductive layers disposed at the openings. In addition, the melting point of the conductive layers disposed in the openings may be selected to have a higher value than that of the general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package 100 and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, the light emitting device package according to an embodiment of the present invention will be described with reference to FIG. 35.

In describing the light emitting device package according to the embodiment of the present invention with reference to FIG. 35, the description overlapping with the contents described with reference to FIGS. 1 to 34 may be omitted.

Figure 35:
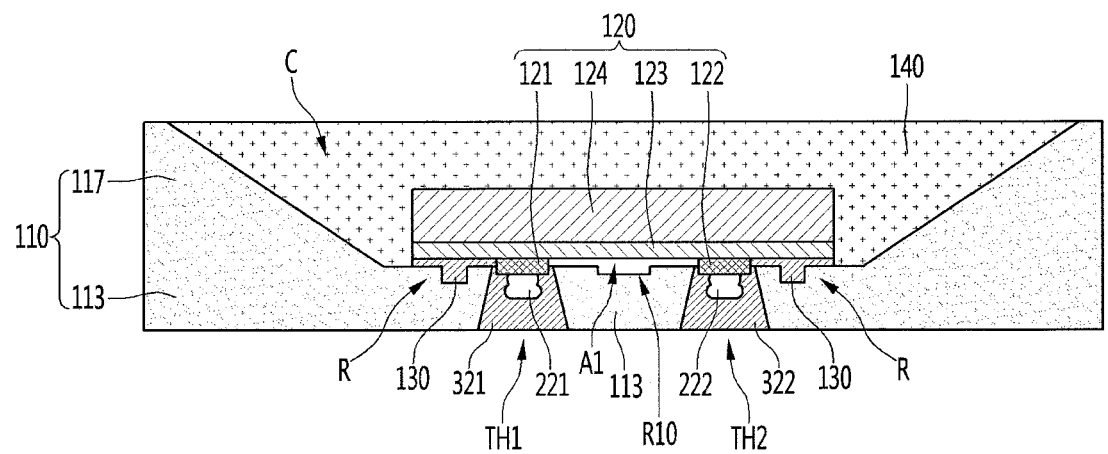
FIG. 35 is a view illustrating still another example of a light emitting device package according to an embodiment of the present invention.

The semiconductor device package according to the embodiment, as shown in FIG. 35, may further comprise an upper recess R10 as compared to the semiconductor device package described with reference to FIG. 34.

The upper recess R10 may be provided at an upper surface of the body 113. The upper recess R10 may be provided at the first region Al located under the lower surface of the light emitting device 120. The upper recess R10 may be provided to concave in a first direction from the upper surface of the body 113 toward the lower surface thereof.

The recess R10 may be disposed under the light emitting device 120 and may be provided between the first bonding part 121 and the second bonding part 122. The upper recess R10 may be provided to be extended under the light emitting device 120 in a minor axis direction of the light emitting device 120.

As described with reference to FIG. 34, when the amount of the adhesive 130 provided to the recess R is insufficient, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

In addition, when the light emitting device package according to the embodiment comprises the upper recess R10, the upper recess R10 may provide a function that further restricts a diffusion and movement of the first and second conductive layers 321 and 322 in the first region Al.

As the upper recess R10 is provided, a kind of trap effect is generated in the upper recess R10 even when a part of the first and second conductive layers 321 and 322 is diffused to the upper portion of the body 113, the flow of the first and second conductive layers 321 and 322 is restricted. A phenomenon occurs in which the first conductive layer 321 diffused through the first opening TH1 may not be moved in the lower direction of the upper recess R10 from a boundary surface of the concave region of the upper recess R10. In addition, a phenomenon occurs in which the second conductive layer 322 diffused through the second opening TH2 may not be moved in the lower direction of the upper recess R10 from a boundary surface of the concave region of the upper recess R10. This is interpreted as the flow of the first and second conductive layers 321 and 322 is restricted at a boundary surface of the concave region of the upper recess R10 due to an influence of surface tension and the like.

Accordingly, since the distance by which the first and second conductive layers 321 and 322 are moved at the upper surface of the body 113 may be stably and reliably controlled, the first conductive layer 321 and the second conductive layer 322 may be prevented from being electrically short-circuited in the first region Al.

Meanwhile, in the light emitting device package described with reference to FIGS. 34 to 35, when viewed from the upper direction of the light emitting device 120, it is described based on the case in which the light emitting device 120 is provided to be greater than an area formed by the outer boundary surface of the recess R.

However, in the light emitting device package according to another embodiment, similar to the light emitting device package described with reference to FIG. 26, when viewed from the upper direction of the light emitting device 120, the outer side surface of the light emitting device 120 may be provided to be overlapped with the recess R.

As described above, the outer surface of the light emitting device 120 may be disposed on the region of the recess R, so that the lower surface of the light emitting device 120 and the upper surface of the body 113 may be fixed and sealed by the adhesive 130 provided in the recess R.

Then, another example of the light emitting device package according to an embodiment of the present invention will be described with reference to FIG. 36.

In describing the light emitting device package according to the embodiment of with reference to FIG. 36, the description of the contents overlapping with the contents described with reference to FIGS. 1 to 35 may be omitted.

The light emitting device package according to the embodiment may comprise a package body 110 and a light emitting device 120.

The package body 110 may comprise a first frame 111 and a second frame 112. The first frame 111 and the second frame 112 may be disposed to be spaced apart from each other.

The package body 110 may comprise a body 113. The body 113 may be disposed between the first frame 111 and the second frame 112. The body 113 may perform a function as a kind of electrode separation line. The body 113 may also be referred to as an insulating member.

The body 113 may be disposed on the first frame 111. In addition, the body 113 may be disposed on the second frame 112.

The body 113 may provide an inclined surface disposed on the first frame 111 and the second frame 112. A cavity C may be provided on the first frame 111 and the second frame 112 by the inclined surface of the body 113.

According to the embodiment, the package body 110 may be provided in a structure with the cavity C, or may be provided a structure with a flat upper surface without the cavity C.

For example, the body 113 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like. In addition, the body 113 may comprise a high refractive index filler such as $TiO_2$ and $SiO_2$.

The light emitting device 120 may comprise a first bonding part 121, a second bonding part 122, a light emitting structure 123, and a substrate 124.

The first bonding part 121 may be disposed on a lower surface of the light emitting device 120. The second bonding part 122 may be disposed on the lower surface of the light emitting device 120. The first bonding part 121 and the second bonding part 122 may be disposed to be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to the embodiment may comprise a first opening TH1 and a second opening TH2. The first frame 111 may comprise the first opening TH1. The second frame 112 may comprise the second opening TH2.

The first opening TH1 may be provided at the first frame 111. The first opening TH1 may be provided by passing through the first frame 111. The first opening TH1 may be provided by passing through an upper surface and a lower surface of the first frame 111 in a first direction.

The first opening TH1 may be disposed under the first bonding part 121 of the light emitting device 120. The first opening TH1 may be provided to be overlapped with the first bonding part 121 of the light emitting device 120. The first opening TH1 may be provided to be overlapped with the first bonding part 121 of the light emitting device 120 in the first direction from the upper surface of the first frame 111 toward the lower surface thereof.

The second opening TH2 may be provided at the second frame 112. The second opening TH2 may be provided by passing through the second frame 112. The second opening TH2 may be provided by passing through an upper surface and a lower surface of the second frame 112 in a first direction.

The second opening TH2 may be disposed under the second bonding part 122 of the light emitting device 120. The second opening TH2 may be provided to be overlapped with the second bonding part 122 of the light emitting device 120. The second opening TH2 may be provided to be overlapped with the second bonding part 122 of the light emitting device 120 in the first direction from the upper surface of the second frame 112 toward the lower surface thereof.

The first opening TH1 and the second opening TH2 may be disposed to be spaced apart from each other. The first opening TH1 and the second opening TH2 may be disposed to be spaced apart from each other under the lower surface of the light emitting device 120.

According to the embodiment, a width W1 of an upper region of the first opening TH1 may be provided to be greater than that of the first bonding part 121. In addition, a width of an upper region of the second opening TH2 may be provided to be greater than that of the second bonding part 122.

The light emitting device package according to the embodiment may comprise a first conductor 221 and a second conductor 222. In addition, the light emitting device package according to the embodiment may comprise a first conductive layer 321 and a second conductive layer 322. The first conductive layer 321 may be disposed to be spaced apart from the second conductive layer 322.

The first conductor 221 may be disposed under the first bonding part 121. The first conductor 221 may be electrically connected to the first bonding part 121. The first conductor 221 may be disposed to be overlapped with the first bonding part 121 in the first direction.

The first conductor 221 may be provided at the first opening TH1. The first conductor 221 may be disposed between the first bonding part 121 and the first conductive layer 321. The first conductor 221 may be electrically connected to the first bonding part 121 and the first conductive layer 321.

A lower surface of the first conductor 221 may be disposed to be lower than an upper surface of the first opening TH1. The lower surface of the first conductor 221 may be disposed to be lower than an upper surface of the first conductive layer 321.

The first conductor 221 may be disposed on the first opening TH1. In addition, the first conductor 221 may be disposed to be extended from the first bonding part 121 to an inside of the first opening TH1.

In addition, the second conductor 222 may be disposed under the second bonding part 122. The second conductor 222 may be electrically connected to the second bonding part 122. The second conductor 222 may be disposed to be overlapped with the second bonding part 122 in the first direction.

The second conductor 222 may be provided at the second opening TH2. The second conductor 222 may be disposed between the second bonding part 122 and the second conductive layer 322. The second conductor 222 may be electrically connected to the second bonding part 122 and the second conductive layer 322.

A lower surface of the second conductor 222 may be disposed to be lower than an upper surface of the second opening TH2. The lower surface of the second conductor 222 may be disposed to be lower than an upper surface of the second conductive layer 322.

The second conductor 222 may be disposed on the second opening TH2. In addition, the second conductor 222 may be disposed to be extended from the second bonding part 122 to an inside of the second opening TH2.

According to the embodiment, the first conductive layer 321 may be disposed on a lower surface and side surface of the first conductor 221. The first conductive layer 321 may be disposed to be in direct contact with the lower surface and side surface of the first conductor 221.

The first conductive layer 321 may be provided at the first opening TH1. The first conductive layer 321 may be disposed under the first bonding part 121. A width of the first conductive layer 321 may be provided to be greater than that of the first bonding part 121.

As described above, according to the light emitting device package according to the embodiment, an electrical connection between the first conductive layer 321 and the first bonding part 121 may be more stably provided by the first conductor 221.

In addition, according to the embodiment, the second conductive layer 322 may be disposed at lower surface and side surface of the second conductor 222. The second conductive layer 322 may be disposed to be in direct contact with the lower surface and side surface of the second conductor 222.

The second conductive layer 322 may be provided at the second opening TH2. The second conductive layer 322 may be disposed under the second bonding part 122. A width of the second conductive layer 322 may be provided to be greater than that of the second bonding part 122.

As described above, according to the light emitting device package according to the embodiment, an electrical connection between the second conductive layer 322 and the second bonding part 122 may be more stably provided by the second conductor 222.

As an example, the first and second conductors 221 and 222 may be stably bonded to the first and second bonding parts 121 and 122 via separate bonding materials, respectively. In addition, side surfaces and lower surfaces of the first and second conductors 221 and 222 may be in contact with the first and second conductive layers 321 and 322, respectively.

Therefore, an area in which the first and second conductive layers 321 and 322 are respectively in contact with the first and second conductors 221 and 222 may be further increased as compared with a case in which the first and second conductive layers 321 and 322 are directly contacted to the lower surfaces of the first and second bonding parts 121 and 122, respectively.

Accordingly, a power may be stably provided from the first and second conductive layers 321 and 322 to the first and second bonding parts 121 and 122 via the first and second conductors 221 and 222.

The first conductive layer 321 and the second conductive layer 322 may comprise at least one material selected from the group consisting of Ag, Au, and Pt, Sn, Cu, etc. or an alloy thereof. However, the present invention is not limited thereto, and a material capable of securing a conductive function may be used for the first conductive layer 321 and the second conductive layer 322.

As an example, the first conductive layer 321 and the second conductive layer 322 may be formed by using a conductive paste. The conductive paste may comprise a solder paste, a silver paste, or the like, and may be composed of multiple layers composed of different materials or multiple layers or a single layer composed of alloys thereof. As an example, the first conductive layer 321 and the second conductive layer 322 may comprise an SAC (Sn—Ag—Cu) material.

In addition, the light emitting device package according to the embodiment may comprise a recess R.

The adhesive 130 may be disposed at the recess R. The adhesive 130 may be disposed between the light emitting device 120 and the body 113. The adhesive 130 may be disposed between the first bonding part 121 and the reflector 117. The adhesive 130 may be disposed between the second bonding part 122 and the reflector 117. As an example, the adhesive 130 may be disposed to be in contact with a side surface of the first bonding part 121 and a side surface of the second bonding part 122.

The adhesive 130 may provide a stable fixing force between the light emitting device 120 and the body 113. The adhesive 130 may be disposed to be in direct contact with the upper surface of the body 113, as an example. In addition, the adhesive 130 may be disposed to be in direct contact with the lower surface of the light emitting device 120.

As an example, the adhesive 130 may comprise at least one of an epoxy-based material, a silicone-based material, and a hybrid material comprising an epoxy-based material and a silicone-based material. In addition, the adhesive 130 may reflect light emitted from the light emitting device 120. When the adhesive 130 comprises a reflective function, the adhesive 130 may comprise a white silicone. When the adhesive 130 comprises the reflective function, the adhesive 130 may be formed of a material comprising as an example, $TiO_2$, silicone, and the like.

According to the embodiment, a depth of the recess R may be provided to be smaller than that of the first opening TH1 or that of the second opening TH2.

The depth of the recess R may be determined in consideration of the adhesion force of the adhesive 130. In addition, the depth T1 of the recess R may be determined by considering stable strength of the body 113 and/or not to occur a crack in the light emitting device package 1100 due to heat dissipated from the light emitting device 120.

The recess R may provide a proper space in which a kind of under-filling process may be performed at a lower portion of the light emitting device 120. The recess R may be provided on a first depth or more so that the adhesive 130 may be sufficiently provided between the lower surface of the light emitting device 120 and the upper surface of the body 113. In addition, the recess R may be provided at a second depth or less to provide a stable strength of the body 113.

The depth and the width W3 of the recess R may affect a forming position and fixing force of the adhesive 130. The depth and the width W3 of the recess R may be determined so that a fixing force may be sufficiently provided by the adhesive 130 disposed between the body 113 and the light emitting device 120.

As an example, the depth of the recess R may be provided at several tens of micrometers. The depth of the recess R may be provided at 40 to 60 micrometers.

In addition, the width W3 of the recess R may be provided at several hundreds of micrometers. The width W3 of the recess R may be provided at 140 to 160 micrometers. As an example, the width W3 of the recess R may be provided at 150 micrometers.

The first and second bonding parts 121 and 122 of the light emitting device 120 may be sealed from the outside by the adhesive 130 provided at the recess R. The adhesive 130 may be provided under the light emitting device 120 in the closed loop shape.

The adhesive 130 may be provided in the closed loop shape along the shape of the recess R as described above with reference to FIGS. 16 and 17. The recess R may be provided as a closed loop having a rectangular shape or a closed loop having a circular or elliptical shape.

A depth of the first opening TH1 may be provided to correspond to a thickness of the body 113. The depth of the first opening TH1 may be provided at a thickness capable of maintaining a stable strength of the body 113.

As an example, the depth of the first opening TH1 may be provided at several hundreds of micrometers. The depth of the first opening TH1 may be provided at 180 to 220 micrometers. As an example, the depth of the first opening TH1 may be provided at 200 micrometers.

As an example, a thickness obtained by subtracting the depth of the recess R may from the depth of the first opening TH1 may be selected to be at least 100 micrometers or more. This is in consideration of a thickness of an injection process capable of providing crack free of the body 113.

According to the embodiment, the depth of the first opening TH1 may be provided at two to ten times of the depth of the recess R. As an example, when the depth of the first opening TH1 is provided at 200 micrometers, the depth of the recess R may be provided at 20 to 100 micrometers.

In addition, the light emitting device package according to the embodiment may comprise a molding part 140.

The molding part 140 may be provided on the light emitting device 120. The molding part 140 may be disposed on the body 113. The molding part 140 may be disposed at the cavity C provided by the reflector 117.

The molding part 140 may comprise an insulating material. In addition, the molding part 140 may comprise a wavelength converting part configured to be incident light emitted from the light emitting device 120 and configured to provide wavelength converted light. As an example, the molding part 140 may comprise a phosphor, a quantum dot, and the like.

In addition, the light emitting device package according to the embodiment may comprise a first lower recess R11 and a second lower recess R12. The first lower recess R11 and the second lower recess R12 may be disposed to be spaced apart from each other.

The first lower recess R11 may be provided at the lower surface of the first frame 111. The first lower recess R11 may be provided to concave in a direction from the lower surface to the upper surface of the first frame 111. The first lower recess R11 may be disposed to be spaced apart from the first opening TH1.

The first lower recess R11 may be provided to have a width of several micrometers to several tens of micrometers. A resin portion may be provided at the first lower recess R11. The resin portion filled in the first lower recess R11 may be provided to have, for example, the same material as the body 113.

However, the present invention is not limited thereto, and the resin portion may be provided to have a material selected from materials having a poor adhesion force and wettability with the first and second conductive layers 321 and 322. Alternatively, the resin portion may be provided to be selected from a material having a low surface tension with respect to the first and second conductive layers 321 and 322.

As an example, the resin portion filled in the first lower recess RH may be provided in the process of forming the first frame 111, the second frame 112, and the body 113 through an injection process or the like.

The resin portion filled in the first lower recess R11 may be disposed at the periphery of the lower surface region of the first frame 111 providing the first opening TH1. The lower surface of the first frame 111 providing the first opening TH1 may be disposed to be separated from a lower surface of the first frame 111 forming in the periphery of the first frame 111 in a kind of an island shape.

Therefore, when the resin portion is disposed to have a material having a poor adhesion force and a poor wettability with the first and second conductive layers 321 and 322 or a material having a low surface tension between the resin portion and the first and second conductive layers 321 and 322, it is possible to prevent the first conductive layer 321 provided at the first opening TH1 from being separated from the first opening TH1 and being diffused over the resin portion filled in the first lower recess R11 or the body 113.

This is based on facts that an adhesion relationship between the first conductive layer 321 and the resin portion and the body 113 or wettability and the surface tension between the resin portion and the first and second conductive layers 321 and 322, or the like are not good. That is, a material constituting the first conductive layer 321 may be selected to have a good adhesion characteristic with the first frame 111. In addition, a material constituting the first conductive layer 321 may be selected to have a poor adhesion characteristic with the resin portion and the body 113.

Accordingly, since the first conductive layer 321 overflows from the first opening TH1 toward a region in which the resin or the body 113 is provided, it is prevented from overflowing or extending an outside of a region in which the resin portion or the body 113 is provided, so that the first conductive layer 321 may be stably disposed at a region in which the first opening TH1 is provided.

When the first conductive layer 321 disposed at the first opening TH1 overflows, it is possible to prevent the first conductive layer 321 from being extended to an outer region of the first lower recess R11 in which the resin portion or the body 113 are provided. In addition, the first conductive layer 321 may be stably connected to the lower surface of the first bonding part 121 in the first opening TH1.

Therefore, when the light emitting device package is mounted at a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

In addition, the second lower recess R12 may be provided at the lower surface of the second frame 112. The second lower recess R12 may be provided to concave in a upper surface direction from the lower surface of the second frame 112. The second lower recess R12 may be disposed to be spaced apart from the second opening TH2.

The second lower recess R12 may be provided to have a width of several micrometers to several tens of micrometers. A resin portion may be provided at the second lower recess R12. The resin portion filled in the second lower recess R12 may be provided to have, for example, the same material as the body 113.

However, the present invention is not limited thereto, and the resin portion may be provided to have a material selected from materials having a poor adhesion force and wettability with the first and second conductive layers 321 and 322. Alternatively, the resin portion may be provided to be selected from a material having a low surface tension with respect to the first and second conductive layers 321 and 322.

As an example, the resin portion filled in the second lower recess R12 may be provided in the process of forming the first frame 111, the second frame 112, and the body 113 through an injection process or the like.

The resin portion filled in the second lower recess R12 may be disposed at the periphery of the lower surface region of the second frame 112 providing the second opening TH2. The lower surface of the second frame 112 providing the second opening TH2 may be disposed to be separated from a lower surface of the second frame 112 forming in the periphery of the second frame 112 in a kind of an island shape.

Therefore, when the resin portion is disposed to have a material having a poor adhesion force and a poor wettability with the first and second conductive layers 321 and 322 or a material having a low surface tension between the resin portion and the first and second conductive layers 321 and 322, it is possible to prevent the second conductive layer 322 provided at the second opening TH2 from being separated from the second opening TH2 and being diffused over the resin portion filled in the second lower recess R12 or the body 113.

This is based on facts that an adhesion relationship between the second conductive layer 322 and the resin portion and the body 113 or wettability and the surface tension between the resin portion and the first and second conductive layers 321 and 322, or the like are not good. That is, a material constituting the second conductive layer 322 may be selected to have a good adhesion characteristic with the second frame 112. In addition, a material constituting the second conductive layer 322 may be selected to have a poor adhesion characteristic with the resin portion and the body 113.

Accordingly, since the second conductive layer 322 overflows from the second opening TH2 toward a region in which the resin or the body 113 is provided, it is prevented from overflowing or extending an outside of a region in which the resin portion or the body 113 is provided, so that the second conductive layer 322 may be stably disposed at a region in which the second opening TH2 is provided.

Therefore, when the second conductive layer 322 disposed at the second opening TH2 overflows, it is possible to prevent the second conductive layer 322 from being extended to an outer region of the second lower recess R12 in which the resin portion or the body 113 are provided. In addition, the second conductive layer 322 may be stably connected to the lower surface of the second bonding part 122 in the second opening TH2.

Therefore, when the light emitting device package is mounted at a circuit board, it is possible to prevent a problem that the first conductive layer 321 and the second conductive layer 322 come into contact with each other and are short-circuited, and it is very easy to control an amount of the first and second conductive layers 321 and 322 in the process of disposing the first and second conductive layers 321 and 322.

Figure 36:
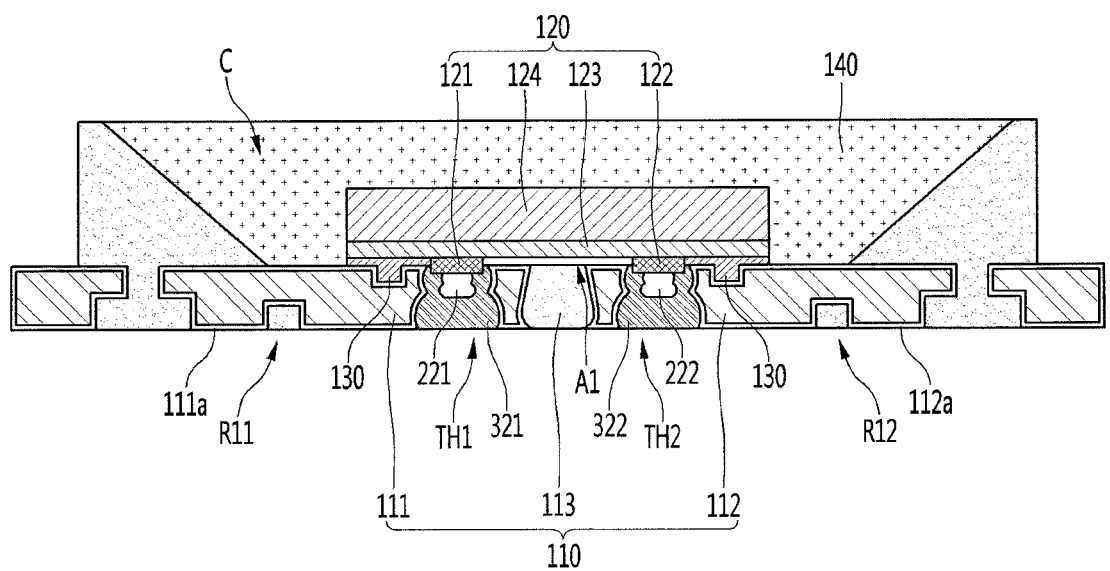
FIG. 36 is a view illustrating still another example of a light emitting device package according to an embodiment of the present invention.

Meanwhile, in the process of forming the first and second openings TH1 and TH2, the light emitting device package shown in FIG. 36 shows a case in which etching is performed in the direction of upper and lower surfaces of the first and second frames 111 and 112, respectively.

As each of etching process progresses in the direction of the upper and lower surfaces of the first and second frames 111 and 112, shapes of the first and second openings TH1 and TH2 may be provided as a kind of a snowman shape.

The widths of the first and second openings TH1 and TH2 may gradually increase as toward the middle region from the lower region and then decrease again. Further, the width may gradually increase as toward the upper region again from the middle region in which the width is decreased, and then decrease again.

The first and second openings TH1 and TH2 may comprise a first region disposed on the upper surface of each of the first and second frames 111 and 112, and a second region disposed on the lower surface of each of the first and second frames 111 and 112. The width of the upper surface of the first region may be provided to be smaller than that of the lower surface of the second region.

In addition, the width of the lower region of the first opening TH1 may be provided to be wider than that of the upper region of the first opening TH1. The first opening TH1 may comprise a first region provided at the upper region at a predetermined width with a predetermined depth and a second region provided in an inclined shape as toward the lower region. In addition, the first region and the second region may be formed in a circular shape in which a side surface has a curvature, and the width of the upper surface of the first region may be narrower than that of the second region. The portion in which the first region and the second region are in contact with each other may have a bent portion.

Further, according to the embodiment, the etching process for forming the first and second openings TH1 and TH2 is completed, and then the plating process for the first and second frames 111 and 112 may be performed. Accordingly, the first and second plating layers 111a and 112a may be formed on the surfaces of the first and second frames 111 and 112, respectively.

The first and second plating layers 111a and 112a may be provided on the upper and lower surfaces of the first and second frames 111 and 112, respectively. Further, the first and second plating layers 111a and 112a may be provided in a boundary region which is in contact with the first and second openings TH1 and TH2.

As an example, the first and second frames 111 and 112 may be provided to have a Cu layer as a basic support member. In addition, the first and second plating layers 111a and 112a may comprise at least one of Ni layer, Ag layer, and the like.

When the first and second plating layers 111a and 112a comprise an Ni layer, since the change with respect to the thermal expansion of the Ni layer is small, even when a size or arrangement position of the package body is changed by thermal expansion, a position of the light emitting device disposed at an upper portion may be stably fixed by the Ni layer. When the first and second plating layers 111a and 112a comprise an Ag layer, the Ag layer may efficiently reflect light emitted from the light emitting device disposed at an upper portion and may improve light intensity.

According to the embodiment, when the size of the first and second bonding parts 121 and 122 of the light emitting device 120 may be disposed to be small to improve light extraction efficiency, the width of the upper region of the first opening TH1 may be provided to be greater than or equal to that of the first bonding part 121. Further, the width of the upper region of the second opening TH2 may be provided to be greater than or equal to that of the second bonding part 122.

Further, the width W1 of the upper region of the first opening TH1 may be provided to be smaller than or equal to the width w2 of the lower region of the first opening TH1. Furthermore, the width of the upper region of the second opening TH2 may be provided to be smaller than or equal to the width of the lower region of the second opening TH2.

As an example, the width of the upper region of the first opening TH1 may be provided at several tens of micrometers to several hundreds of micrometers. Further, the width of the lower region of the first opening TH1 may be provided to be several tens of micrometers to several hundreds of micrometers greater than the width of the upper region of the first opening TH1.

In addition, the width of the upper region of the second opening TH2 may be provided at several tens of micrometers to several hundreds of micrometers. Further, the width of the lower region of the second opening TH2 may be provided to be several tens of micrometers to several hundreds of micrometers greater than the width of the upper region of the second opening TH2.

In addition, the width of the lower region of the first opening TH1 may be provided wider than that of the upper region of the first opening TH1. The first opening TH1 may be provided to have a predetermined width in the upper region at a predetermined depth and may be provided in an inclined shape as toward the lower region.

In addition, the width of the lower region of the second opening TH2 may be provided wider than the width of the upper region of the second opening TH2. The second opening TH2 may be provided to have a predetermined width in the upper region at a predetermined depth and may be provided in an inclined shape as toward the lower region.

For example, the first opening TH1 may be provided in an inclined shape in which a width gradually decreases as toward the upper region from the lower region. Further, the second opening TH2 may be provided in an inclined shape in which a width gradually decreases as toward the upper region from the lower region.

However, the present invention is not limited thereto, and an inclined surface between the upper and lower regions of the first and second openings TH1 and TH2 may have a plurality of inclined surfaces having different slopes, and the inclined surface may be disposed to have a curvature.

In the light emitting device package according to the embodiment, when the areas of the first and second bonding parts 121 and 122 are small, the first and second bonding parts 121 and 122 may be disposed in the first and second openings TH1 and TH2.

At this point, since the areas of the first and second bonding parts 121 and 122 are small, it is difficult to secure the adhesion force between the first and second conductive layers 321 and 322 and the first and second bonding parts 121 and 122. Therefore, the light emitting device package according to the embodiment may comprise the first conductor 221 and the second conductor 222 to further secure an area in which the first and second conductive layers 321 and 322 are in contact with the first and second bonding parts 121 and 122.

According to the embodiment, the first conductive layer 321 may be electrically connected to the first bonding part 121, and the second conductive layer 322 may be electrically connected to the second bonding part 122. As an example, external power may be supplied to the first conductive layer 321 and the second conductive layer 322, and thus, the light emitting device 120 may be driven.

Meanwhile, according to the light emitting device package 1100 according to the embodiment, the adhesive 130 provided at the recess R may be provided between the lower surface of the light emitting device 120 and the upper surface of the package body 110. The adhesive 130 may be provided at the periphery of the first and second bonding parts 121 and 122 in the closed loop shape when viewed from the upper direction of the light emitting device 120. In addition, the adhesive 130 may be provided at the periphery of the first and second openings TH1 and TH2 in the closed loop shape when viewed from the upper direction of the light emitting device 120.

The adhesive 130 may perform a function of stably fixing the light emitting device 120 in the package body 110. Further, the adhesive 130 may be disposed at the periphery of the first and second bonding parts 121 and 122 in contact with the side surfaces of the first and second bonding parts 121 and 122. The adhesive 130 may be disposed such that the first and second openings TH1 and TH2 are isolated from an outer region in which the molding part 140 is provided when viewed from the upper direction of the light emitting device 120.

The adhesive 130 may prevent the first and second conductive layers 321 and 322 provided at the first and second openings TH1 and TH2 from being separated from the closed loop of the recess R and flowing in an outer direction of the light emitting device 120.

When viewed from the upper direction of the light emitting device 120, in the case in which the first and second conductive layers 321 and 322 are moved in the outer direction of the light emitting device 120, the first and second conductive layers 321 and 322 may be diffused along the side surface of the light emitting device 120. As described above, when the first and second conductive layers 321 and 322 are moved in the side surface of the light emitting device 120, the first conductivity type semiconductor layer and the second conductivity type semiconductor layer of the light emitting device 120 may be electrically short-circuited. In addition, as described above, when the first and second conductive layers 321 and 322 are moved in the side surface of the light emitting device 120, light extraction efficiency of the light emitting device 120 may be lowered.

However, according to the embodiment, since the inside and the outside may be isolated from each other based on a region in which the recess R is provided by the adhesive 130, it is possible to prevent the first and second conductive layers 321 and 322 from being separated from a region in which the recess R is provided and moving in the outer direction.

Therefore, according to the light emitting device package according to the embodiment, it is possible to prevent the first and second conductive layers 321 and 322 from moving to the side surface of the light emitting device 120, and to prevent the light emitting device 120 from being shorted electrically, thereby improving light extraction efficiency.

According to an embodiment of the present invention, the adhesive 130 provided at the recess R may be moved along the lower surface of the light emitting device 120 to the first region A1 located under the light emitting device 120, and may be disposed to be in contact with the four side surfaces of the first and second bonding parts 121 and 122. Accordingly, the first and second bonding parts 121 and 122 may be disposed to be surrounded by the adhesive 130, and the first and second openings TH1 and TH2 may be sealed by the adhesive 130.

As described above, since the first and second openings TH1 and TH2 may be sealed by the adhesive 130, it is possible to prevent the first and second conductive layers 321 and 322 provided at the first and second openings TH1 and TH2 from moving on the upper surface of the body 113.

Meanwhile, when an amount of the adhesive 130 is not sufficiently provided, the first region A1 located under the light emitting device 120 may not be filled with the adhesive 130 and a partial region thereof may be provided as an empty space. Accordingly, the first and second conductive layers 321 and 322 may be diffused and moved to the empty space of the first region A1 through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region A1 may be prevented from being electrically short-circuited.

In addition, according to the embodiment, a sum of areas of the first and second bonding parts 121 and 122 may be provided at 10% or less based on an area of an upper surface of the substrate 124. According to the light emitting device package according to the embodiment, the sum of the areas of the first and second bonding parts 121 and 122 may set at 10% or less based on the area of the upper surface of the substrate 124 in order to secure a light emitting area emitted from the light emitting device and increase light extraction efficiency.

In addition, according to the embodiment, the sum of areas of the first and second bonding parts 121 and 122 may be provided at 0.7% or more based on the area of an upper surface of the substrate 124. According to the light emitting device package according to the embodiment, the sum of the areas of the first and second bonding parts 121 and 122 may be set at 0.7% or more based on the area of the upper surface of the substrate 124 in order to provide a stable bonding force to the light emitting device to be mounted.

According to the light emitting device package according to the embodiment, the sum of the areas of the first and second bonding parts 121 and 122 may be set at 0.7% or more based on the area of the upper surface of the substrate 124 so that the first conductor 221 and the second conductor 222 can be stably arranged.

As described above, as the area of the first and second bonding parts 121 and 122 is provided to be small, an amount of light transmitted to the lower surface of the light emitting device 120 may be increased. In addition, the adhesive 130 having a good reflective characteristic and heat dissipation characteristic may be provided under the light emitting device 120. Therefore, the light emitted in a lower direction of the light emitting device 120 is reflected at the adhesive 130, and is effectively emitted toward an upper direction of the light emitting device package, and thus light extraction efficiency may be improved.

Meanwhile, the light emitting device package according to an embodiment described above may be supplied and mounted on a submount, a circuit board, or the like.

However, when a conventional light emitting device package is mounted on a submount, a circuit board or the like, a high temperature process such as reflow may be applied. At this point, in the reflow process, a re-melting phenomenon occurs in a bonding region between a lead frame and the light emitting device provided in the light emitting device package, so that stability of electrical connection and physical coupling may be weakened.

However, according to the light emitting device package and a manufacturing method of the light emitting device package according to an embodiment, the bonding parts of the light emitting device according to the embodiment may be provided with driving power by the conductive layers disposed in the openings. In addition, the melting point of the conductive layers disposed in the openings may be selected so as to have a higher value than that of the general bonding material.

Therefore, since the light emitting device package according to the embodiment does not cause a re-melting phenomenon even when the light emitting device package 100 is bonded to the main substrate by a reflow process, the electrical connection and the physical bonding force may not be deteriorated.

In addition, according to the light emitting device package and the manufacturing method of the light emitting device package according to an embodiment, the package body 110 does not need to be exposed to a high temperature in the manufacturing process of the light emitting device package. Therefore, according to an embodiment, it is possible to prevent the package body 110 from being damaged or discolored due to exposure to high temperature.

Accordingly, a selection range for the material forming the body 113 may be widened. According to the embodiment, the body 113 may be provided by using not only expensive materials such as ceramics but also relatively inexpensive resin materials.

For example, the body 113 may comprise at least one material selected from the group consisting of polyphthalamide (PPA) resin, polycyclohexylenedimethylene terephthalate (PCT) resin, epoxy molding compound (EMC) resin, and silicone molding compound (SMC) resin.

Next, the light emitting device package according to an embodiment of the present invention will be described with reference to FIG. 37.

In describing the light emitting device package according to the embodiment of the present invention with reference to FIG. 37, the description overlapping with the contents described with reference to FIGS. 1 to 36 may be omitted.

Figure 37:
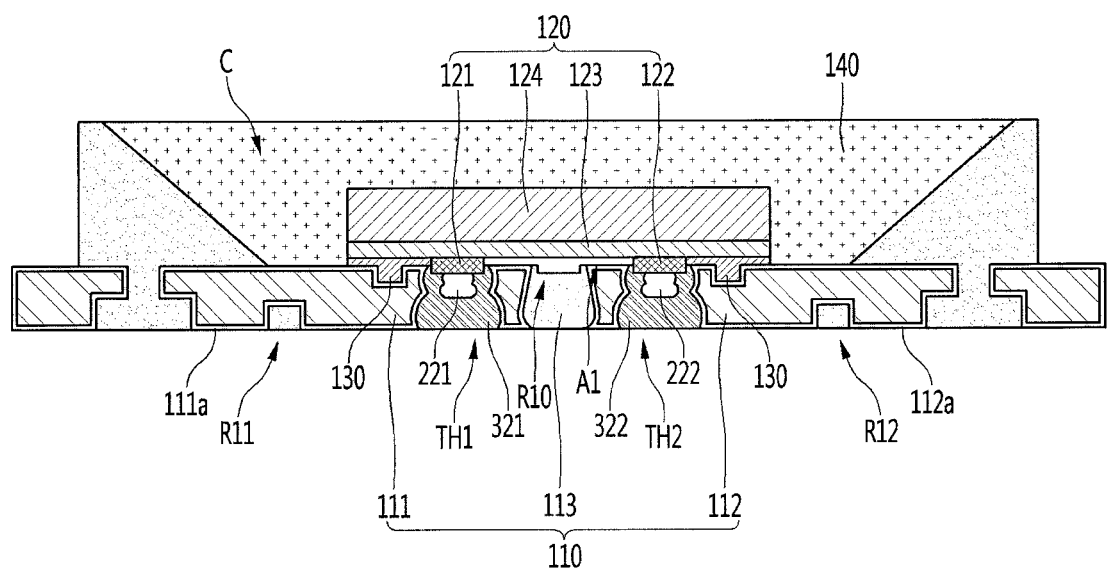
FIG. 37 is a view illustrating still another example of a light emitting device package according to an embodiment of the present invention.

The semiconductor device package according to the embodiment, as shown in FIG. 37, may further comprise an upper recess R10 as compared to the semiconductor device package described with reference to FIG. 36.

The upper recess R10 may be provided at an upper surface of the body 113. The upper recess R10 may be provided at the first region Al located under the lower surface of the light emitting device 120. The upper recess R10 may be provided to concave in a first direction from the upper surface of the body 113 toward the lower surface thereof.

The recess R10 may be disposed under the light emitting device 120 and may be provided between the first bonding part 121 and the second bonding part 122. The upper recess R10 may be provided to be extended under the light emitting device 120 in a minor axis direction of the light emitting device 120.

As described with reference to FIG. 36, when the amount of the adhesive 130 provided to the recess R is insufficient, the first region Al located under the light emitting device 120 may not be filled with the adhesive 130 and a partial region thereof may be provided as an empty space. Accordingly, the first and second conductive layers 321 and 322 may be diffused and moved to the empty space of the first region Al through a void of the adhesive 130.

However, in selecting the physical properties of the body 113 according to the embodiment and the physical properties of the first and second conductive layers 321 and 322, a distance by which the conductive layers 321 and 322 are diffused from the upper surface of the body 113 may be limited by selecting properties having poor adhesiveness with each other. Accordingly, since the distance by which the first and second conductive layers 321 and 322 are moved at the upper surface of the body 113 may be controlled, the first conductive layer 321 and the second conductive layer 322 in the first region Al may be prevented from being electrically short-circuited.

In addition, when the light emitting device package according to the embodiment comprises the upper recess R10, the upper recess R10 may provide a function that further restricts a diffusion and movement of the first and second conductive layers 321 and 322 in the first region A1.

As the upper recess R10 is provided, a kind of trap effect is generated in the upper recess R10 even when a part of the first and second conductive layers 321 and 322 is diffused to the upper portion of the body 113, the flow of the first and second conductive layers 321 and 322 is restricted. A phenomenon occurs in which the first conductive layer 321 diffused through the first opening TH1 may not be moved in the lower direction of the upper recess R10 from a boundary surface of the concave region of the upper recess R10. In addition, a phenomenon occurs in which the second conductive layer 322 diffused through the second opening TH2 may not be moved in the lower direction of the upper recess R10 from a boundary surface of the concave region of the upper recess R10. This is interpreted as the flow of the first and second conductive layers 321 and 322 is restricted at a boundary surface of the concave region of the upper recess R10 due to an influence of surface tension and the like.

Accordingly, since the distance by which the first and second conductive layers 321 and 322 are moved at the upper surface of the body 113 may be stably and reliably controlled, the first conductive layer 321 and the second conductive layer 322 may be prevented from being electrically short-circuited in the first region A1.

Meanwhile, in the light emitting device package described with reference to FIG. 36, when viewed from the upper direction of the light emitting device 120, it is described based on the case in which the light emitting device 120 is provided to be greater than an area formed by the outer boundary surface of the recess R.

However, in the light emitting device package according to another embodiment, similar to the light emitting device package described with reference to FIG. 26, when viewed from the upper direction of the light emitting device 120, the outer side surface of the light emitting device 120 may be provided to be overlapped with the recess R.

As described above, the outer surface of the light emitting device 120 may be disposed on the region of the recess R, so that the lower surface of the light emitting device 120 and the upper surface of the body 113 may be fixed and sealed by the adhesive 130 provided in the recess R.

Meanwhile, in the light emitting device package according to the embodiment described above, when the adhesive layer 130 is provided to be adjacent to the side surface of the light emitting device 120, the adhesive layer 130 may be diffused to a partial region along the side surface of the light emitting device 120.

In addition, although the light emitting device package according to the above described embodiment is described based on the case in which the recess R formed at the package body is provided as a closed loop, the recess R may not necessarily be formed as a closed loop. In the case in which the recess R is provided in a shape to be spaced apart from each other by a predetermined distance without being formed in a closed loop, when the recess R is spaced a small distance such that the adhesive layers provided in the recess R are connected to each other, the light emitting device and the package body may be stably sealed by the adhesive, and thus a desired effect can be sufficiently realized. Further, since the adhesive has diffusibility, the adhesive layer disposed at the recess R spaced from each other may be diffused from the lower surface of the light emitting device and the upper surface of the package body, and thus a space between the lower surface of the light emitting device and the upper surface of the package body can be effectively sealed.

Meanwhile, a flip chip light emitting device may be provided in the light emitting device package described above, as an example.

As an example, the flip chip light emitting device may be provided as a transmissive type flip chip light emitting device that emits light in six surface directions, or may be provided as a reflective type flip chip light emitting device that emits light in five surface directions.

The reflective type flip chip light emitting device in which light is emitted in the five surface directions may have a structure in which a reflective layer is disposed in a direction close to the package body 110. For example, the reflective type flip chip light emitting device may comprise an insulating reflective layer (for example, a Distributed Bragg Reflector, an omni directional reflector, etc.) and/or a conductive type reflective layer (for example, Ag, Al, Ni, Au, etc.) between the first and second bonding parts and the light emitting structure Further, the flip chip light emitting device may comprise a first bonding part electrically connected to a first conductivity type semiconductor layer, and a second bonding part electrically connected to a second conductivity type semiconductor layer, and may be provided as a general horizontal light emitting device in which light is emitted between the first bonding part and the second bonding part.

Furthermore, the flip chip light emitting device in which light is emitted in the six surface directions may be provided as a transmissive type flip chip light emitting device comprising a reflective region in which a reflective layer is disposed between the first and second bonding parts and a transmissive region in which light is emitted.

Here, the transmissive type flip chip light emitting device means a device that emits light to six surfaces of an upper surface, four side surfaces, and a lower surface. In addition, the reflective type flip chip light emitting device means a device that emits light to the upper surface and the four side surfaces.

Meanwhile, the light emitting device package according to the embodiment, as described above with reference to FIGS. 1 to 37, may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

What is claimed is:

1. A light emitting device package comprising:
   a package body;
   a light emitting device disposed on the package body; and
   an adhesive disposed between the package body and the light emitting device,
   wherein the package body comprises a first opening and a second opening passing through the package body on an upper surface of the package body and a recess provided to concave in a direction of a lower surface of the package body from the upper surface of the package body,
   wherein the light emitting device comprises a first bonding part disposed on the first opening and a second bonding part disposed on the second opening,
   wherein the adhesive is provided at the recess,
   wherein the recess is provided at a periphery of the first opening and a periphery of the second opening in a closed loop shape including an inner closed loop and an outer closed loop facing each other, wherein a size of the light emitting device is greater than an internal area of the inner closed loop of the recess when viewed from an upper direction of the light emitting device, and wherein an outline connecting four side surfaces of the light emitting device overlaps the recess when viewed from the upper direction of the light emitting device.

2. The light emitting device package of claim 1, wherein the adhesive is disposed at a periphery of the first bonding part and the second bonding part.

3. The light emitting device package of claim 1, comprising:
a first conductive layer disposed at the first opening and electrically connected to the first bonding part; and
a second conductive layer disposed at the second opening and electrically connected to the second bonding part.

4. The light emitting device package of claim 1, wherein the adhesive is provided to be in direct contact with the upper surface of the package body and a lower surface of the light emitting device, and surrounds and seals a periphery of the first and second bonding parts.

5. The light emitting device package of claim 1, wherein the first and second bonding parts comprise at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, and Ni/IrOx/Au/ITO, or an alloy thereof.

6. The light emitting device package of claim 3, wherein the first and second conductive layers comprise at least one material selected from the group consisting of Ag, Au, Pt, Sn, Cu, and SAC (Sn—Ag—Cu), or an alloy thereof.

7. The light emitting device package of claim 3, wherein the first conductive layer and the second conductive layer are spaced apart from each other.

8. The light emitting device package of claim 3, wherein the first conductive layer is disposed under the first bonding part, and
wherein a width of an upper surface of the first conductive layer is smaller than a width of a lower surface of the first bonding part.

9. The light emitting device package of claim 3, wherein the first conductive layer is in direct contact with a lower surface of the first bonding part, and
wherein the first conductive layer is surrounded by the package body.

10. The light emitting device package of claim 1, wherein a width of the recess is smaller than a width of a lower portion of the first opening, and
wherein the width of the recess is smaller than a width of a lower portion of the second opening.

11. The light emitting device package of claim 1, wherein a width of an upper portion of the first opening is smaller than a width of a lower portion of the first opening.

12. The light emitting device package of claim 1, wherein, when viewed from the upper direction of the light emitting device, the outline connecting the four side surfaces of the light emitting device is provided inside the outer closed loop.

13. The light emitting device package of claim 1, wherein the package body comprises a cavity surrounding the four side surfaces of the light emitting device.

14. The light emitting device package of claim 13, further comprising a molding part provided in the cavity and on the light emitting device.

* * * * *